(12) United States Patent
Yun et al.

(10) Patent No.: US 10,236,211 B2
(45) Date of Patent: Mar. 19, 2019

(54) METHOD OF MANUFACTURING VERTICAL MEMORY DEVICES

(71) Applicant: SAMSUNG ELECTRONICS CO., LTD., Suwon-si, Gyeonggi-do (KR)

(72) Inventors: Seok-Jung Yun, Iksan-si (KR); Joon-Hee Lee, Seongnam-si (KR); Seong-Soon Cho, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/956,851

(22) Filed: Apr. 19, 2018

(65) Prior Publication Data

US 2018/0240805 A1 Aug. 23, 2018

Related U.S. Application Data

(62) Division of application No. 15/295,034, filed on Oct. 17, 2016, now Pat. No. 9,985,041.

(30) Foreign Application Priority Data

Jan. 14, 2016 (KR) .......................... 10-2016-0004670

(51) Int. Cl.
*H01L 21/336* (2006.01)
*H01L 21/822* (2006.01)
(Continued)

(52) U.S. Cl.
CPC .... *H01L 21/8221* (2013.01); *H01L 21/28282* (2013.01); *H01L 21/76816* (2013.01);
(Continued)

(58) Field of Classification Search
CPC .......... H01L 27/11551; H01L 29/7926; H01L 29/7889; H01L 27/11597; H01L 27/11578;
(Continued)

(56) References Cited

U.S. PATENT DOCUMENTS 8,759,921 B2 6/2014 Seo et al.
8,891,315 B2 11/2014 Lee et al.
(Continued)

FOREIGN PATENT DOCUMENTS

KR 10-2014-0092015 A 7/2014

*Primary Examiner* — Shouxiang Hu
(74) *Attorney, Agent, or Firm* — Lee & Morse, P.C.

(57) ABSTRACT

A vertical memory device may include a plurality of word lines spaced apart in a first direction, each extending in a second direction perpendicular to the first direction and having a first width in a third direction perpendicular to the first and second directions, a dummy word line over an uppermost word line, including an opening and having a portion thereof with the first width in the third direction, a first string selection line (SSL) and a second string selection line (SSL) over the dummy word line, the first and second SSLs being at substantially the same level along the first direction, each of the first and second SSLs having a second width less than the first width in the third direction, and a plurality of vertical channel structures, each through the word lines, the dummy word line, and one of the first and second SSLs.

20 Claims, 51 Drawing Sheets

(51) Int. Cl.

| | | |
|---|---|---|
| *H01L 27/11556* | (2017.01) | |
| *H01L 27/11597* | (2017.01) | |
| *H01L 27/11578* | (2017.01) | |
| *H01L 27/1157* | (2017.01) | |
| *H01L 27/11551* | (2017.01) | |
| *H01L 29/792* | (2006.01) | |
| *H01L 29/788* | (2006.01) | |
| *H01L 21/28* | (2006.01) | |
| *H01L 21/8234* | (2006.01) | |
| *H01L 21/768* | (2006.01) | |
| *H01L 27/105* | (2006.01) | |
| *H01L 29/78* | (2006.01) | |
| *H01L 27/11582* | (2017.01) | |
| *H01L 49/02* | (2006.01) | |

(52) U.S. Cl.
CPC .. *H01L 21/76832* (2013.01); *H01L 21/76877* (2013.01); *H01L 21/823475* (2013.01); *H01L 27/1052* (2013.01); *H01L 27/1157* (2013.01); *H01L 27/11551* (2013.01); *H01L 27/11556* (2013.01); *H01L 27/11578* (2013.01); *H01L 27/11582* (2013.01); *H01L 27/11597* (2013.01); *H01L 28/00* (2013.01); *H01L 29/7827* (2013.01); *H01L 29/7889* (2013.01); *H01L 29/7926* (2013.01)

(58) Field of Classification Search
CPC ............... H01L 27/11556; H01L 27/27; H01L 27/1157; H01L 28/00; H01L 27/11582; H01L 29/7827; H01L 27/1052; H01L 21/28282; H01L 21/76816; H01L 21/76832; H01L 21/76877; H01L 21/8221; H01L 21/823475
See application file for complete search history.

(56) References Cited

U.S. PATENT DOCUMENTS

| | | | |
|---|---|---|---|
| 8,916,922 B2 | 12/2014 | Jang et al. | |
| 8,987,805 B2 | 3/2015 | Nam et al. | |
| 9,036,419 B2 | 5/2015 | Park et al. | |
| 9,087,861 B2* | 7/2015 | Hwang | H01L 29/66833 |
| 9,343,475 B2 | 5/2016 | Jang et al. | |
| 9,559,112 B2* | 1/2017 | Lee | H01L 27/11578 |
| 2011/0316072 A1* | 12/2011 | Lee | H01L 27/11551 |
| | | | 257/329 |
| 2012/0003831 A1 | 1/2012 | Kang et al. | |
| 2012/0119283 A1 | 5/2012 | Lee et al. | |
| 2013/0320486 A1 | 12/2013 | Yoo et al. | |
| 2014/0264549 A1* | 9/2014 | Lee | H01L 27/11582 |
| | | | 257/324 |
| 2014/0306279 A1 | 10/2014 | Park et al. | |
| 2014/0334232 A1 | 11/2014 | Nam et al. | |
| 2014/0367764 A1 | 12/2014 | Lee et al. | |
| 2015/0004777 A1 | 1/2015 | Kohji et al. | |
| 2015/0054046 A1 | 2/2015 | Higashitani et al. | |
| 2015/0060992 A1 | 3/2015 | Taekyung et al. | |
| 2015/0115345 A1 | 4/2015 | Nowak et al. | |
| 2015/0129878 A1 | 5/2015 | Shin et al. | |
| 2015/0137216 A1 | 5/2015 | Lee et al. | |
| 2017/0179025 A1 | 6/2017 | Yun et al. | |

* cited by examiner

FIG. 1
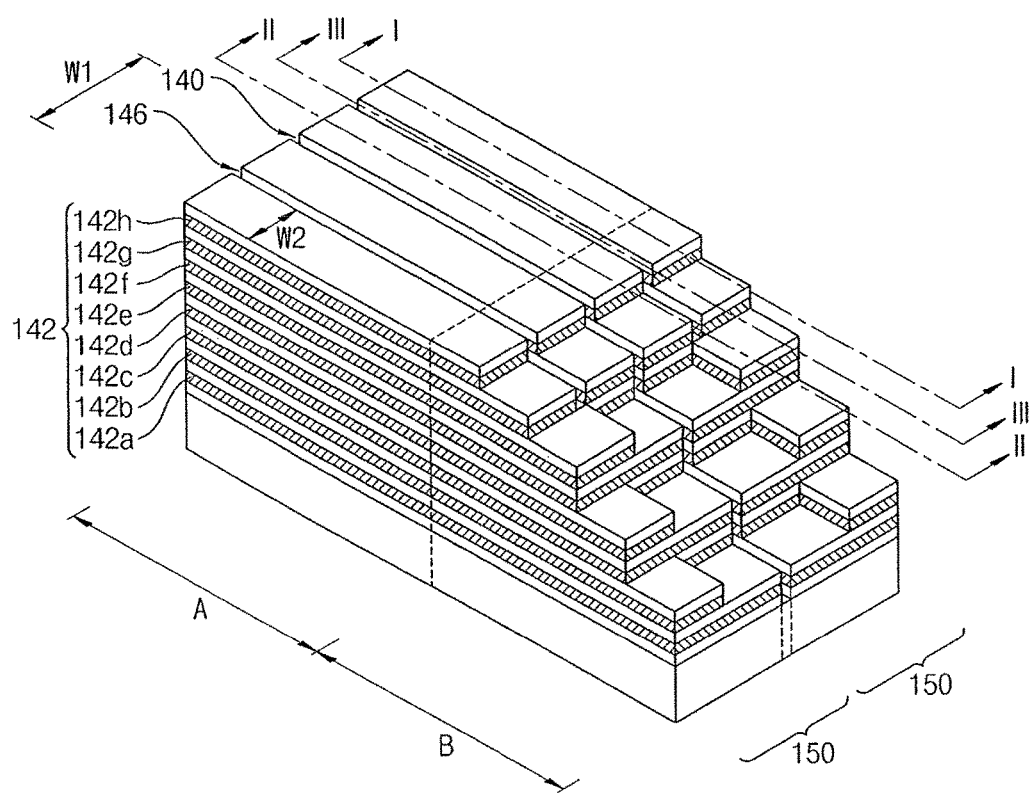
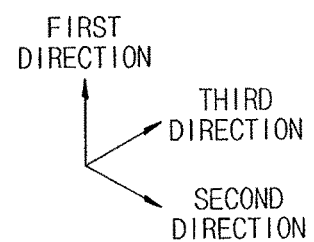

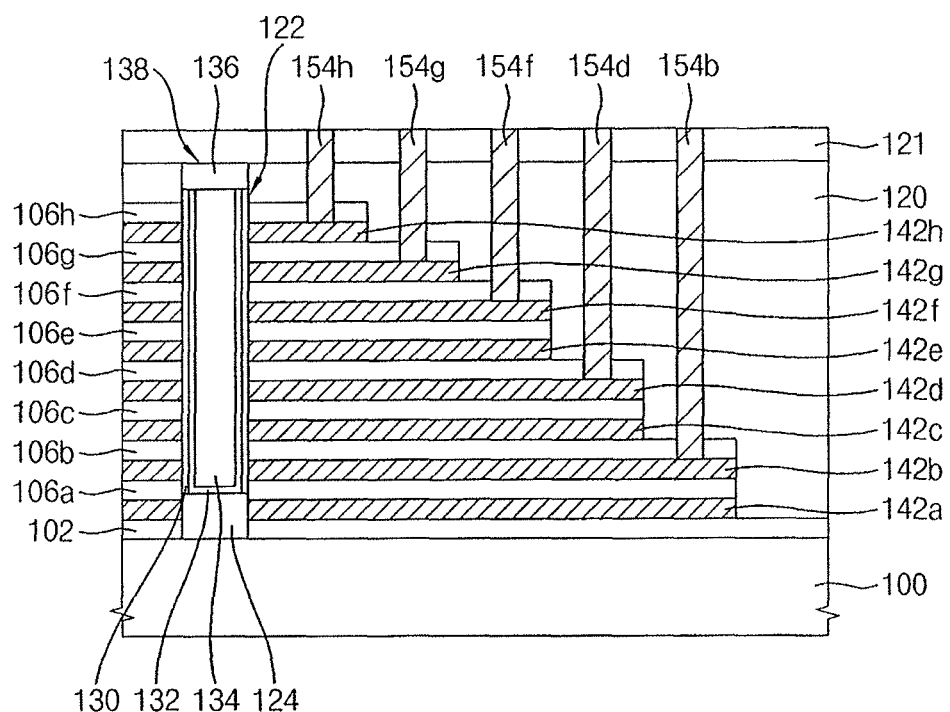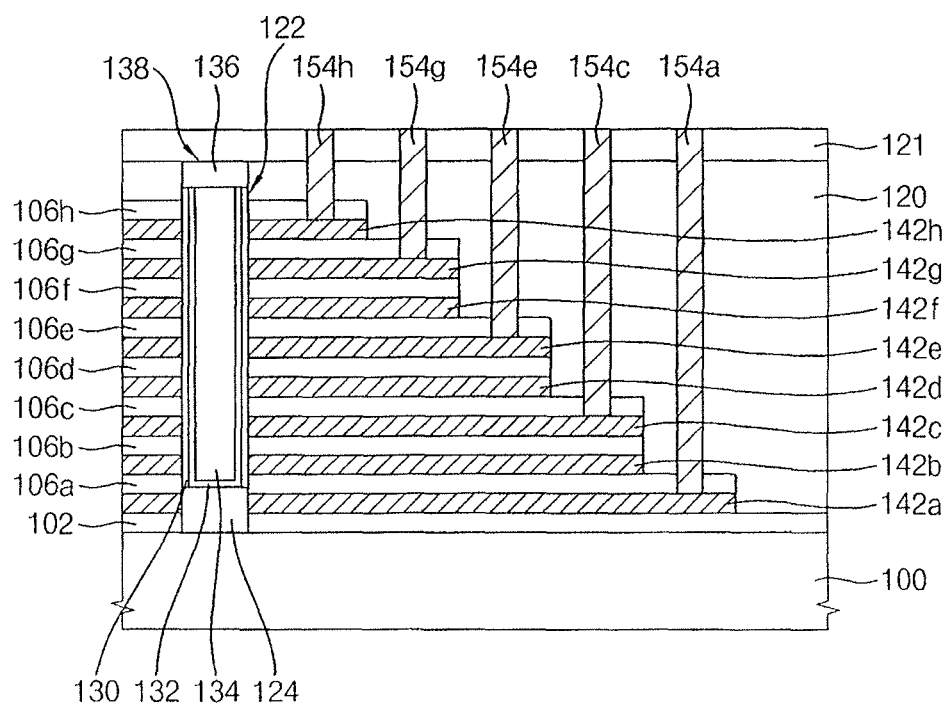

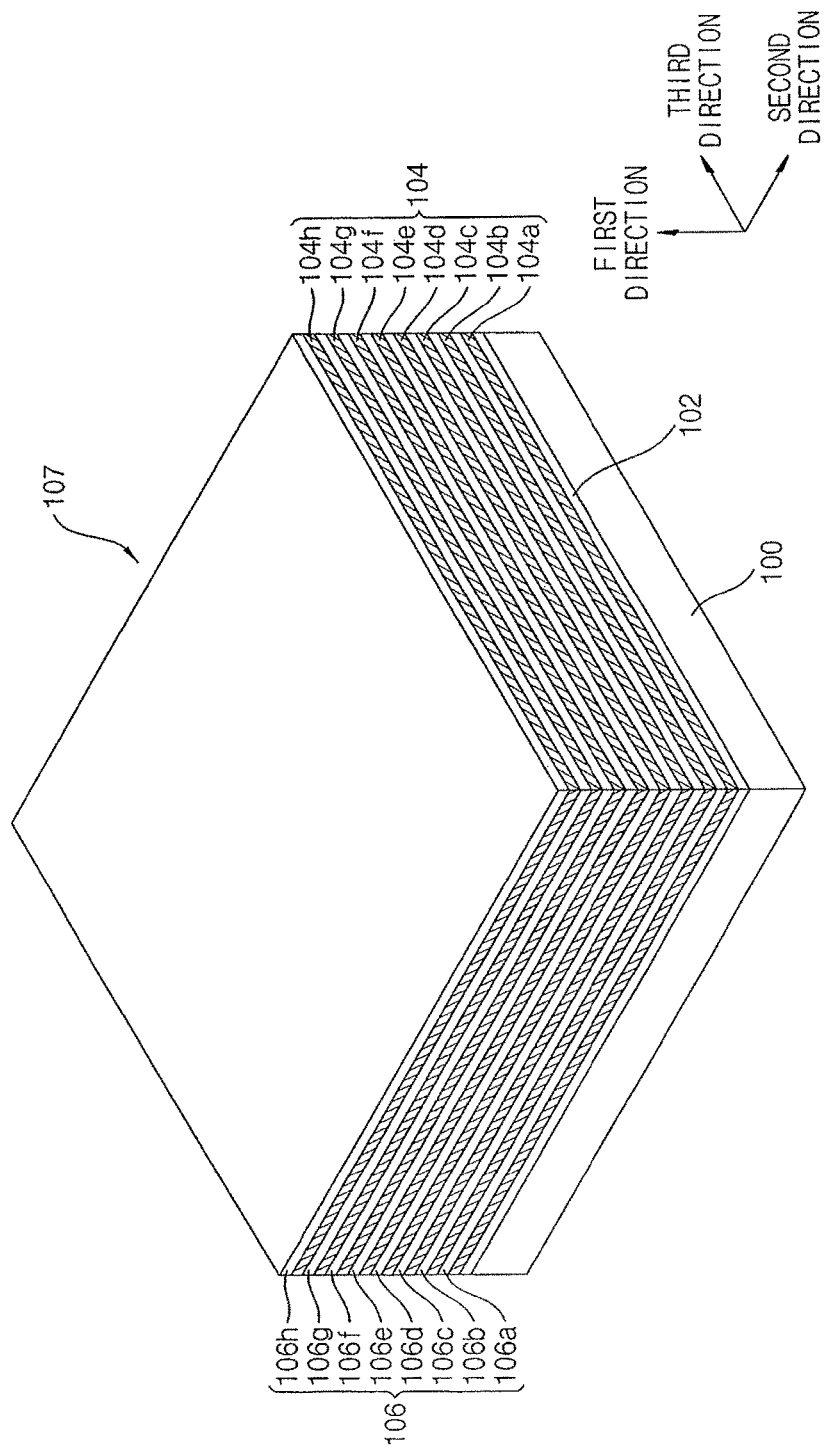

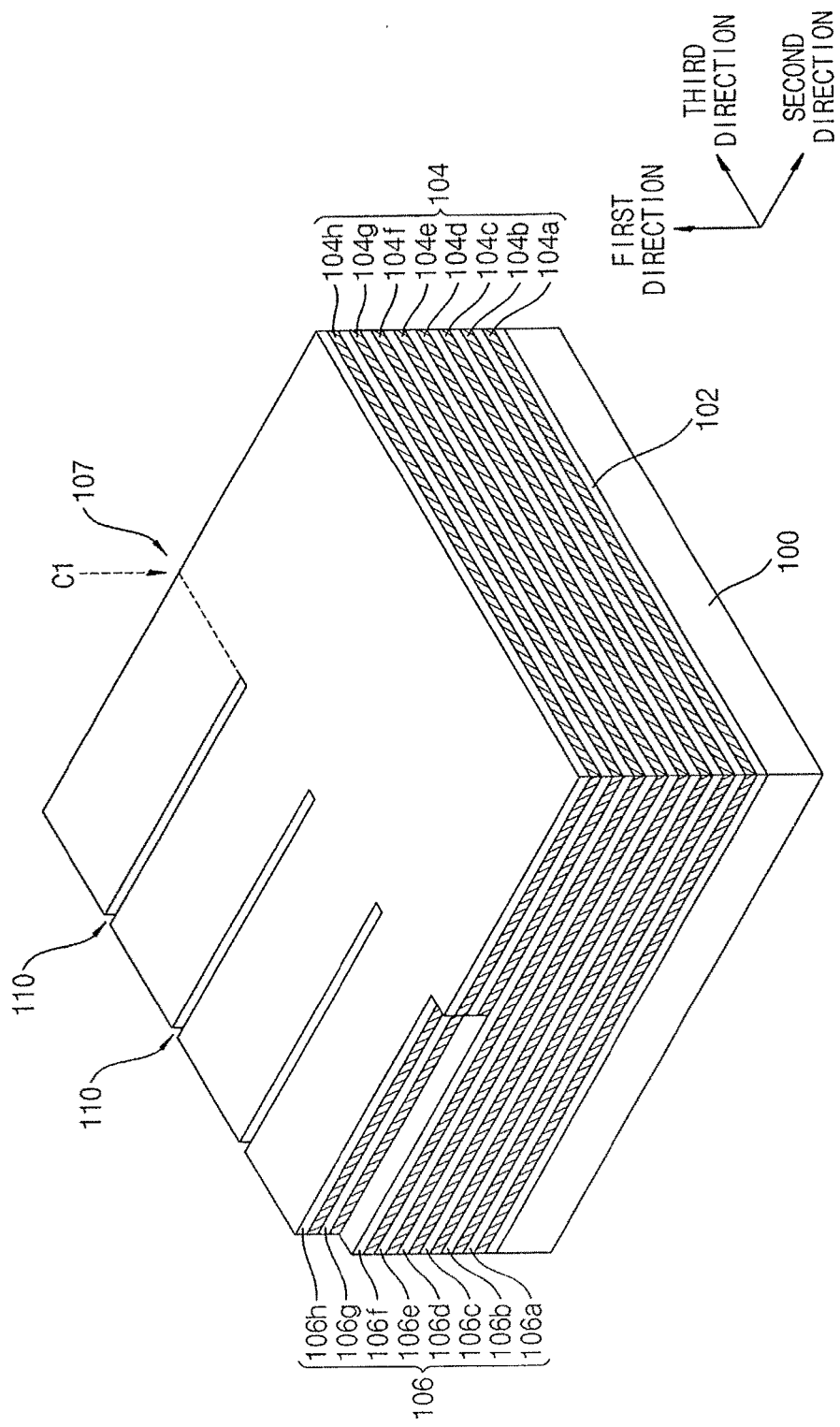

FIG. 16D
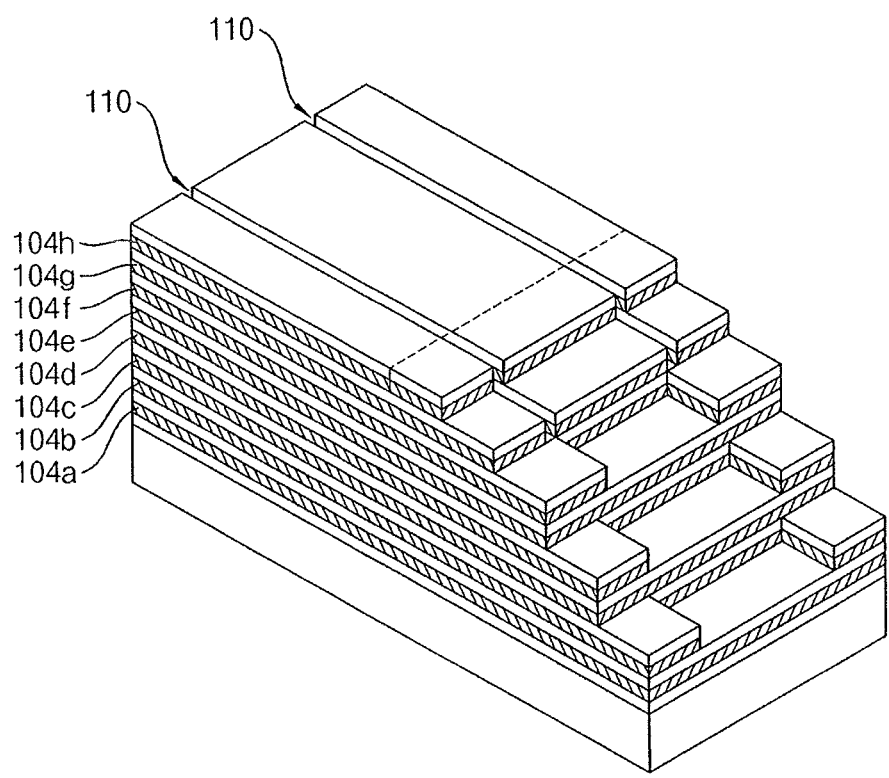
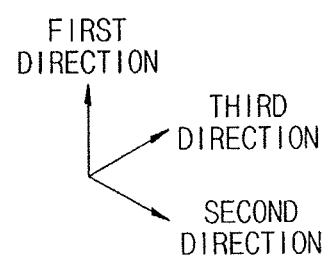

FIG. 17
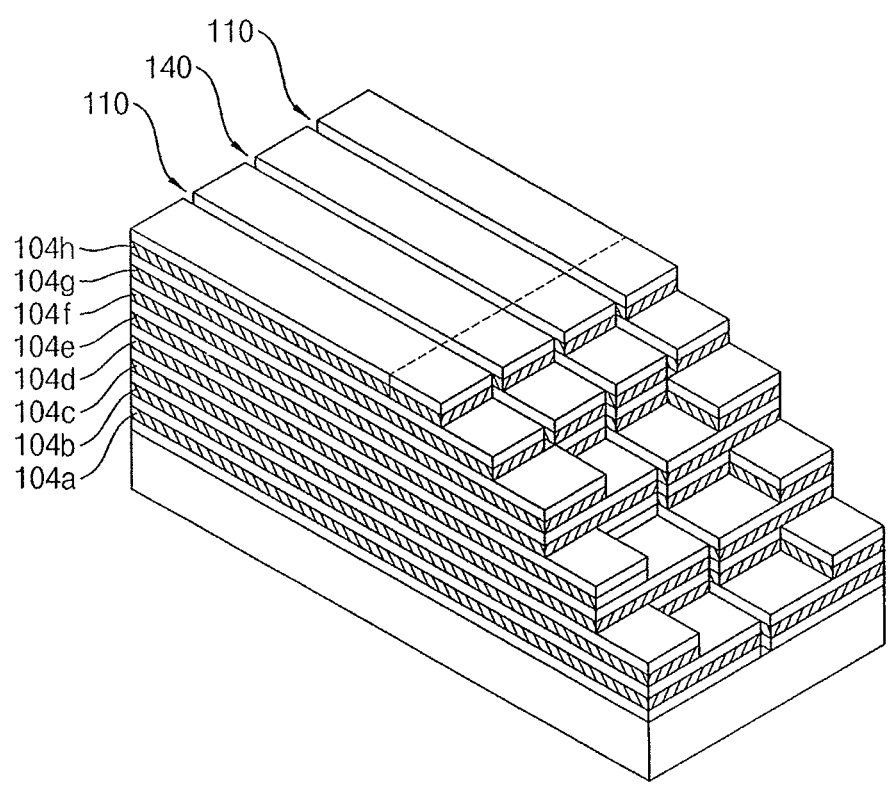
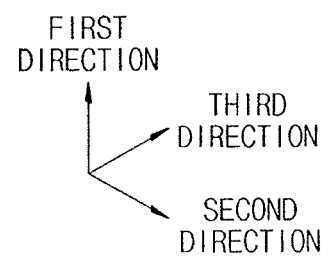

METHOD OF MANUFACTURING VERTICAL MEMORY DEVICES

CROSS-REFERENCE TO RELATED APPLICATIONS

This is a divisional application based on pending application Ser. No. 15/295,034, filed Oct. 17, 2016, the entire contents of which is hereby incorporated by reference.

Korean Patent Application No. 10-2016-0004670, filed on Jan. 14, 2016, in the Korean Intellectual Property Office, and entitled: "Vertical Memory Devices and Methods of Manufacturing the Same," is incorporated by reference herein in its entirety.

BACKGROUND

1. Field

Example embodiments relate to vertical memory devices and methods of manufacturing the same. More particularly, example embodiments relate to vertical memory devices including vertically stacked gate patterns and methods of manufacturing the same.

2. Description of the Related Art

A vertical memory device including a plurality of memory cells vertically stacked on a surface of a substrate has been developed for achieving a high integration degree. In the vertical memory device, electrical signals may be applied to the vertically stacked memory cells, respectively, and a pad structure for transferring the electrical signals may be needed.

SUMMARY

Example embodiments provide a vertical memory device having improved electrical reliability.

Example embodiments provide a method of manufacturing a vertical memory device having improved electrical reliability.

According to example embodiments, there is provided a vertical memory device that may include a plurality of word lines spaced apart from each other in a first direction substantially perpendicular to a top surface of a substrate, each of the word lines extending in a second direction substantially parallel to the top surface of the substrate and having a first width in a third direction substantially perpendicular to the second direction, a dummy word line over an uppermost one of the word lines, an edge portion of the dummy word line including an opening, and a portion of the dummy word line having the first width in the third direction, a first string selection line (SSL) and a second string selection line (SSL) over the dummy word line, the first and second SSLs being at substantially the same level, and each of the first and second SSLs having a second width less than the first width in the third direction, and a plurality of vertical channel structures, each of the vertical channel structures extending in the first direction through the word lines, the dummy word line and one of the first and second SSLs.

According to example embodiments, there is provided a vertical memory device that may include a plurality of first gate patterns disposed at odd levels from a top surface of a substrate in a first direction substantially perpendicular to the top surface of the substrate, each of the first gate patterns extending in a second direction substantially parallel to the top surface of the substrate and having a first width in a third direction substantially perpendicular to the second direction, a plurality of second gate patterns disposed at even levels from the top surface of the substrate in the first direction between the first gate patterns, each of the second gate patterns having the first width in the third direction, and an edge portion of the second gate patterns having a dent exposing an edge portion of the underlying first gate patterns, a first dummy word line over an uppermost one of the first and second gate patterns, an edge portion of the dummy word line including an opening, a second dummy word line over the first dummy word line, an edge portion of the second dummy word line including a dent and a recess, the dent exposing the edge portion of the first dummy word line, the recess extending in the second direction and being in communication with the dent, and a portion of the second dummy word line having the first width in the third direction, a first string selection line (SSL) and a second string selection line (SSL) disposed at substantially the same level over the second dummy word line, each of the first and second SSLs having a second width less than the first width, a third string selection line (SSL) and a fourth string selection line (SSL) over the first and second SSLs, respectively, each of the third and fourth SSLs having the second width in the third direction, and a plurality of vertical channel structures, each of the vertical channel structures extending in the first direction through the word lines, the first and second dummy word lines, one of the first and second SSLs, and one of the third and fourth SSLs.

According to example embodiments, there is provided a vertical memory device that may include a first string selection line (SSL) and a second string selection line (SSL) each having a first width in a horizontal direction, a cutting region being formed between the first and second SSLs, a first dummy word line under the first and second SSLs, the first dummy word line including an opening partially overlapping with the cutting region in a vertical direction, and a portion of the first dummy word line having a second width in the horizontal direction greater than the first width, a plurality of word lines under the first dummy word line, and vertical channel structures on a substrate, each of the vertical channel structures extending in the vertical direction through the word lines, the dummy word line and one of the first and second SSLs.

According to example embodiments, there is provided a method of manufacturing a vertical memory device. In the method, an insulation layer and a sacrificial layer may be alternately and repeatedly formed on a substrate to form a mold structure. Upper ones of the insulation layers and upper ones of the sacrificial layers may be partially etched to form a cut hole extending in a second direction. Edge portions of the mold structure may be sequentially etched to form a preliminary step mold structure having a staircase shape. A vertical channel structure may be formed through the preliminary step mold structure. The preliminary step mold structure may be etched to form an opening dividing the preliminary step mold structure into step mold structures. The sacrificial layers may be replaced with gate pattern structure including a plurality of word lines, a dummy word line, first and second string selection lines (SSLs), the dummy word line including an opening, wherein the opening may partially overlap the cut hole.

According to example embodiments, there is provided a vertical memory device that may include a plurality of lines stacked along a first direction on a substrate and vertical channel structures on a substrate, each of the vertical channel structures extending in the vertical direction through the word lines, the dummy word line, and one of the first and second selection lines. The plurality of lines may include a first dummy word line including an opening, the first dummy word line extending along a second direction, orthogonal to the first direction, having an opening, and having a portion that has a first width in a third direction orthogonal to the first and second directions, a first selection line and a second selection line at substantially a same distance in the first direction and extending along the second direction, and a plurality of word lines closer to the substrate along the first direction than the first dummy word line. The first dummy word line may have an end portion that extends in the second direction further than an end portion of the first and second selection lines. The first and second selection lines may be further from the substrate along the first direction than the first dummy word line. The first and second selection lines may each have widths in a third direction less than the first width. The cutting region may be between the first and second selection lines and separates the first and second selection lines. The opening may extend along the second direction from the end portion of the first and second selection lines to partially overlap the cutting region. The opening may end along the second direction before the end portion of the first dummy word line.

BRIEF DESCRIPTION OF THE DRAWINGS

Features will become apparent to those of skill in the art by describing in detail exemplary embodiments with reference to the attached drawings in which:

FIGS. 1 and 2 illustrate a perspective view and a plan view, respectively, of a vertical memory device in accordance with example embodiments;

FIGS. 3A, 3B and 3C illustrate cross-sectional views of the vertical memory device in accordance with example embodiments;

FIGS. 4, 5A to 5D, 6A to 12C, 13, 14, 15A to 16D, 17 and 18A to 19C illustrate cross-sectional views, plan views and perspective views of stages of a method of manufacturing a vertical memory device in accordance with example embodiments;

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Hereinafter, a direction substantially vertical to a top surface of a substrate is referred to as a first direction, and two directions substantially parallel to the top surface of the substrate and crossing each other are referred to as a second direction and a third direction, respectively. For example, the second direction and the third direction are substantially perpendicular to each other. Additionally, a direction indicated by an arrow and a reverse direction thereof are considered as the same direction. The above mentioned definitions of the directions are the same throughout all the figures in this specification. For convenience of description, the illustration of some elements, such as a contact plug, an insulating interlayer layer and a vertical channel structure are omitted in FIG. 1.

Figure 2:
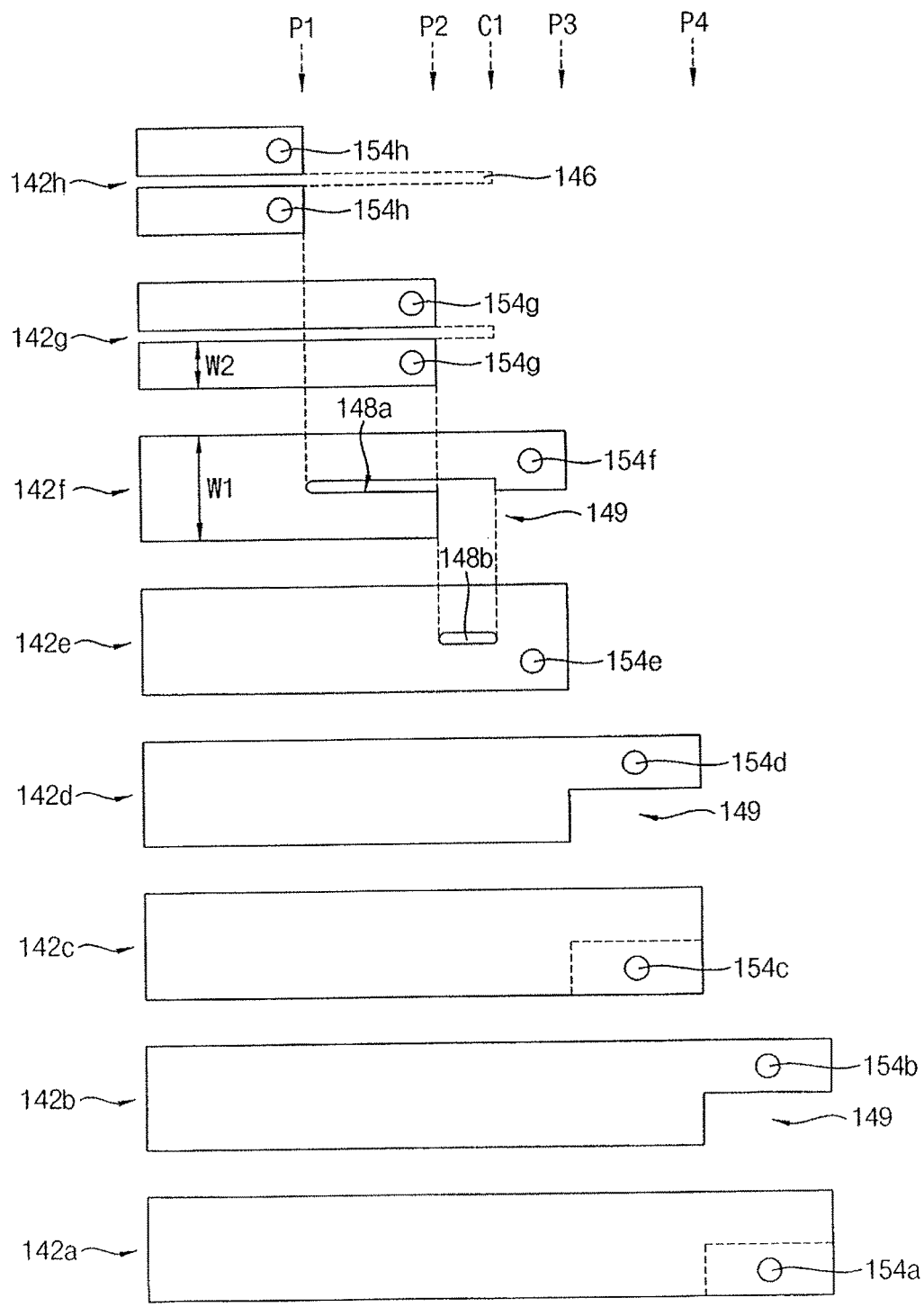
Figure 3C:
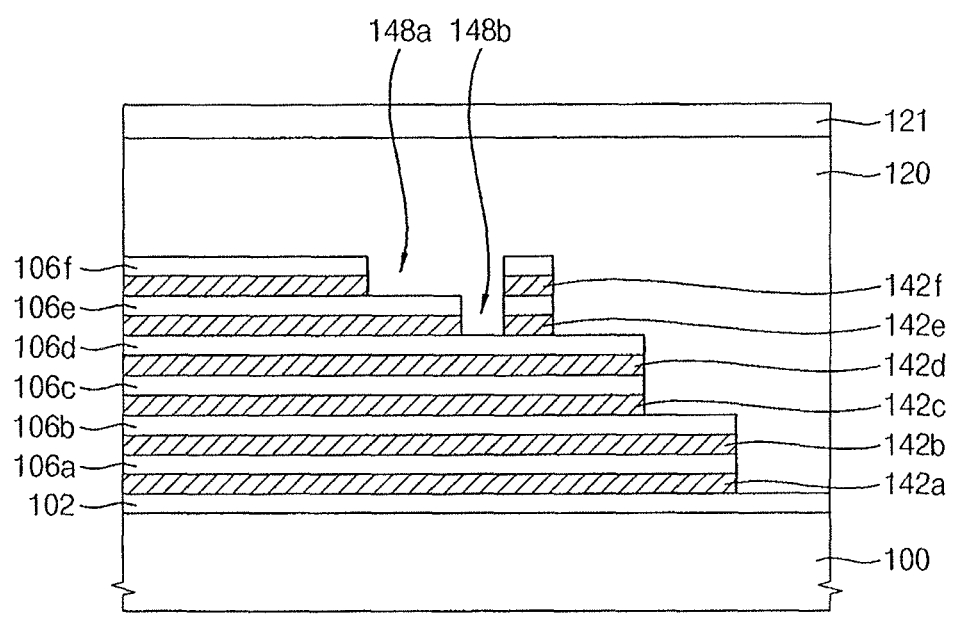

FIG. 1 is a perspective view illustrating the vertical memory device. FIG. 2 is a plan view illustrating a plurality of gate patterns in the vertical memory device. FIGS. 3A, 3B and 3C are cross-sectional views taken along lines I-I, II-II and III-III, respectively, indicated in FIG. 1.

Referring to FIGS. 1, 2, 3A, 3B and 3C, the vertical memory device may be formed on a substrate 100. The substrate 100 may include a cell region A on which memory cells may be formed, and a wiring region B on which wirings connected with the memory cells may be formed. The wiring region B may be close to edge portions of the cell region A.

A vertical channel structure 138 may be formed on the cell region A of the substrate 100, and may extend in the first direction from an upper surface of the substrate 100. A plurality of gate patterns 142 (e.g., 142a, 142b, 142c, 142d, 142e, 142f, 142g, and 142h) may be spaced apart from each other in the first direction, and may surround the vertical channel structure 138. The gate patterns 142 may form a gate pattern structure 150. Each of insulation patterns 106 (e.g., 106a, 106b, 106c, 106d, 106e, 106f, 106g, and 106h) may be formed between the gate patterns 142 in the first direction. Each of the gate patterns 142 may extend in the second direction.

An end portion in the second direction of the gate pattern structure 150 may have a staircase shape. That is, lengths in the second direction of the gate patterns 142 at respective levels may be different from each other, so that the gate pattern structure 150 on the wiring region B may have a staircase shape. Hereinafter, the gate pattern structure 150 on the wiring region B is referred to as a staircase portion.

The substrate 100 may include a semiconductor material, e.g., silicon and/or germanium. In example embodiments, the substrate 100 may include single crystalline silicon. A pad insulation layer 102 may be formed on the substrate 100.

The vertical channel structure 138 may include a channel 132, a charge storage structure 130 including a tunnel insulation layer, a charge storage layer and a blocking layer, and a filling insulation pattern 134. The vertical channel structure 138 may extend in the first direction through the gate pattern structure 150.

In example embodiments, the channel 132 may have a hollow cylindrical shape or a cup-like shape. The channel 132 may include polysilicon or single crystalline silicon.

The filling insulation pattern 134 may be formed on the channel 132 to fill an inner space of the channel 132. The filling insulation pattern 134 may have a pillar shape. The filling insulation pattern 134 may include an insulation material, e.g., silicon oxide. In some example embodiments, the channel 132 may have a solid cylindrical shape or a pillar shape, and in this case the filling insulation pattern 134 may not be formed.

The tunnel insulation layer, the charge storage layer and the blocking dielectric layer may be sequentially formed on an outer sidewall of the channel 132. The charge storage structure 130 may surround the outer sidewall of the channel 132. The tunnel insulation layer may include an oxide, e.g., silicon oxide. The charge storage layer may include a nitride, e.g., silicon nitride. The blocking dielectric layer may include an oxide, e.g., silicon oxide, or a metal oxide, e.g., hafnium oxide or aluminum oxide.

In example embodiments, a semiconductor pattern 124 may be formed between the substrate 100 and the vertical channel structure 138. The semiconductor pattern 124 may contact an upper surface of the substrate 100. The semiconductor pattern 124 may have a pillar shape, and the vertical channel structure 138 may be formed on the semiconductor pattern 124.

A pad pattern 136 may be formed on the channel 132, the charge storage structure 130 and the filling insulation pattern 134. In example embodiments, the pad pattern 136 may be connected with a bit line in the vertical memory device.

The gate patterns 142 may include a ground selection line (GSL), a word line, a dummy word line and a string selection line (SSL). For example, at least one of lower ones of the gate patterns 142 may serve as the GSL, and at least one of higher ones of the gate patterns 142 may serve as the SSL. Intermediate ones of the gate patterns 142 between the GSL and the SSL may serve as the word lines, respectively, and at least one of the intermediate ones of the gate patterns 142 may serve as the dummy word line.

For convenience of description, FIGS. 1, 2, 3A, 3B, and 3C show that a gate pattern 142a serves as the GSL, a gate pattern 142b serves as a first word line, a gate pattern 142c serves as a second word line, a gate pattern 142d serves as a third word line, a gate pattern 142e serves as a first dummy word line, a gate pattern 142f serves as a second dummy word line, a gate pattern 142g serves as a first SSL, and a gate pattern 142h serves as a second SSL.

In example embodiments, each of the GSL 142a, the first word line 142b, the second word line 142c, the third word line 142d, the first dummy word line 142e, and the second dummy word line 142f may have a first width W1 in the third direction.

Each of the first SSL 142g and the second SSL 142h may be divided into two pieces that may be spaced apart from each other in the third direction on the second dummy word line 142f. That is, two first SSLs 142g may be disposed in the third direction on the second dummy word line 142f, and two second SSLs 142h may be disposed on the two first SSLs 142g, respectively. Each of the two pieces of the first and second SSLs 142g and 142h may have a second width W2, e.g., equal second widths, in the third direction each of which is less than the first width W1. For example, the second width W2 may be less than about ½ of the first width W1.

The gate pattern 142 may include a metal, e.g., tungsten, a metal silicide and/or a metal nitride. In example embodiments, the gate pattern 142 may include tungsten. Alternatively, the gate pattern 142 may include polysilicon.

The insulation layer 106 may include, e.g., silicon oxide.

The staircase portions of the gate pattern structure 150 may be edge portions thereof in the second direction. A left one of the staircase portions of the gate pattern 142 may be symmetric to a right one of the staircase portions of the gate pattern 142. Hereinafter, only the right one of the staircase portions of the gate pattern 142 will be described.

The staircase portion of the gate pattern structure 150 may be divided into a first staircase portion including first steps disposed at odd-numbered levels, and a second staircase portion including second steps disposed at even-numbered levels. Hereinafter, one of the gate patterns 142 and one of the insulation layers 106 thereon may define one level.

The first steps may include edge portions of the GSL, e.g., 142a, the word line, e.g., 142c, and the dummy word line, e.g., 142e disposed at odd-numbered levels. Each of the first steps may include two stacked gate patterns 142, except for a lowermost one of the first steps.

The second steps may include edge portions of the word lines, e.g., 142b and 142d, and the dummy word line, e.g., 142f disposed at even-numbered levels. Each of the second steps may include two stacked gate patterns 142. The edge portions of the gate patterns 142 in the second direction at the even-numbered levels may include dents 149, respectively. The edge portions of the gate patterns 142 in the second direction at the odd-numbered levels may be exposed through the dents 149 of the edge portions of the gate patterns 142 in the second direction at the even-numbered levels.

The first SSL 142g together with the second SSL 142h may have a staircase shape. That is, the first SSL 142g may be a lower step and the second SSL 142h may be an upper step.

Referring to FIG. 2, the second SSL 142h may extend in the second direction to a first position P1. In example embodiments, two second SSLs 142h may be spaced apart from each other in the third direction. A space between the two second SSLs 142h may serve as an SSL cut hole 146.

The first SSL 142g may be formed under the second SSL 142h, and may extend in the second direction. The first SSL 142g may be longer than the second SSL 142h in the second direction. For example, the first SSL 142g may extend in the second direction to a second position P2. In example embodiments, two first SSLs 142g may be spaced apart from each other in the third direction. A space between the two first SSLs 142g may also serve as the SSL cut hole 146. In example embodiments, the SSL cut hole 146 may extend to a cutting position C1 between the second position P2 and a third position P3.

The second dummy word line 142f may be formed under the first SSL 142g, and may extend in the second direction. The second dummy word line 142f may be longer than the first SSL 142g in the second direction. For example, the second dummy word line 142f may extend in the second direction to the third position P3. An edge portion of the second dummy word line 142f in the second direction may include the dent 149.

The first dummy word line 142e may extend in the second direction to the third position P3. An edge portion of the first dummy word line 142e in the second direction may be exposed by the dent 149 of the second dummy word line 142f overlying the first dummy word line 142e. In example embodiments, an end of the dent 149 of the second dummy word line 142f may be located at the second position P2.

Also, the second dummy word line 142*f* may include a first recess 148*a* at a central portion of the second dummy word line 142*f* along the third direction. A first end of the first recess 148*a* may be under the end portion of the second SSL 142*h*, and the first recess 148*a* may extend in the second direction toward the edge portion of the second dummy word line 142*f*, but not all the way thereto. The first recess 148*a* may overlap with the SSL cut hole 146.

In example embodiments, the first end of the first recess 148*a* in the second direction may be aligned with the first position P1, and a second end of the first recess 148*a* in the second direction may be aligned with the cutting position C1. The first recess 148*a* may be in communication with the dent 149, i.e., the first recess 148*a* without the dent 149 may form an opening, but as the dent 149 overlaps such an opening in the second and third directions, this opening becomes the first recess 148*a* relative to the dent 149, e.g., may be a recess from the second position P2 to the cutting position C1, and otherwise an opening within the second dummy word line 142*f*.

The second dummy word line 142*f* may have a shape different from a shape of each of the first and second SSLs 142*h* and 142*g*. That is, the second dummy word line 142*f* may not be completely cut along in the second direction, and, thus, may not be divided into two separate pieces as each of the first and second SSLs 142*h* and 142*g*, such that a maximum width of the second dummy wore line is the first width W1. Also, the second dummy word line 142*f* may have a shape different from shapes of the word lines 142*b*, 142*c*, and 142*d* under the second dummy word line 142*f*. For example, while a portion of the second dummy word line 142*f* at which neither the first recess 148*a* nor the dent 149 is formed may have the first width W1 in the third direction, the word lines 142*b*, 142*c*, and 142*d* may not have the first recess 148*a*.

The first dummy word line 142*e* may be formed under the second dummy word line 142*f*, and may extend in the second direction. The first dummy word line 142*e* may be longer than the first SSL 142*g*. For example, the first dummy word line 142*e* may extend to the third position P3. The first dummy word line 142*e* may have the first width W1 in the third direction, and may extend in the second direction.

The first dummy word line 142*e* may include a first opening 148*b* at a central portion thereof. The first opening 148*b* may extend in the second direction, and a first end of the first opening 148*b* may overlap an end of the first SSL 142*g* and a second end of the first opening 148*b* may overlap the second end of the first recess 148*a* in the second dummy word line 142*f*.

The first end of the first opening 148*b* may be aligned with the second position P2. The second end of the first opening 148*b* may be aligned with the cutting position C1. That is, the second end of the first opening 148*b* may be spaced apart from the third position P3, which may be an end of the first dummy word line 142*f* in the second direction.

The first dummy word line 142*e* may have no dent. An edge portion of the first dummy word line 142*e* may be exposed by the dent 149 of the second dummy word line 142*f* overlying the first dummy word line 142*e*.

The first dummy word line 142*e* may have a shape different from a shape of each of the first and second SSLs 142*g* and 142*h*. That is, the first dummy word line 142*e* may not be completely cut along in the second direction, and thus may not be divided into two separate pieces as the first and second SSLs 142*h* and 142*g*. The first dummy word line 142*e* may have a shape different from a shape of the word lines 142*b*, 142*c* and 142*d* under the first dummy word line 142*e*, e.g., the word lines may not include a first opening 148*b*. The first dummy word line 142*e* may have a shape different from a shape of the second dummy word line 142*f* e.g., may not have a dent 149 or the first recess 148*a*, while having the first opening 148*b*. The first dummy word line 142*e* may have the first width W1, and may extend in the second direction.

The third word line 142*d* may be formed under the first dummy word line 142*e*, and may extend in the second direction. The third word line 142*d* may be longer than the first dummy word line 142*e*. For example, the third word line 142*d* may extend to a fourth position P4. The third word line 142*d* may have the dent 149 that may expose an edge portion of the second word line 142*c* underlying the third word line 142*d*. A portion of the third word line 142*d* having no dent may have a length in the second direction greater than a length in the second direction of a portion of the third word line 142*d* having the dent 149. In example embodiments, an end of the dent 149 of the third word line 142*d* may be aligned with the third position P3.

The second word line 142*c* may be formed under the third word line 142*d*, and may extend in the second direction to the fourth position P4. The second word line 142*c* may have no dent, and an edge portion of the second word line 142*c* may be exposed by the dent 149 of the third word line 142*d* overlying the second word line 142*c*.

The first word line 142*b* and the GSL 142*a* may be formed under the second word line 142*c*. An edge portion of the first word line 142*b* may have a shape substantially the same as a shape of the edge portion of the third word line 142*d*. An edge portion of the GSL 142*a* may have a shape substantially the same as a shape of the edge portion of the second word line 142*c*. Edge portions of the first word line 142*b* and the third word line 142*d* may have a staircase shape, and edge portions of the GSL 142*a* and second word line 142*b* 142*d* may have a staircase shape.

Each of the first and second dummy word lines 142*e* and 142*f* may not serve as an actual word line, however, may serve as a wiring for transferring electrical signals.

A first insulating interlayer 120 may cover the gate pattern structure 150. A second insulating interlayer 121 may be formed on the first insulating interlayer 120. The first and second insulating interlayers 120 and 121 may include, e.g., silicon oxide.

A plurality of contact plugs 154*a*, 154*b*, 154*c*, 154*d*, 154*e*, 154*f*, and 154*g* may be formed on the edge portions of the GSL 142*a*, the first, second and third word lines 142*b*, 142*c* and 142*d*, the first and second dummy word lines 142*e* and 142*f*, the first SSL 142*g* and the second SSL 142*h*, respectively, through the first and second insulating interlayers 120 and 121.

In example embodiments, edge portions of the GSL 142*a*, the second word line 142*c* and the first dummy word line 142*e* may be exposed by the dents 149 of the first word line 142*b*, the third word line 142*b*, and the second dummy word line 142*e*, respectively. Thus, a first contact plug 154*a*, a third contact plug 154*c* and a fifth contact plug 154*e* may be formed on the edge portions of the GSL 142*a*, the second word line 142*c*, and the first dummy word line 142*e*, respectively. Additionally, a seventh contact plug 154*g* may be formed on an edge portion of the SSL 142*g*. In example embodiments, the edge portions of the first word line 142*b*, the third word line 142*d* and the second dummy word line 142*f* may include protruding portions relative to the dents 149. Thus, a second contact plug 154*b*, a fourth contact plug 154*d*, a sixth contact plug 154*f* and an eighth contact plug 154*h* may be formed on the edge portions of the first word line 142b, the third word line 142d, the second dummy word line 142f and the second SSL 142h, respectively.

If the second dummy word line 142f is cut along the SSL cut hole 146, the second dummy word line 142f may be divided into two separate pieces. Thus, electrical signals, which are applied to the second dummy word line 142f via the sixth contact plug 154f, may not be transferred but may be floated.

However, in example embodiments, the second dummy word line 142f may include the first recess 148a, and the end of the first recess 148a may be located at the first position P1. Thus, the second dummy word line 142f may not be divided into two separate pieces. The electrical signals, which are applied to the second dummy word line 142f via the sixth contact plug 154f, may be transferred by the second dummy word line 142f, and thus the electrical signal may not be floated. The electrical signal may be normally transferred by the second dummy word line 142f, and thus an electrical failure may decrease.

For convenience of description, FIGS. 1, 2, 3A, and 3C show that the gate pattern structure 150 includes eight gate patterns 142 sequentially stacked. However, the gate pattern structure 150 may include sixteen gate patterns 142, thirty-two gate patterns 142, sixty-four gate patterns 142, 128 gate patterns 142 sequentially stacked, and so forth, in accordance with a layout of circuits and/or a capacitance or an integration degree of the vertical memory device.

A plurality of gate pattern structures 150 may be arranged in the third direction, and may be spaced apart from each other. A gap between the gate pattern structures 150 may be referred to as a second opening 140, which may extend in the second direction. An insulation pattern may fill the second opening 140. The insulation pattern may include, e.g., silicon oxide.

An impurity region (not shown) may be formed on the substrate 100 under the insulation pattern. The impurity region may extend in the second direction, and may serve as a common source line (CSL) of the vertical memory device. Alternatively, a CSL may be further formed on the impurity region through the insulation pattern.

Figure 5A:
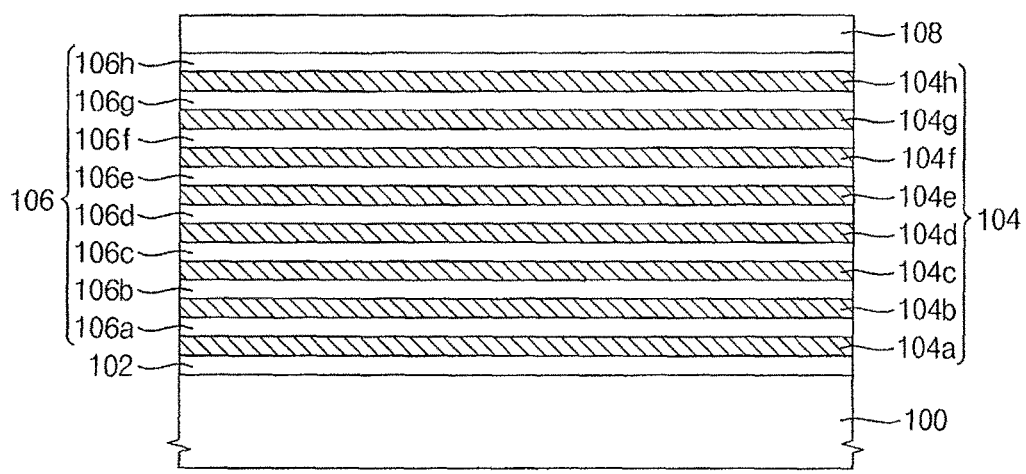
Figure 5B:
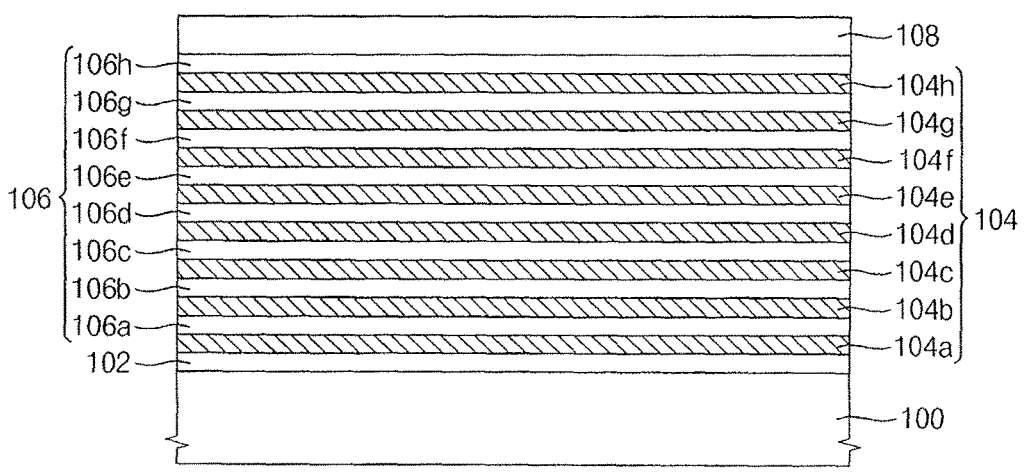
Figure 5C:
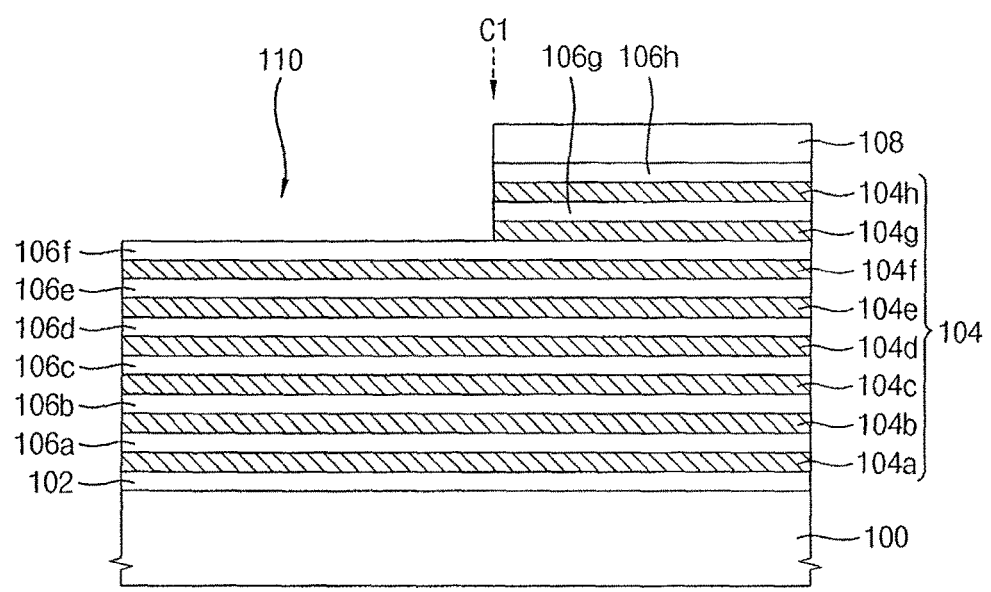
Figure 13:
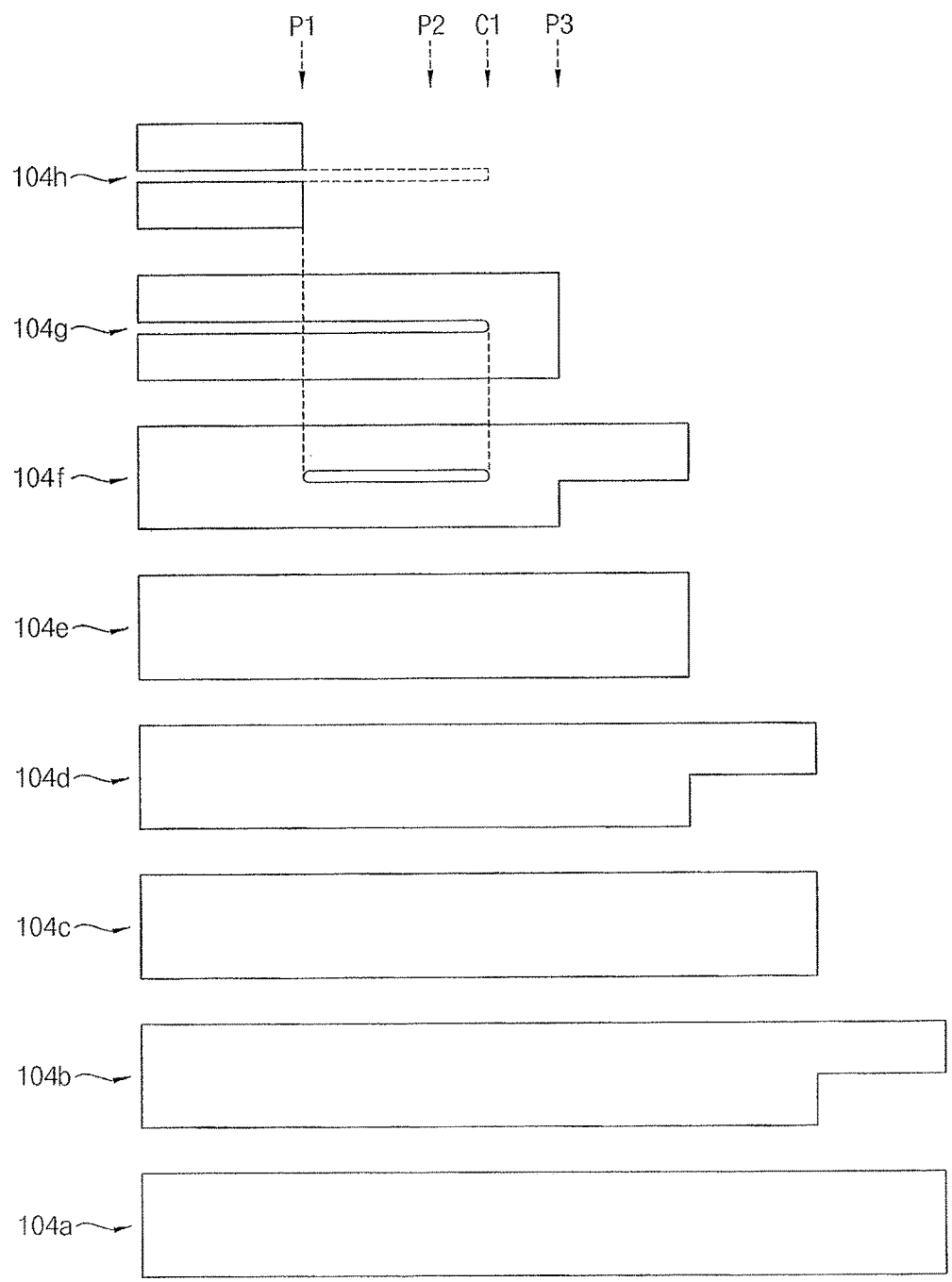
Figure 14:
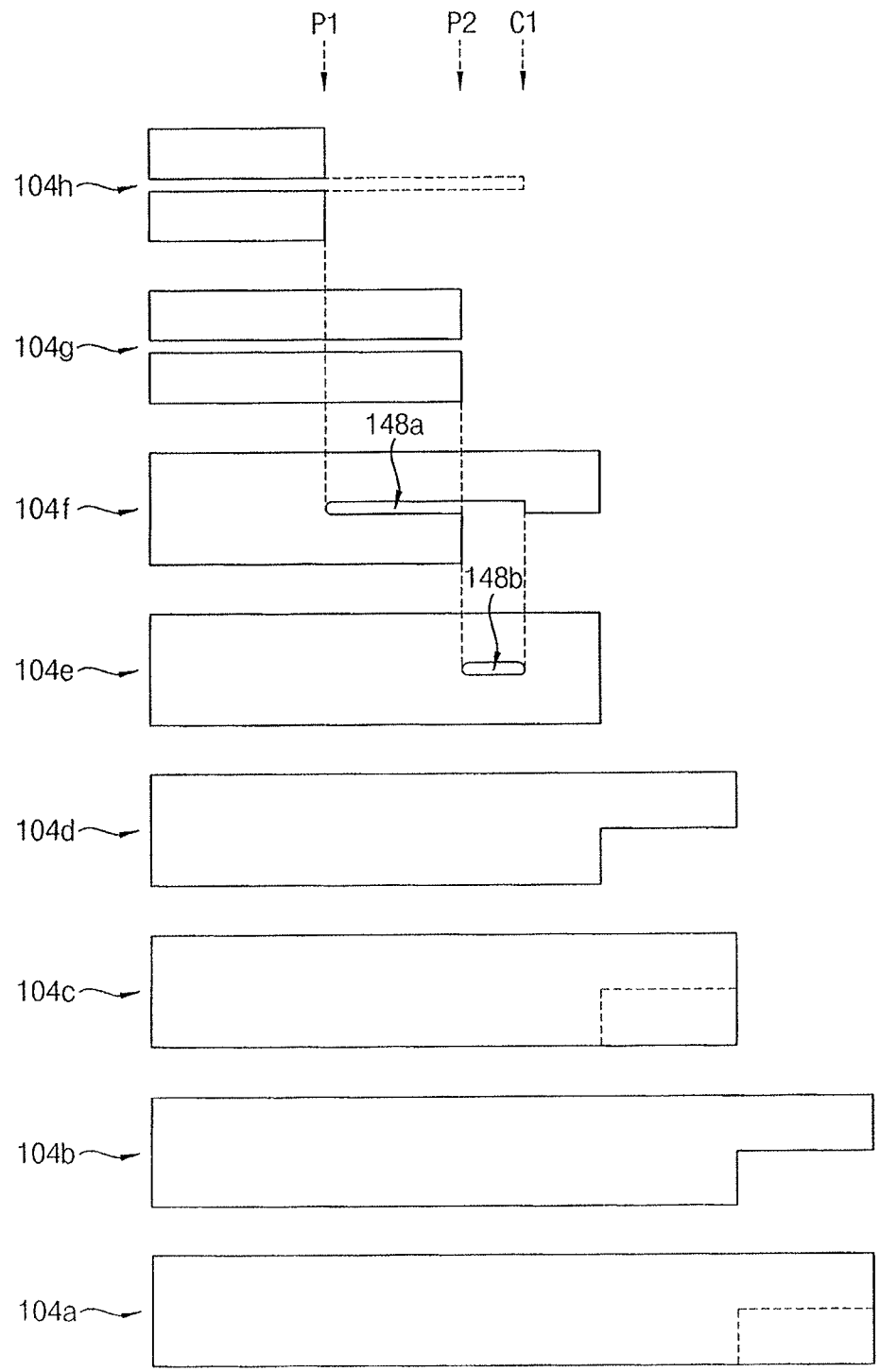

FIGS. 4, 5A to 12C, 13, 14, 15A to 16D, 17 and 18A to 19C are cross-sectional views, plan views and perspective views illustrating stages of a method of manufacturing a vertical memory device in accordance with example embodiments. Particularly, FIGS. 5A, 6A, 7A, 8A, 9A, 10A, 11A, 12A, 15A, 16A, 18A and 19A are cross-sectional views taken along a line I-I' of FIG. 1, FIGS. 5B, 6B, 7B, 8B, 9B, 10B, 11B, 12B, 15B, 16B, 18B and 19B are cross-sectional views taken along a line II-II' of FIG. 1, and FIGS. 5C, 6C, 7C, 8C, 9C, 10C, 11C, 12C, 15C, 16C, 18C and 19C are cross-sectional views taken along a line III-III' of FIG. 1. FIGS. 4 and 5D are perspective views, in which some elements such as a vertical channel structure and an insulating interlayer layer are not shown for simplicity. FIGS. 13 and 14 are plan views.

Referring to FIG. 4, the pad insulation layer 102 may be formed on the substrate 100. Sacrificial layers 104 and insulation layers 106 may be alternately stacked on the pad insulation layer 102 to form a mold structure 107.

The substrate 100 may include a semiconductor material, e.g., silicon or germanium. In example embodiments, the substrate 100 may include a cell region and a pad region. The pad insulation layer 102 and the insulation layers 106 may be formed of an oxide-based material, e.g., silicon oxide. The sacrificial layer 104 may be formed of a material that may have an etching selectivity with respect to the insulation layer 106, and may be easily removed by a wet etching process. For example, the sacrificial layer 104 may be formed of a nitride-based material, e.g., silicon nitride and/or silicon boron nitride.

In example embodiments, the pad insulation layer 102, the insulation layer 106 and the sacrificial layer 104 may be formed by at least one of a chemical vapor deposition (CVD) process, a plasma enhanced chemical vapor deposition (PECVD) process, a high density plasma chemical vapor deposition (HDP-CVD) process or an atomic layer deposition (ALD) process. In example embodiments, the pad insulation layer 102 may be formed by a thermal oxidation process or a radical oxidation process on a top surface of the substrate 100.

The sacrificial layers 104 may be removed in a subsequent process to form spaces for a GSL, a word line, a dummy word line and an SSL. Thus, the number of the insulation layers 106 and the sacrificial layers 104 may be determined in consideration of the number of the GSL, the word line, the dummy word line, and the SSL.

Hereinafter, eight insulating layers 106 and eight sacrificial layers 104 alternately stacked in the mold structure 107 are described. The sacrificial layers 104 may be referred to as a first sacrificial layer 104a, a second sacrificial layer 104b, ..., and an eighth sacrificial layer 104h, respectively, and the insulation layers 106 may be referred to as a first insulation layer 106a, a second insulation layer 106b, ..., and an eighth insulation layer 106h, respectively, in this order in the first direction from the substrate 100.

In example embodiments, the seventh and eighth sacrificial layers 104g and 104h may be replaced with a first SSL and a second SSL, respectively, by subsequent processes. The fifth and sixth sacrificial layers 104e and 104f may be replaced with a first dummy word line and a second dummy word line, respectively, by subsequent processes. The first to fourth sacrificial layers 104a, 104b, 104c and 104d may be replaced with a GSL and first to third word lines, respectively, by subsequent processes.

Referring to FIGS. 5A, 5B, 5C, and 5D, a first etching mask 108 for forming a cut hole 110 may be formed on the mold structure 107. The first etching mask 108 may include a photoresist pattern.

The first etching mask 108 may have a hole extending in the second direction. The hole may extend to a cutting position C1 between a second position P2 corresponding to an end of the first SSL and a third position P3 corresponding to an end of the second dummy word line.

The eighth insulation layer 106h, the eighth sacrificial layer 104h, the seventh insulation layer 106g and the seventh sacrificial layer 104g may be sequentially etched using the first etching mask 108 to form the cut hole 110.

When the semiconductor device includes the first and second SSLs, upper two 104h and 104g of the sacrificial layers 104 and upper two 106h and 106g of the insulation layers 106 may be etched to form the cut hole 110. When the semiconductor device includes one SSL, an uppermost one of the sacrificial layers 104 and an uppermost one of the insulation layers 106 may be etched to form the cut hole 110.

In example embodiments, the sacrificial layer 104 and the insulation layer 106 may have a high etching selectivity with respect to each other, so that the etching process may be performed until the seventh sacrificial layer 104g may be exactly etched to form the cut hole 110. Thus, a bottom of the cut hole 110 may expose a top surface of the sixth insulation layer 106f.

The cut hole 110 may correspond to a space between two first SSLs or a space between two second SSLs over the second dummy word line. By forming the cut hole 110, the space between the two first SSLs and the space between the two second SSLs may be exactly defined. Then, the first etching mask 108 may be removed.

Figure 6A:
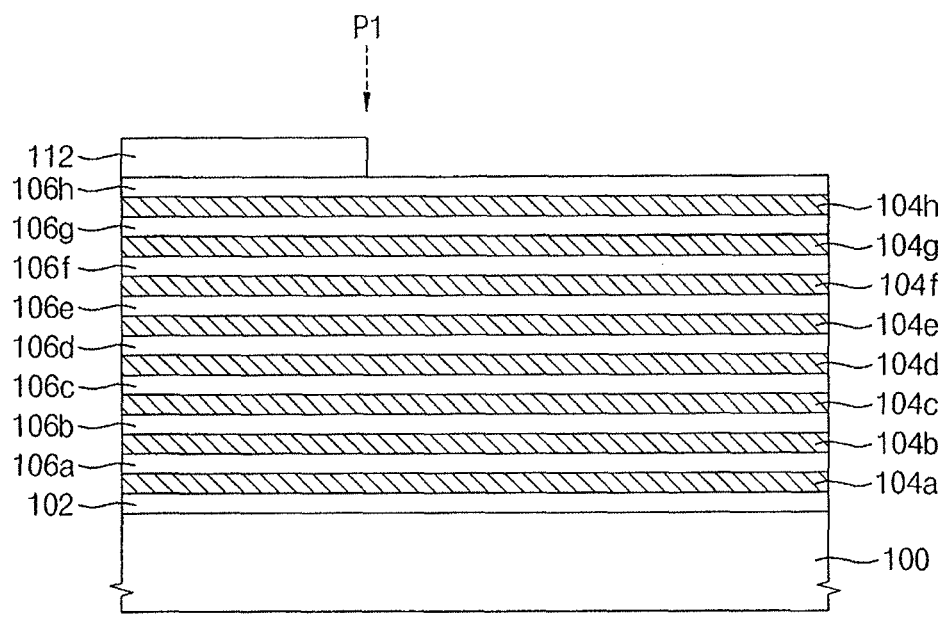
Figure 6B:
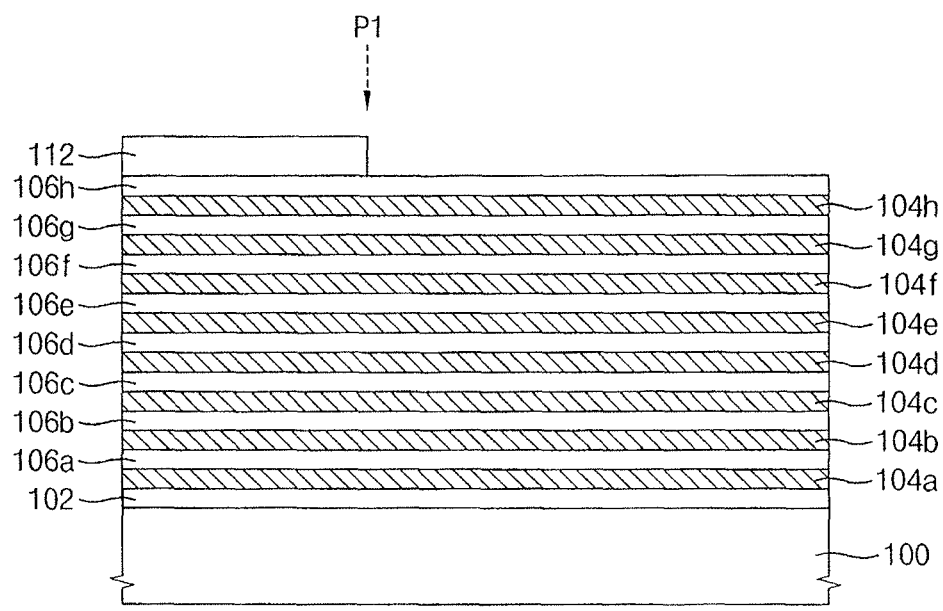
Figure 6C:
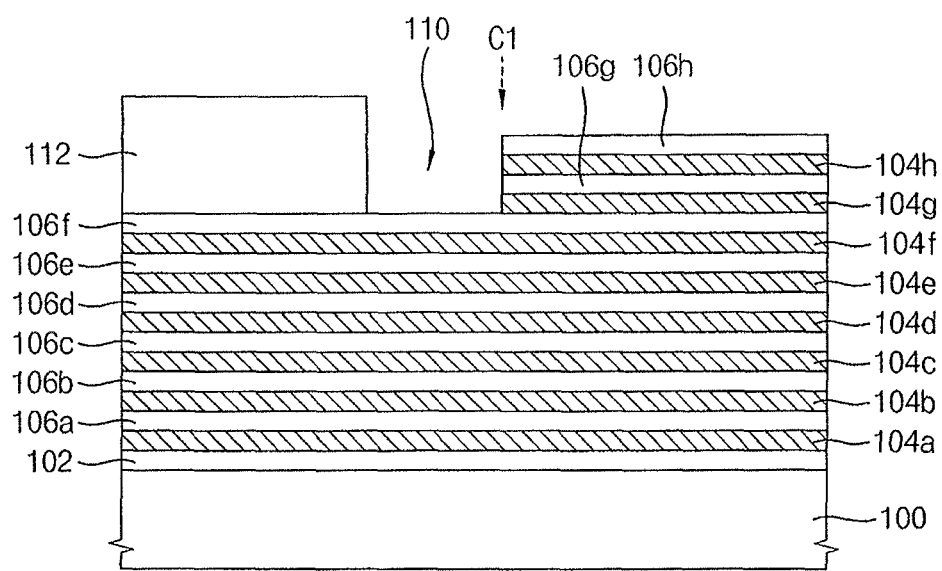

Referring to FIGS. 6A, 6B, and 6C, a second etching mask 112 for forming a step of the second SSL may be formed on the mold structure 107. The second etching mask 112 may include a photoresist pattern. The second etching mask 112 may cover the mold structure 107 from a central portion to the first position P1 corresponding to an end of the second SSL.

Referring to FIG. 6C, in a cutting region including the cut hole 110 and a wiring region adjacent to the cut hole 110 in the second direction, portions of the sixth insulation layer 104*f* and the eighth insulation layer 104*h* may be exposed by the second etching mask 112.

Figure 7A:
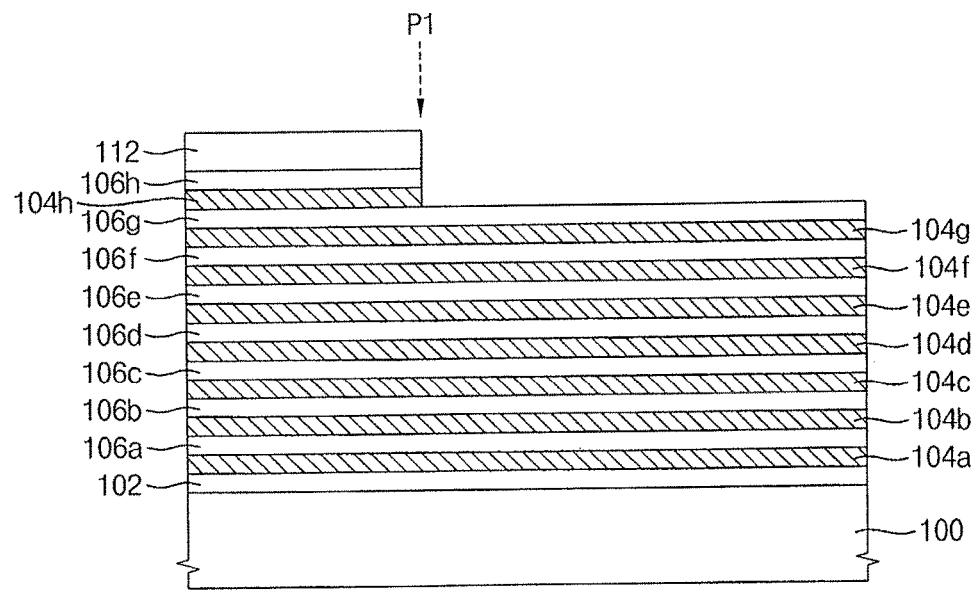
Figure 7B:
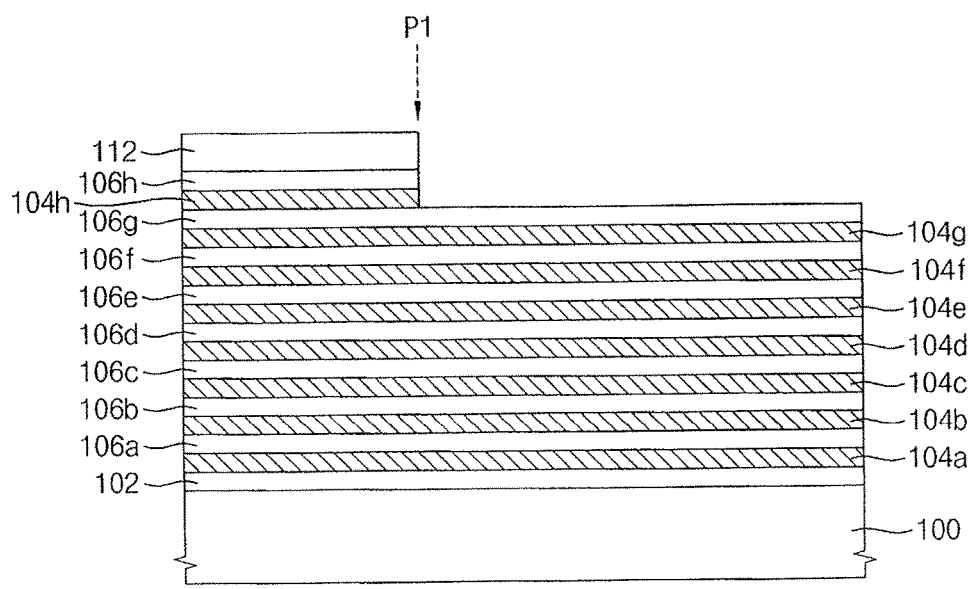
Figure 7C:
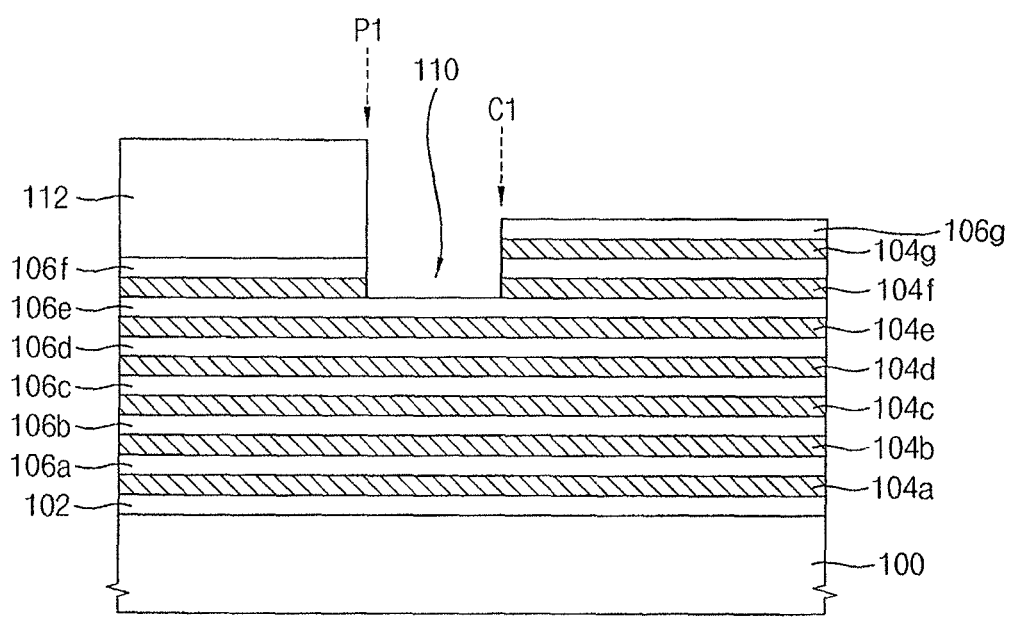

Referring to FIGS. 7A, 7B, and 7C, an exposed uppermost one of the insulation layers 106 and an exposed uppermost one of the sacrificial layers 104 may be etched using the second etching mask 112.

Particularly, the eighth insulation layer 106*h* and the eighth sacrificial layer 104*h* may be etched using the second etching mask 112. Also, the sixth insulation layer 106*f* and the sixth sacrificial layer 104*f* under the cut hole 110 may be etched using the second etching mask 112.

Referring to FIG. 7C, the cut hole 110 may be disposed between the two second SSLs and between the two first SSLs, so that the seventh and eighth insulation layers 106*g* and 106*h* and the seventh and eighth sacrificial layers 104*g* and 104*h* may not be formed in the cut hole 110. Thus, the sixth sacrificial layer 104*f* and the sixth insulation layer 106*f* under the cut hole 100 may be partially etched.

Then, the second etching mask 112 may be removed.

As described above, the eighth insulation layer 106*h* and the eighth sacrificial layer 104*h* may be etched using the second etching mask 112 to form a mold pattern for forming the second SSL. However, the process for forming the uppermost one of the SSLs, e.g., the second SSL may not be limited to the above-illustrated process. In some example embodiments, the process for forming steps of the word lines under the second SSL may be performed, and then the process for forming the second SSL may be performed.

Figure 8A:
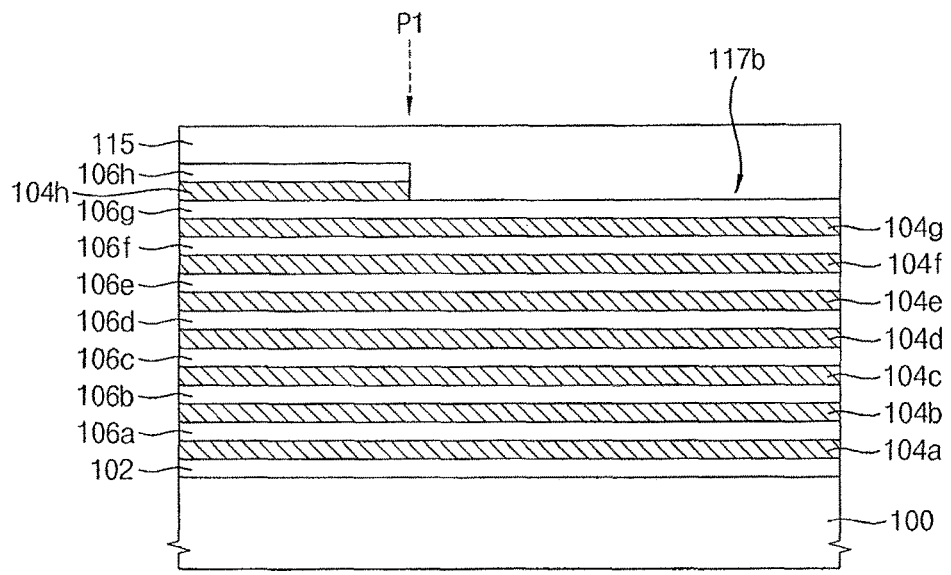
Figure 8B:
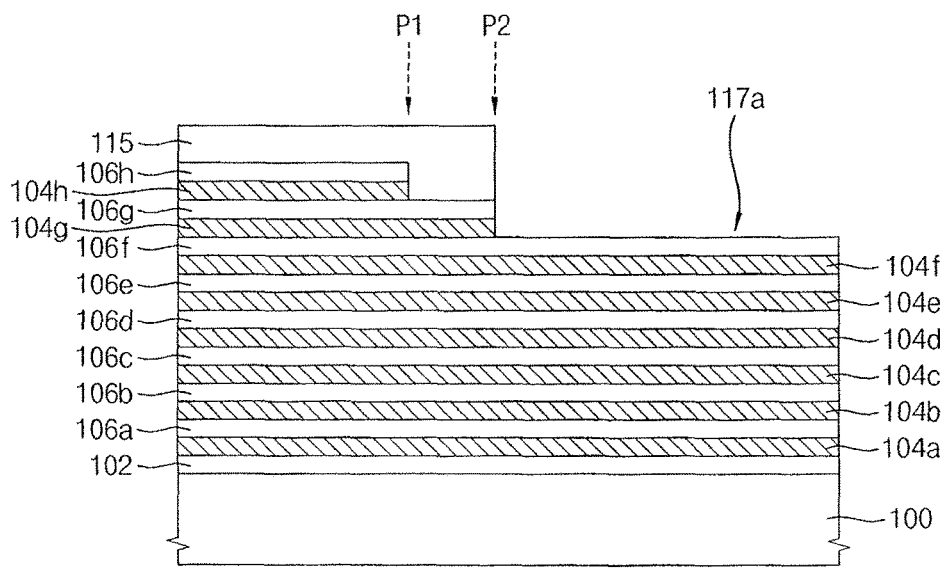
Figure 8C:
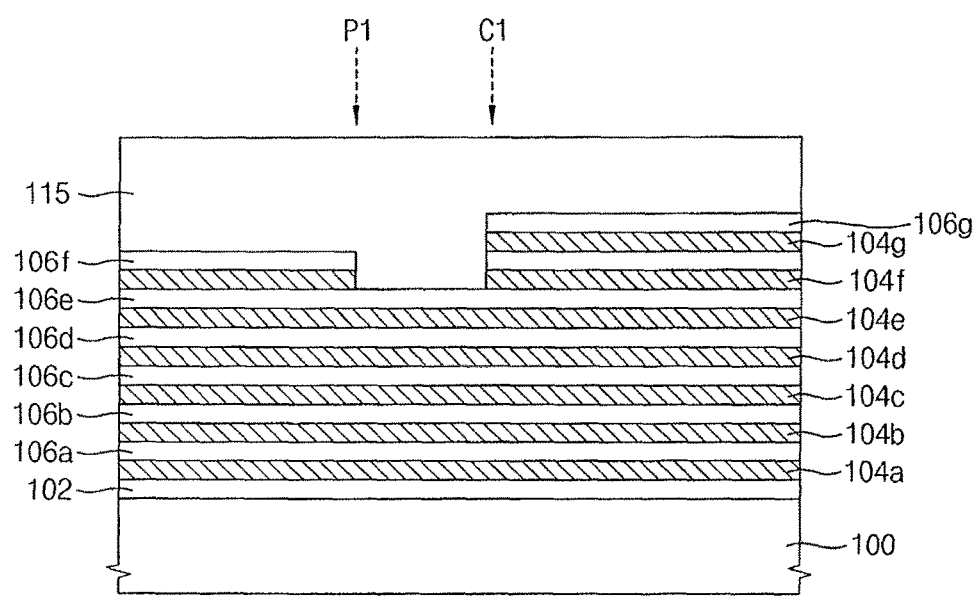

Referring to FIGS. 8A, 8B, and 8C, a third etching mask 115 may be formed on the mold structure 107. The third etching mask 115 may serve as a mask for forming a lower step portion 117*a* and an upper step portion 117*b*, and may include a photoresist pattern.

In example embodiments, the lower step portion 117*a* may be formed between the cut holes 110. Thus, the cut holes 110 and the upper step portion 117*b* may be covered with the third etching mask 115. In some example embodiments, the lower step portion 117*a* and the first cut hole 110 may partially overlap with each other.

The exposed uppermost one of the insulation layers 106, e.g., the eighth insulation layer 106*h* and the exposed uppermost one of the sacrificial layers 104, e.g., the eighth insulation layer 104*h* may be etched using the third etching mask 115. Thus, a top portion of the mold structure 107 may include the lower step portions 117*a* and upper step portions 117*b*, which may be alternately and repeatedly arranged in the third direction on the wiring region. The number of the insulation layers 106 and the sacrificial layers 104 sequentially stacked under the upper step portion 117*b* may be more by one than the number of the insulation layers 106 and the sacrificial layers 104 sequentially stacked under the lower step portion 117*a*.

In example embodiments, an end portion of the third etching mask 115 may be disposed at the second position P2, which may be an end portion of the first SSL. Then, the third etching mask 115 may be removed.

Figure 9A:
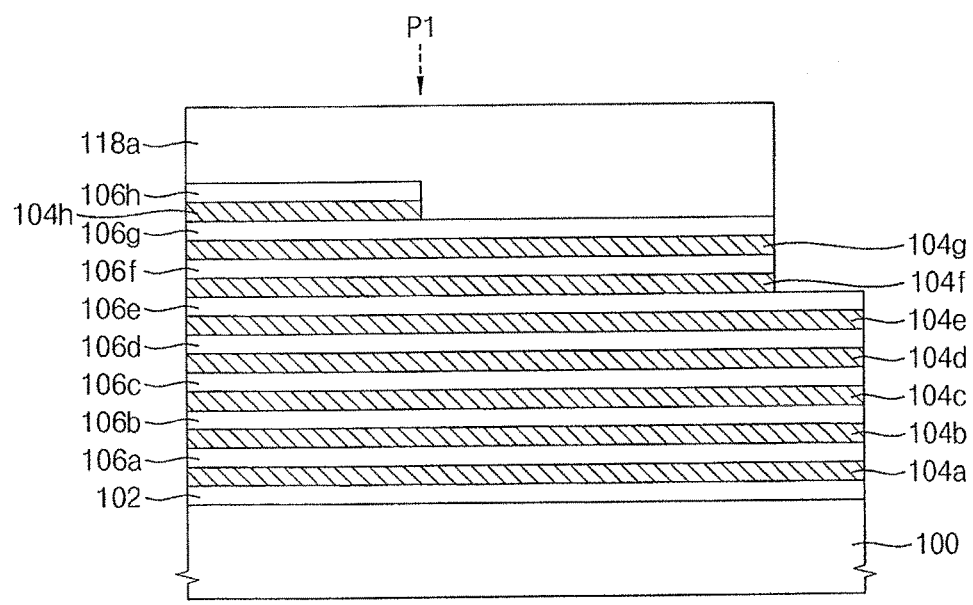
Figure 9B:
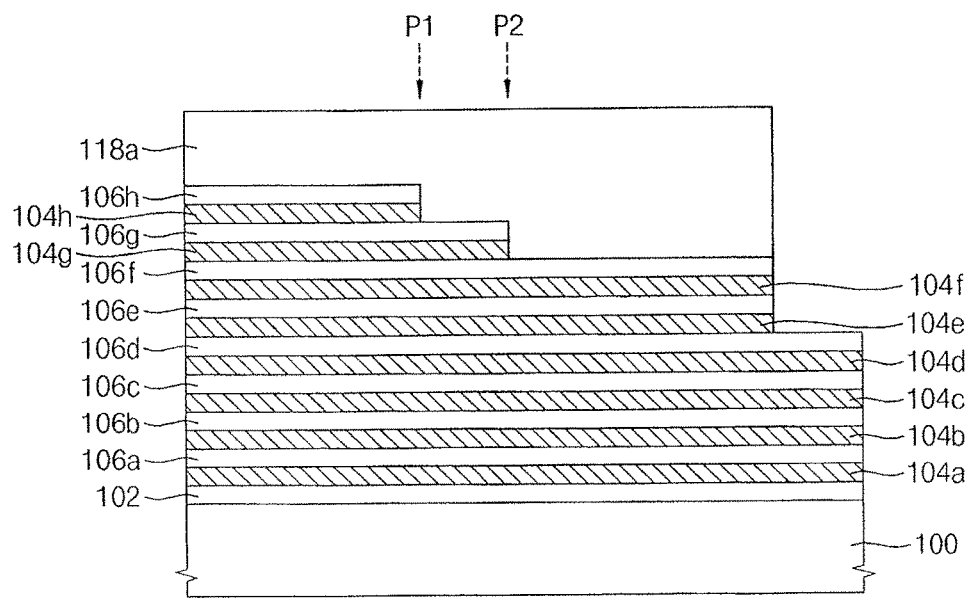
Figure 9C:
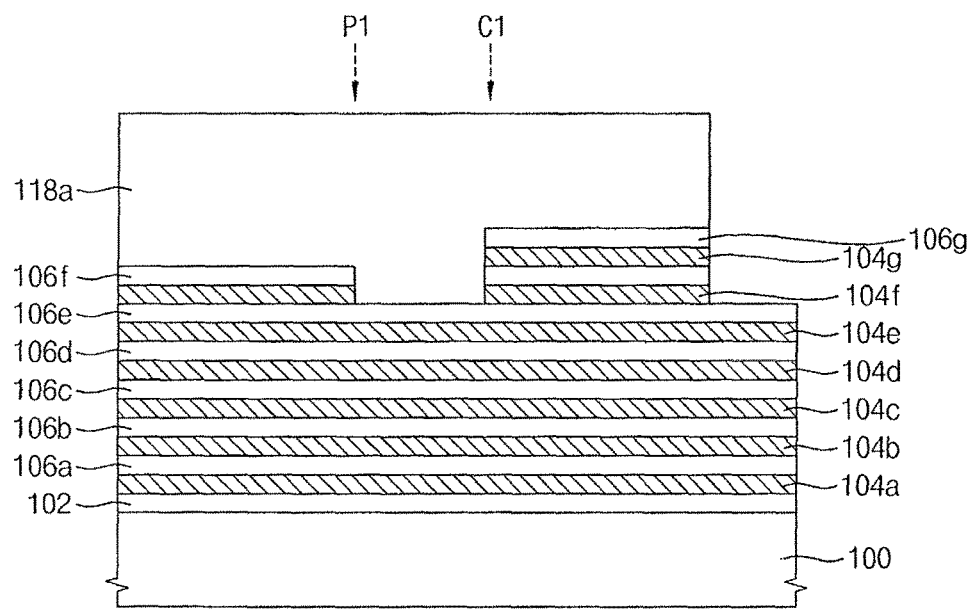

Referring to FIGS. 9A, 9B, and 9C, a fourth etching mask 118*a* for forming steps may be formed on the mold structure 107. The fourth etching mask 118*a* may include a photoresist pattern. Upper two stacked insulation layers 106 and upper two stacked sacrificial layers 104 may be etched using the fourth etching mask 118*a*.

Referring to FIG. 9A, when eight insulating layers 106 and eight sacrificial layers 104 are stacked in the mold structure 107, the first to seventh insulation layers 106*a*, 106*b*, 106*c*, 106*d*, 106*e*, 106*f*, and 106*g* and the first to seventh sacrificial layers 104*a*, 104*b*, 104*c*, 104*d*, 104*e*, 104*f*, and 104*g* may be alternately stacked under the upper step portion 117*b* exposed by the fourth etching mask 118*a*. Referring to FIG. 9B, the first to sixth insulation layers 106*a*, 106*b*, 106*c*, 106*d*, 106*e*, and 106*f* and the first to sixth sacrificial layers 104*a*, 104*b*, 104*c*, 104*d*, 104*e*, and 104*f* may be alternately stacked under the lower step portion 117*a* exposed by the fourth etching mask 118*a*.

Thus, the sixth and seventh insulation layers 106*f* and 106*g* and the sixth and seventh sacrificial layers 104*f* and 104*g* under the upper step portion 117*b* and the fifth and sixth insulation layers 106*e* and 106*f* and the fifth and sixth sacrificial layers 104*e* and 104*f* under the lower step portion 117*a* may be etched using the fourth etching mask 118*a* to form one step.

Referring to FIG. 9C, the sixth and seventh insulation layers 106*f* and 106*g* and the sixth and seventh sacrificial layers 104*f* and 104*g* in the cutting region may be etched using the fourth etching mask 118*a* to form one step.

Figure 10A:
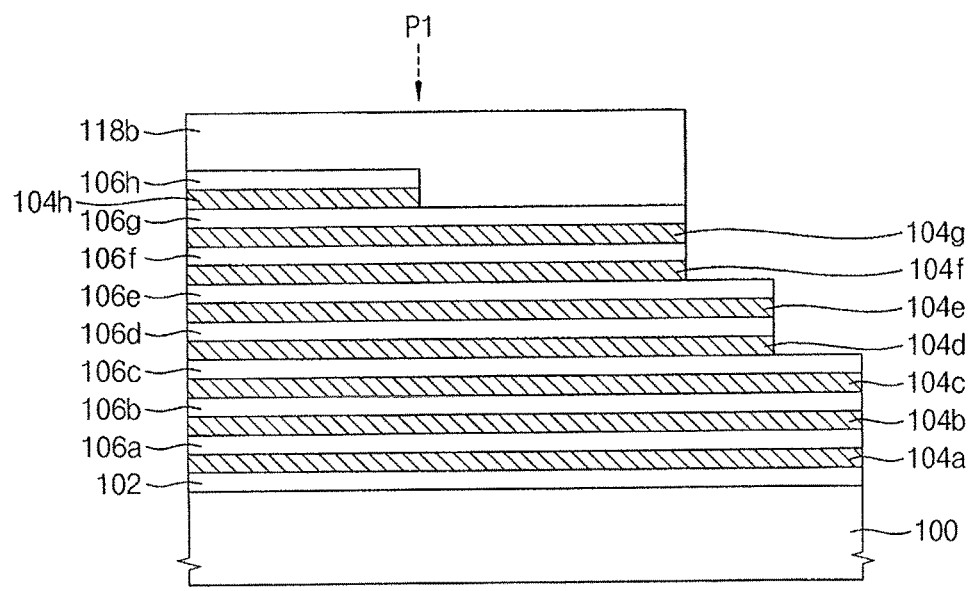
Figure 10B:
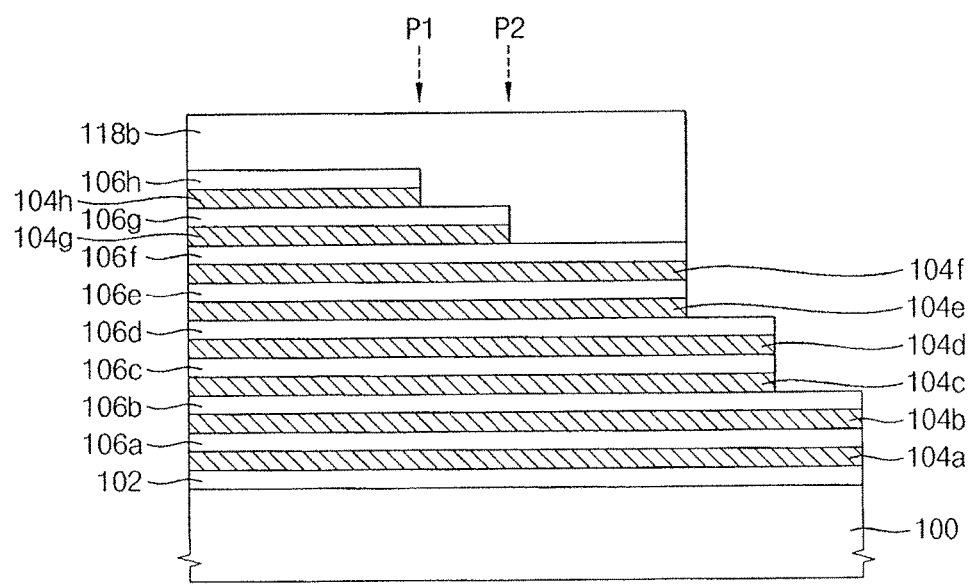
Figure 10C:
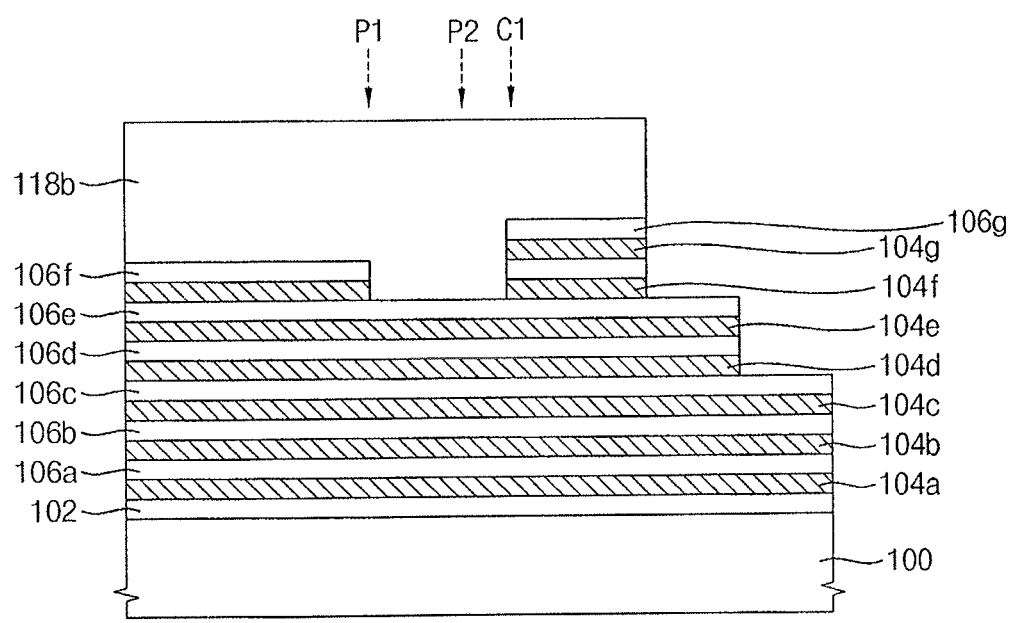

Referring to FIGS. 10A, 10B, and 10C, the fourth etching mask 118*a* may be partially removed by a trimming process to form a fifth etching mask 118*b*. The fifth etching mask 118*b* may have a width in the second direction less than a width in the second direction of the fourth etching mask 118*a*. Thus, an area of the mold structure 107 exposed by the fifth etching mask 118*b* may be greater than that of the mold structure 107 exposed by the fourth etching mask 118*a*. Upper two stacked insulation layers 106 and upper two stacked sacrificial layers 104 may be etched using the fifth etching mask 118*b*.

Referring to FIGS. 10A and 10B, the fourth to seventh insulation layers 106*d*, 106*e*, 106*f*, and 106*g* and the fourth to seventh sacrificial layers 104*d*, 104*e*, 104*f*, and 104*g* under the upper step portion 117*b* and the third to sixth insulation layers 106*c*, 106*d*, 106*e*, and 106*f* and the third to sixth sacrificial layers 104*c*, 104*d*, 104*e*, and 104*f* under the lower step portion 117*a* may be etched using the fifth etching mask 118*b* to form two steps.

Referring to FIG. 10C, the fourth to seventh insulation layers 106*d*, 106*e*, 106*f*, and 106*g* and the fourth to seventh sacrificial layers 104*d*, 104*e*, 104*f*, and 104*g* in the cutting region may be etched using the fifth etching mask 118*b* to form two steps.

Referring to FIGS. 11A, 11B, 11C, and 13, the fifth etching mask 118*b* may be partially removed by a trimming process to form a sixth etching mask 118*c*. The sixth etching mask 118*c* may have a width in the second direction less than a width in the second direction of the fifth etching mask 118*b*. Thus, an area of the mold structure 107 exposed by the sixth etching mask 118*c* may be greater than that of the mold structure 107 exposed by the fifth etching mask 118*b*. Upper two stacked insulation layers 106 and upper two stacked sacrificial layers 104 may be etched using the sixth etching mask 118c. FIG. 13 shows a plan view of the sacrificial layers 104 disposed at respective levels when the etching process is performed.

Figure 11A:
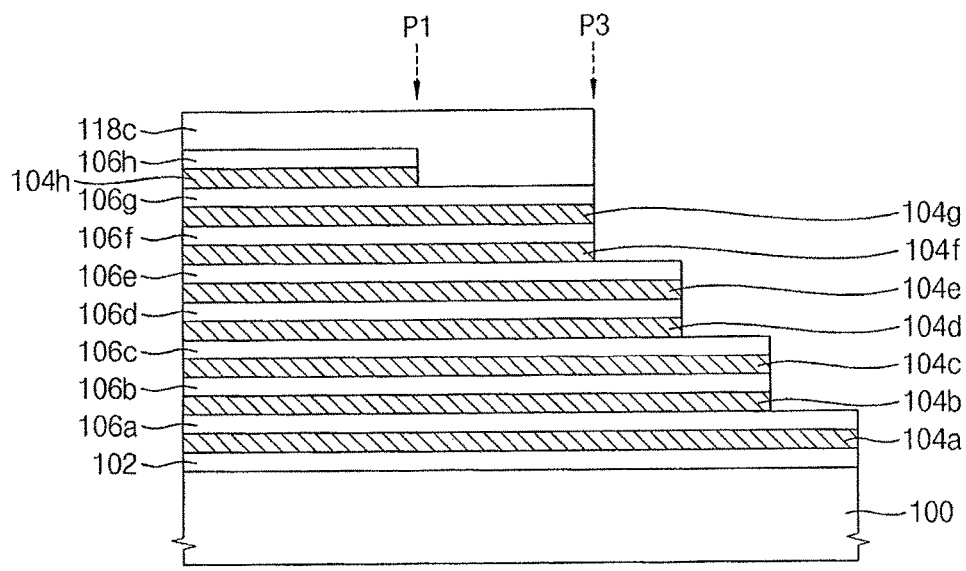
Figure 11B:
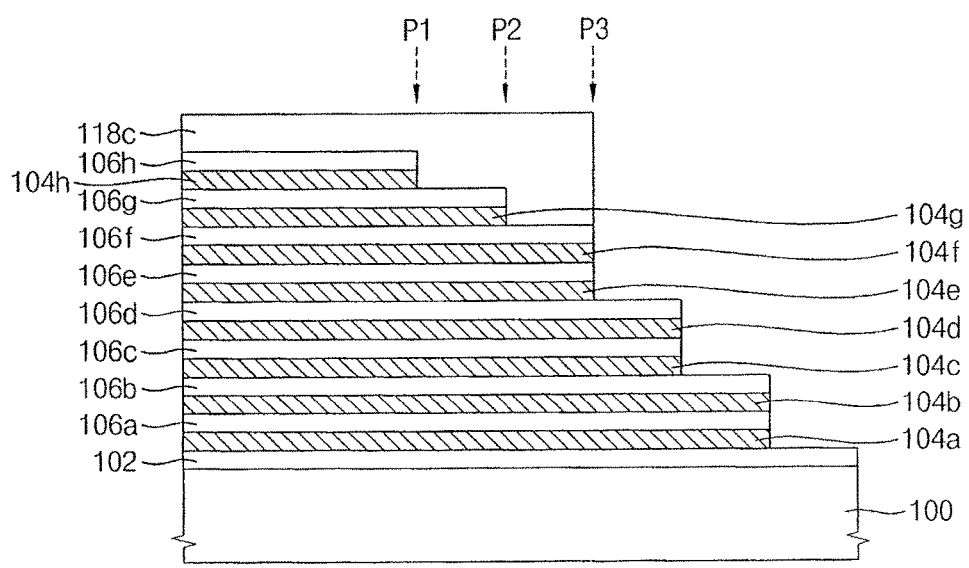

Referring to FIGS. 11A and 11B, the second to seventh insulation layers 106b, 106c, 106d, 106e, 106f, and 106g and the second to seventh sacrificial layers 104b, 104c, 104d, 104e, 104f, and 104g under the upper step portion 117b and the first to sixth insulation layers 106a, 106b, 106c, 106d, 106e, and 106f and the first to sixth sacrificial layers 104a, 104b, 104c, 104d, 104e, and 104f under the lower step portion 117a may be etched using the sixth etching mask 118c.

Thus, three steps may be formed in the upper step portion 117b and the lower step portion 117a, respectively. Each of the steps may include one sacrificial layer 104 and one insulation layer 106 sequentially stacked.

Figure 11C:
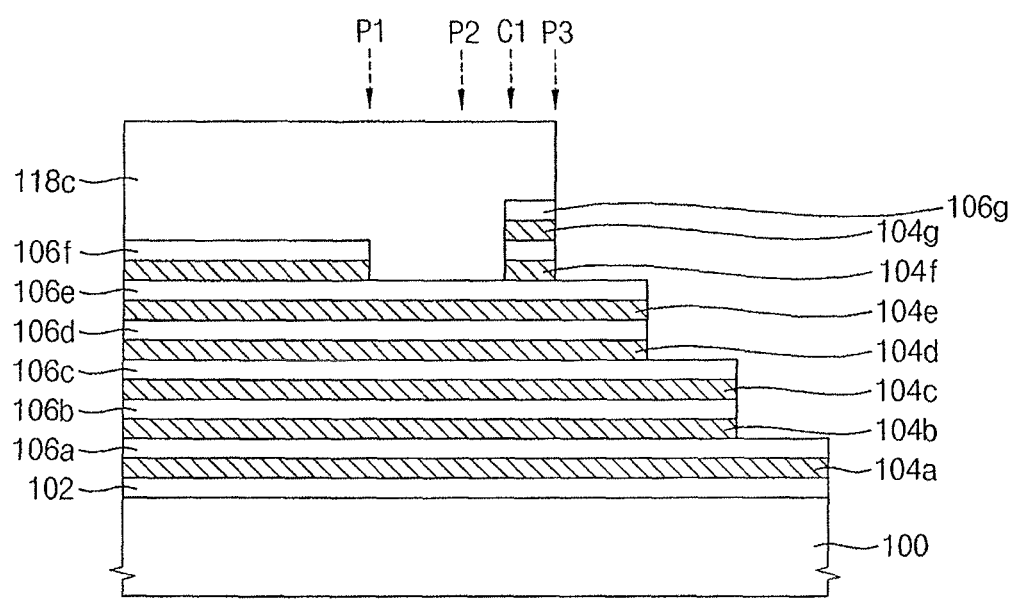

Referring to FIG. 11C, the second to seventh insulation layers 106b, 106c, 106d, 106e, 106f, and 106g and the second to seventh sacrificial layers 104b, 104c, 104d, 104e, 104f, and 104g in the cutting region may be etched to form steps.

Referring to FIGS. 12A, 12B, 12C, and 14, the sixth etching mask 118c may be partially removed by a trimming process to form a seventh etching mask 118d. The seventh etching mask 118d may have a width in the second direction less than a width in the second direction of the sixth etching mask 118c. In example embodiments, an end portion of the seventh etching mask 118d may be at the second position P2, which may be an end portion of the first SSL.

One insulation layer 106 and one sacrificial layer 104 may be etched using the seventh etching mask 118d. FIG. 14 shows a plan view of the sacrificial layers 104 disposed at respective levels when the etching process is performed.

Figure 12A:
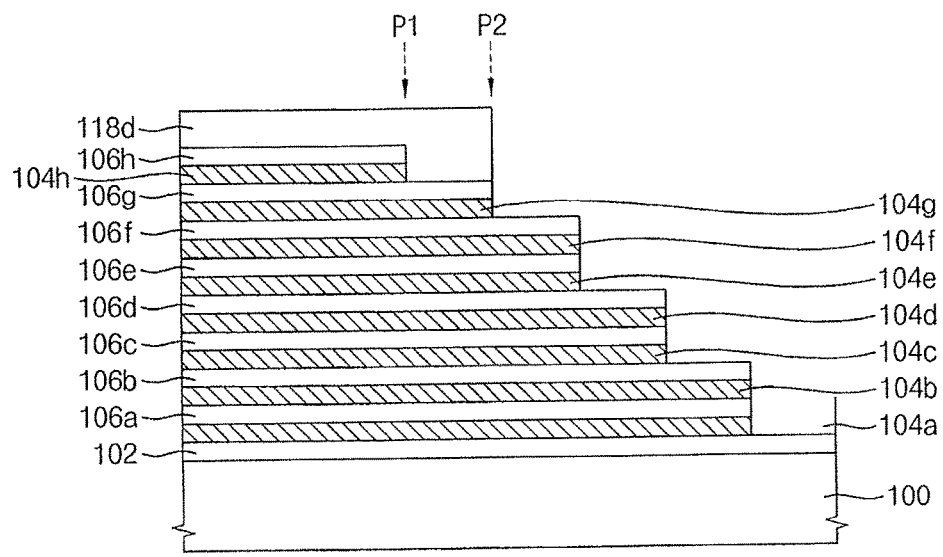
Figure 12B:
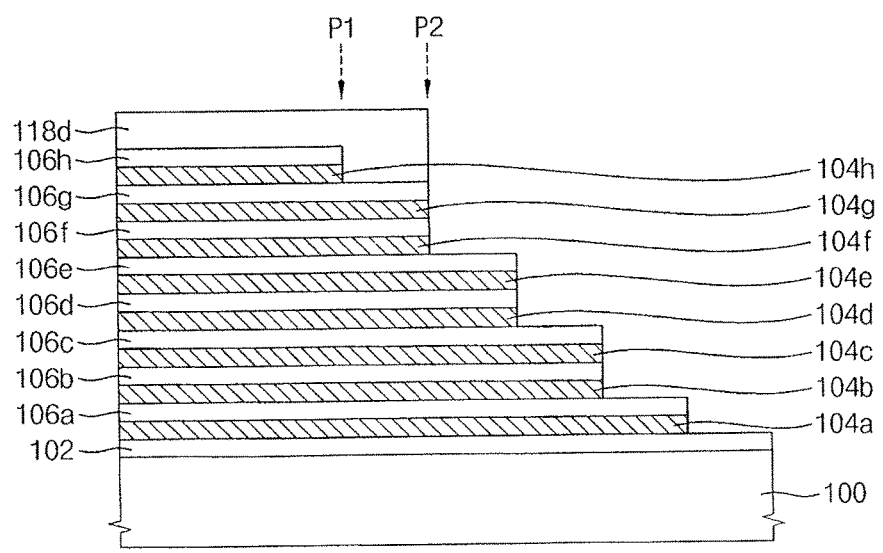

Referring to FIG. 12A, the first, third, fifth, and seventh insulation layers 106a, 106c, 106e, and 106g and the first, third, fifth and seventh sacrificial layers 104a, 104c, 104e, and 104g under the upper step portion 117b may be etched using the seventh etching mask 118d. Referring to FIG. 12B, the second, fourth and sixth insulation layers 106b, 106d and 106f and the second, fourth and sixth sacrificial layers 104b, 104d and 104f under the lower step portion 117a may be etched using the seventh etching mask 118d.

A first step portion may be formed from the lower step portion 117a, and may expose the sacrificial layers 104 disposed at odd-numbered levels. A second upper step portion may be formed over the first step portion. The second upper step portion may be replaced with the first and second SSLs by performing subsequent processes. Each step in the first step portion may include two stacked sacrificial layers 104 and two stacked insulation layers 106, and each step in the second upper step portion may include one sacrificial layer 104 and one insulation layer 106 sequentially stacked.

A second step portion may be formed from the upper step portion 117b, and may expose the sacrificial layers 104 disposed at even-numbered levels. A second upper step portion may be formed over the second step portion. The second upper step portion may be replaced with the first and second SSLs by performing subsequent processes. Each step in the second step portion may include two stacked sacrificial layers 104 and two stacked insulation layers 106, and each step in the second upper step portion may include one sacrificial layer 104 and one insulation layer 106 sequentially stacked.

Figure 12C:
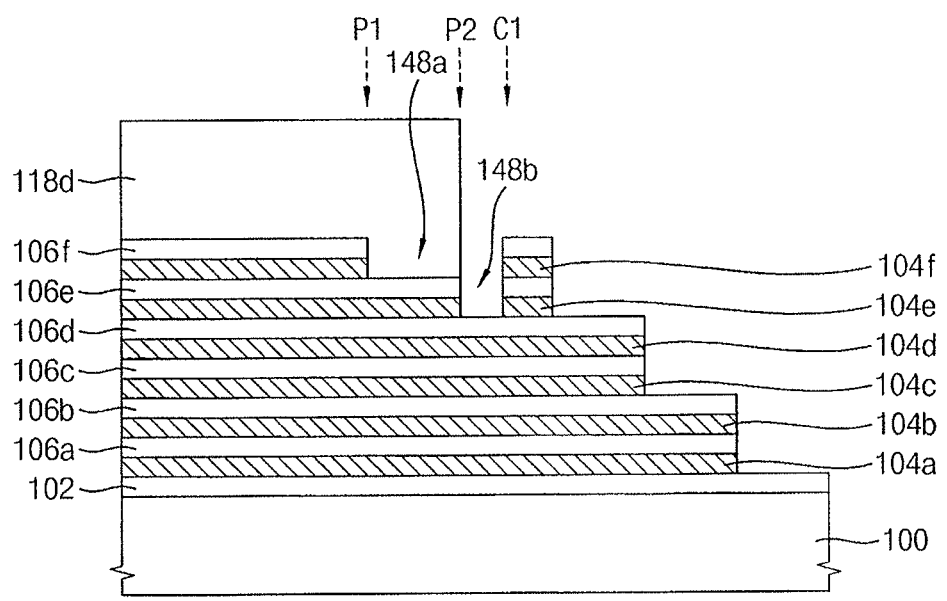

Referring to FIG. 12C, the first, third, fifth, sixth, and seventh insulation layers 106a, 106c, 106e, 106f and 106g and the first, third, fifth, sixth and seventh sacrificial layers 104a, 104c, 104e, 104f, and 104g in the cutting region may be etched using the seventh etching mask 118d to form steps. The seventh etching mask 118d may expose the fifth sacrificial layer 104e partially etched previously (refer to FIG. 7C). Thus, the seventh sacrificial layer 104g in the cutting region may be removed, and portions of the sixth and fifth sacrificial layers 104f and 104e in the cutting region may be partially etched.

In FIG. 12C, the seventh and eighth sacrificial layers 104g and 104h may not remain. The sixth sacrificial layer 104f may include a first recess 148a, and the fifth sacrificial layer 194e may include a first opening 148b. A preliminary step mold structure 107a may be formed by performing the etching process and then removing the seventh etching mask 118d.

Figure 15A:
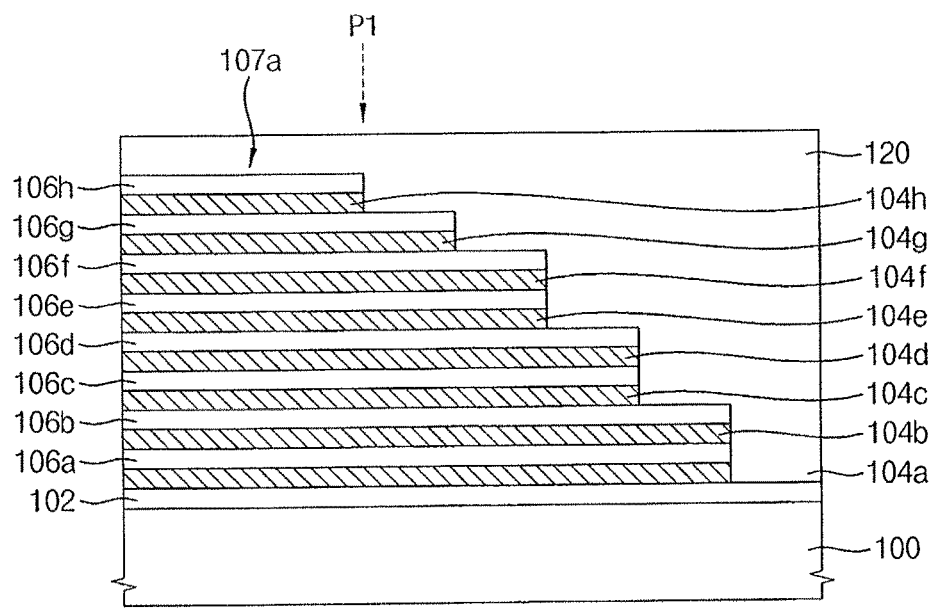
Figure 15B:
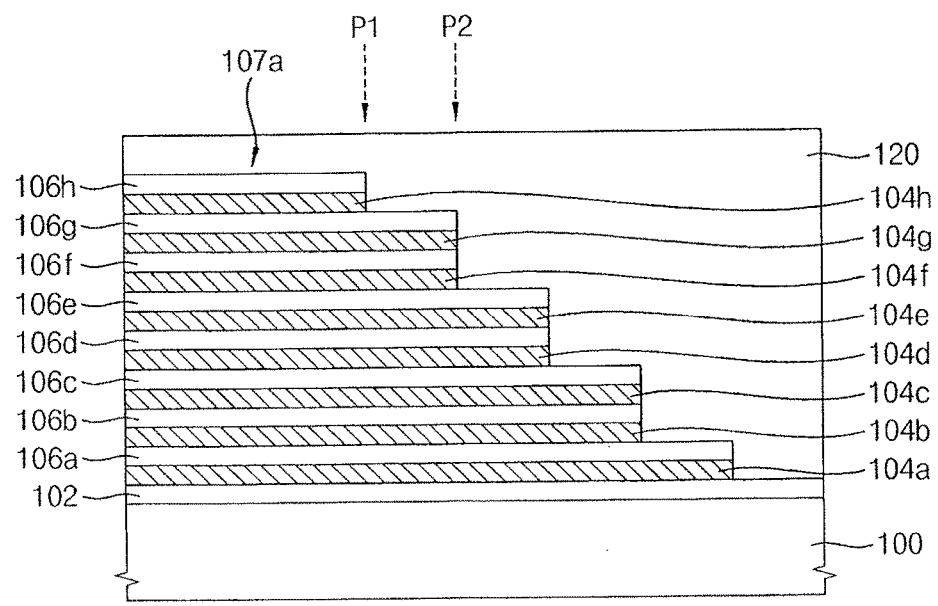
Figure 15C:
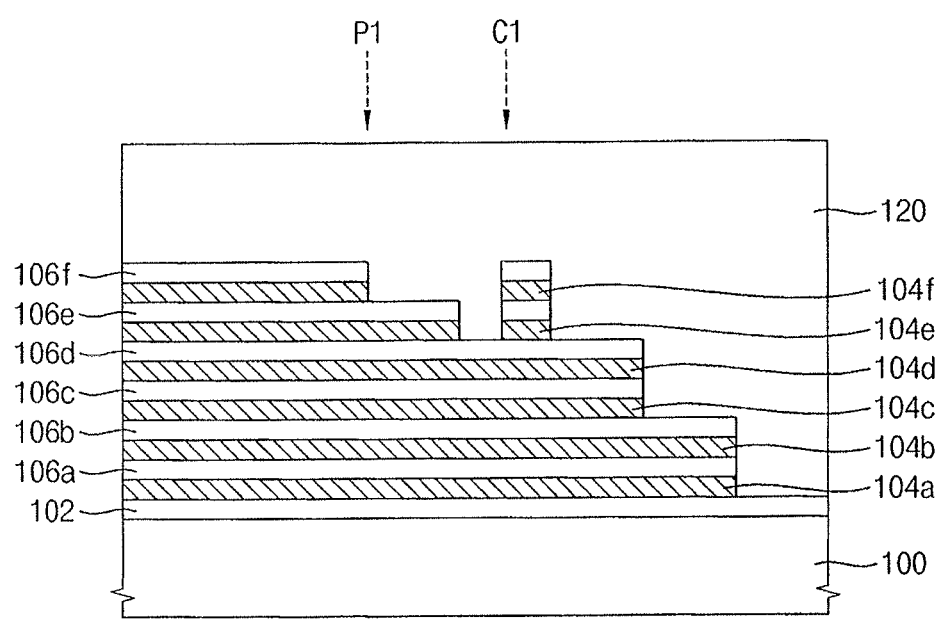
Figure 16A:
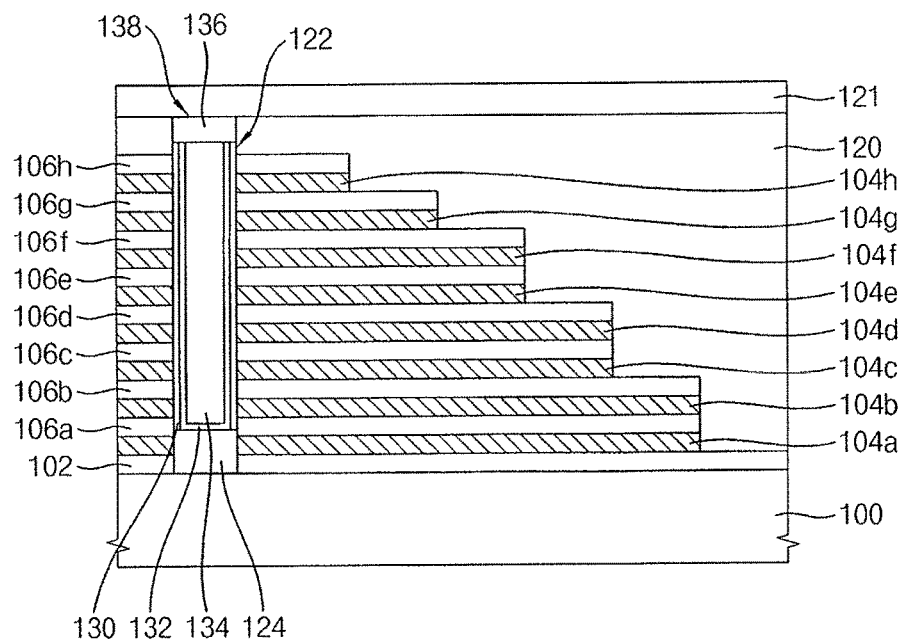
Figure 16B:
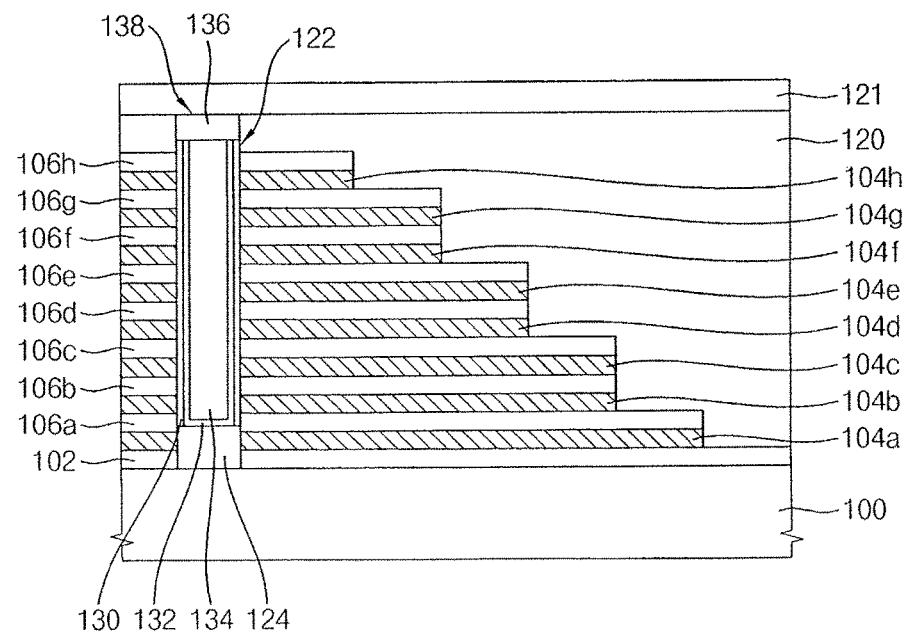
Figure 16C:
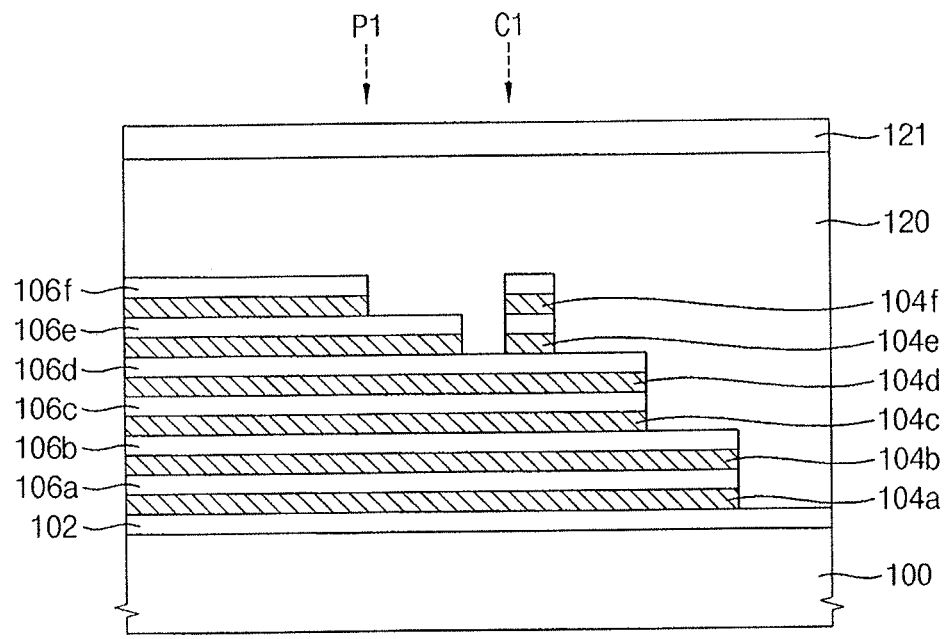

Referring to FIGS. 15A, 15B, and 15C, a first insulating interlayer 120 may be formed on the preliminary step mold structure 107a. In example embodiments, the first insulating interlayer 120 may entirely cover the preliminary step mold structure 107a. In example embodiments, an upper surface of the first insulating interlayer 120 may be planarized by, e.g., a chemical mechanical polishing (CMP) process.

Referring to FIGS. 16A, 16B, 16C, and 16D, a channel hole 122 may be formed through the first insulating interlayer 120 and the preliminary step mold structure 107a in a cell region. A vertical channel structure 138 may be formed in the channel hole 122.

Particularly, a hard mask may be formed on the first insulating interlayer 120. The first insulating interlayer 120 and the preliminary step mold structure 107a may be anisotropically etched using the hard mask as an etching mask to form the channel hole 122. An upper surface of the substrate 100 may be partially exposed by the channel hole 122. The hard mask may be removed after forming the channel hole 122.

The vertical channel structure 138 may be formed to include a channel 132, a charge storage structure 130 including a tunnel insulation layer, a charge storage layer, and a blocking dielectric layer, and a filling insulation pattern 134. In example embodiments, a semiconductor pattern 124 may be formed between the substrate 100 exposed by the channel hole 122 and the vertical channel structure 138.

In example embodiments, the semiconductor pattern 124 may be formed at a lower portion of the channel hole 122. For example, the semiconductor pattern 124 may be formed by a selective epitaxial growth (SEG) process using the top surface of the substrate 100 exposed by the channel hole 122 as a seed. Alternatively, an amorphous silicon layer filling the lower portion of the channel hole 131 may be formed, and a laser epitaxial growth (LEG) process or a solid phase epitaxy (SPE) process may be performed thereon to form the semiconductor pattern 124.

The blocking dielectric layer, the charge storage layer, and the tunnel insulation layer may be sequentially formed on a sidewall of the channel hole 122, and upper surfaces of the semiconductor pattern 124 and the first insulating interlayer 120. The blocking dielectric layer, the charge storage layer and the tunnel insulation layer may be etched to form a charge storage structure 130 including the blocking dielectric layer, the charge storage layer and the tunnel insulation layer.

A channel layer may be formed on the tunnel insulation layer, the semiconductor pattern 125 and the first insulating interlayer 120, and a filling insulation layer may be formed to fill a remaining portion of the channel hole 122. Upper surfaces of the channel layer and the filling insulation layer may be planarized until the upper surface of the first insulating interlayer 120 may be exposed. Thus, the vertical channel structure 138 may be formed on the semiconductor pattern 124.

The blocking dielectric layer, the charge storage layer, and the tunnel insulation layer may be formed by a CVD process, a PE-CVD process and an ALD process.

In example embodiments, the channel layer may be formed of doped polysilicon or amorphous silicon. Alternatively, the channel layer may be formed of polysilicon or amorphous silicon, and then a heat treatment or a laser beam irradiation may be further performed on the channel layer. In this case, the channel layer may be transformed to include single crystalline silicon. The filling insulation layer may be formed of, e.g., silicon oxide or silicon nitride. The channel layer and the filling insulation layer may be formed by a CVD process, a PECVD process, an ALD process, a PVD process, a sputtering process, etc.

In example embodiments, the formation of the filling insulation layer may be omitted, and the channel 132 may have a pillar shape filling the channel hole 122.

A pad pattern 136 covering an upper portion of the channel hole 122 may be formed. In example embodiments, an upper portion of the vertical channel structure 138 may be partially removed by, e.g., an etch-back process to form a recess, and the pad pattern 136 may be formed to fill the recess. The pad pattern 136 may be formed of, e.g., polysilicon. A second insulating interlayer 121 may be formed on the pad pattern 136 and the first insulating interlayer 120.

Referring to FIG. 17, the first and second insulating interlayers 120 and 121, the preliminary step mold structure 107a, and the pad insulation layer 102 may be etched to form the second opening 140 exposing an upper surface of the substrate 100 and extending in the second direction. The preliminary step mold structure 107a may be divided into a plurality of step mold structures by the second opening 140.

Figure 18A:
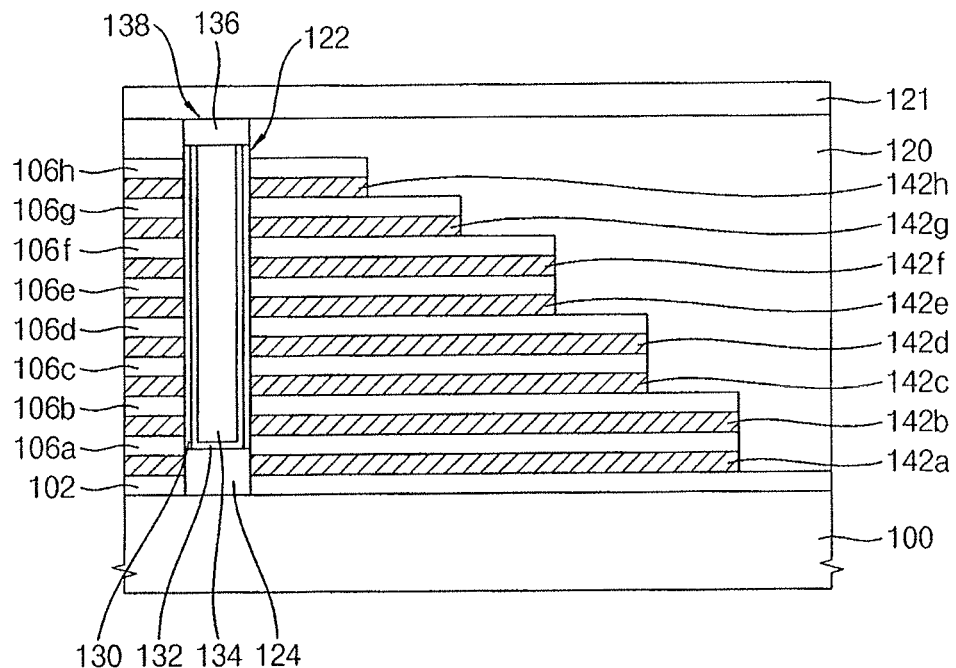
Figure 18B:
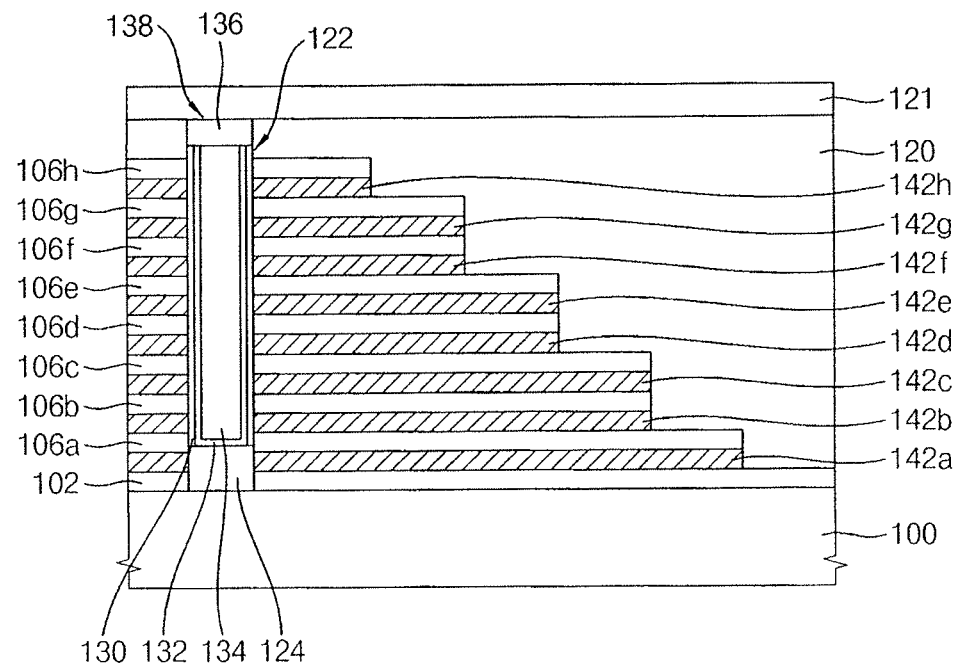
Figure 18C:
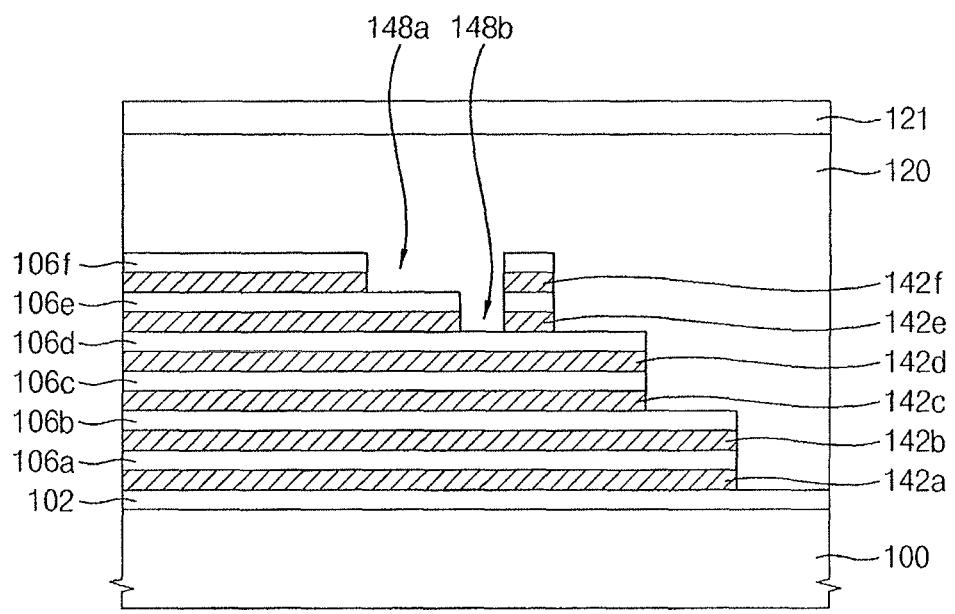

Referring to FIGS. 18A, 18B, and 18C, the sacrificial layers 104 exposed by the second openings 140 may be removed to form gaps. A conductive material may fill the gaps, so that a gate pattern structure 150 may be formed.

In example embodiments, the sacrificial layers 104 may be isotropically etched using an etchant, e.g., phosphoric acid that may have an etching selectivity between silicon nitride and silicon oxide. Thus, the gaps may be formed between neighboring ones of the insulation layers 106 in the first direction. The blocking dielectric layer may be partially exposed by the gaps. In some example embodiments, a sidewall of the semiconductor pattern 124 may be exposed by a lowermost one of the gaps.

A first conductive layer may be formed to fill the gaps and at least partially fill the second openings 140. The first conductive layer may be formed of a metal, e.g., tungsten, aluminum, copper, titanium or tantalum, or a metal nitride including the above-mentioned metal. In example embodiments, the first conductive layer may be formed of tungsten.

In example embodiments, the first conductive layer may be formed to have a multi-layered structure including a barrier layer and a metal layer. The barrier layer may include, e.g., a metal nitride. The first conductive layer may be formed by a CVD process, a PECVD process, an ALD process, a PVD process, a sputtering process, etc.

In example embodiments, before forming the first conductive layer, an additional blocking layer including, e.g., a metal oxide, may be formed on inner walls of the gaps. The first conductive layer on an inner surface of the second opening 140 and an upper surface of the substrate 100 may be isotropically etched to form a gate pattern 142 in each gap.

A plurality of gate patterns 142a, 142b, 142c, 142d, 142e, 142f, 142g, and 142h may be formed to serve as a GSL, word lines, a first dummy word line, a second dummy word line, a first SSL, and a second SSL, respectively. The GSL, the word lines, the first and second dummy word lines and the first and second SSLs may be spaced apart from each other in the first direction on the substrate 100. For example, a lowermost one 142a of the gate patterns 142 may serve as the GSL. Upper two 142g and 142h of the gate patterns 142 may serve as the first and second SSLs, respectively. Two 142e and 142f of the gate patterns 142 under the first SSL may serve as the first and second dummy word lines, respectively. Intermediate ones 142b, 142c and 142d of the gate patterns 142 between the GSL and the first dummy word line may serve as the word lines. The gate pattern structure 150 may be substantially the same as or similar to the gate pattern structure illustrated with reference to FIG. 1.

Figure 19A:
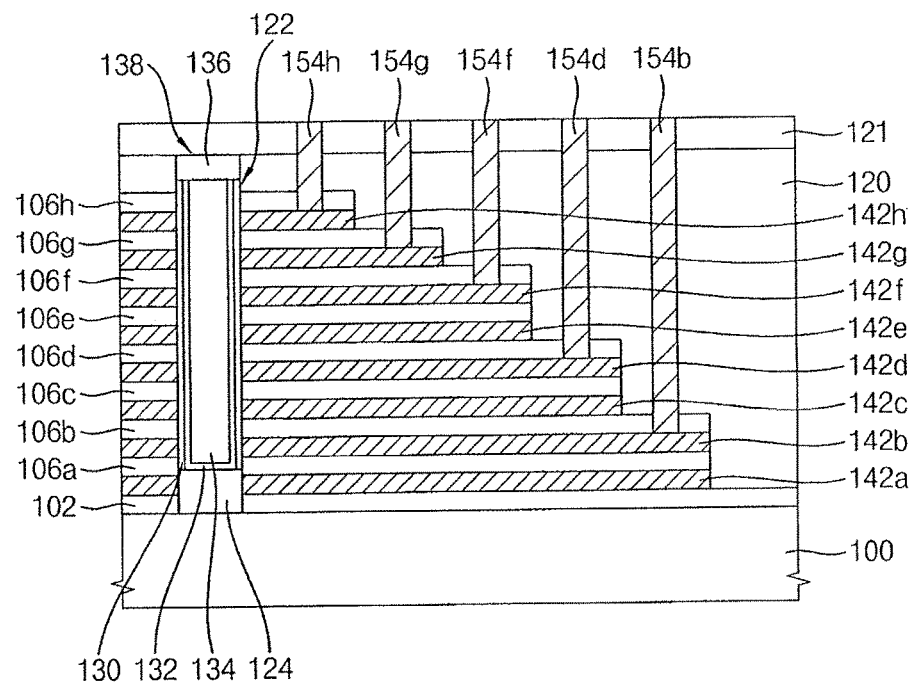
Figure 19B:
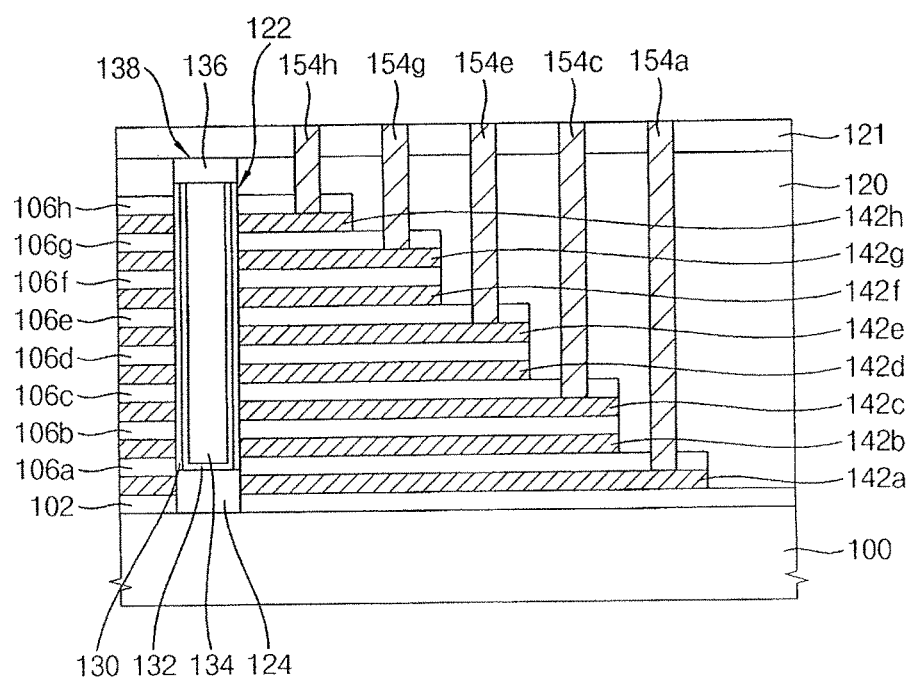
Figure 19C:
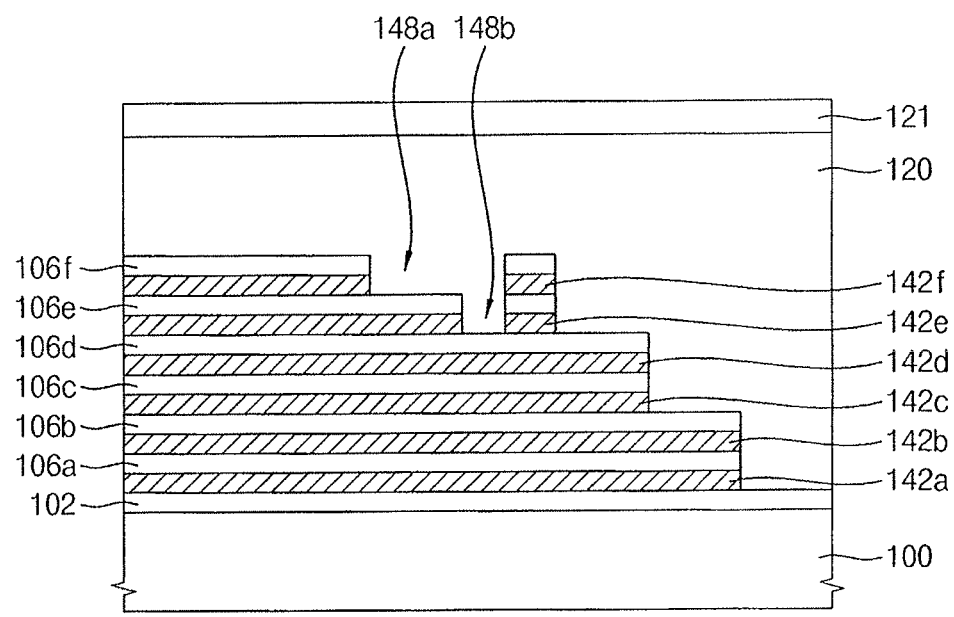

Referring to FIGS. 19A, 19B, and 19C, an impurity region may be formed at an upper portion of the substrate 100 exposed by the second opening 140. An insulation pattern may be formed on the impurity region to fill the second opening 140.

The impurity region may extend in the second direction, and may serve as a common source line (CSL) of the vertical memory device. The insulation pattern may be formed of, e.g., silicon oxide. In example embodiments, the insulation pattern may be formed on the sidewall of the second opening 140, and a conductive material may be formed to fill the second opening 140 to form the CSL contacting the impurity region.

A plurality of contact plugs 154a, 154b, 154c, 154d, 154e, 154f, 154g, and 154h contacting the gate patterns 142 may be formed through the first and second insulating interlayers 120 and 121. The contact plugs 154a, 154b, 154c, 154d, 154e, 154f, 154g, and 154h may contact edge upper surfaces of the gate patterns 142 at respective levels.

Particularly, an etching mask may be formed on the second insulating interlayer 121. The first and second insulating interlayers 120 and 121 may be etched using the etching mask to form a contact hole exposing the edge upper surfaces of the gate patterns 142 at the respective levels. A conductive layer may be formed to fill the contact hole, and an upper surface of the conductive layer may be planarized until an upper surface of the second insulating interlayer 121 may be exposed.

Thus, referring to FIG. 19A, a second contact plug 154b, a fourth contact plug 154d, a sixth contact plug 154f, a seventh contact plug 154g, and an eighth contact plug 154h may be formed on the first and third word lines, the second dummy word line and the first and second SSLs, respectively. Referring to FIG. 19B, a first contact plug 154a, a third contact plug 154c, and a fifth contact plug 154e may be formed on the GSL 142a, the second word line 142c, and the first dummy word line 142e, respectively, exposed by the dents in the lines above them In example embodiments, in a plan view, the contact plugs 154a, 154b, 154c, 154d, 154e, 154f, 154g, and 154h may be arranged in the second direction or the third direction. In some example embodiments, in a plan view, the contact plugs 154a, 154b, 154c, 154d, 154e, 154f, 154g, and 154h may be arranged in a diagonal direction with respect to the second direction. In some example embodiments, in a plan view, the contact plugs 154a, 154b, 154c, 154d, 154e, 154f, 154g, and 154h may be arranged in a zig-zag fashion.

Alternatively, in a plan view, each of the contact plugs 154a, 154b, 154c, 154d, 154e, 154f, 154g, and 154h may be on a central portion of each of the edge upper surfaces of the gate patterns 142 at the respective levels.

A bit line structure electrically connected to the pad pattern 136 may be formed on the second insulating interlayer 121.

Figure 20:
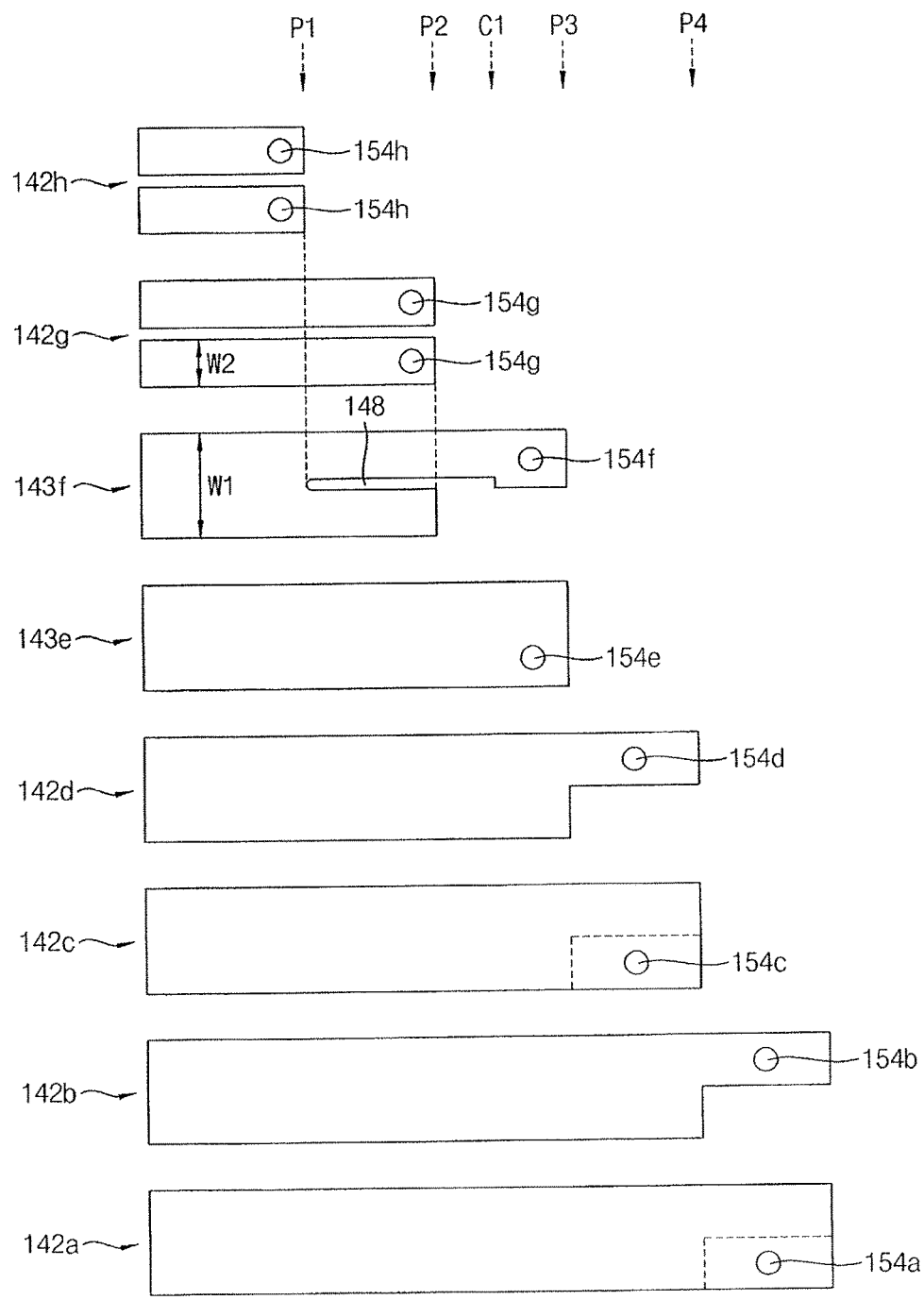
FIGS. 20 and 21 illustrate a plan view and a cross-sectional view, respectively, of a vertical memory device in accordance with example embodiments.
Figure 21:
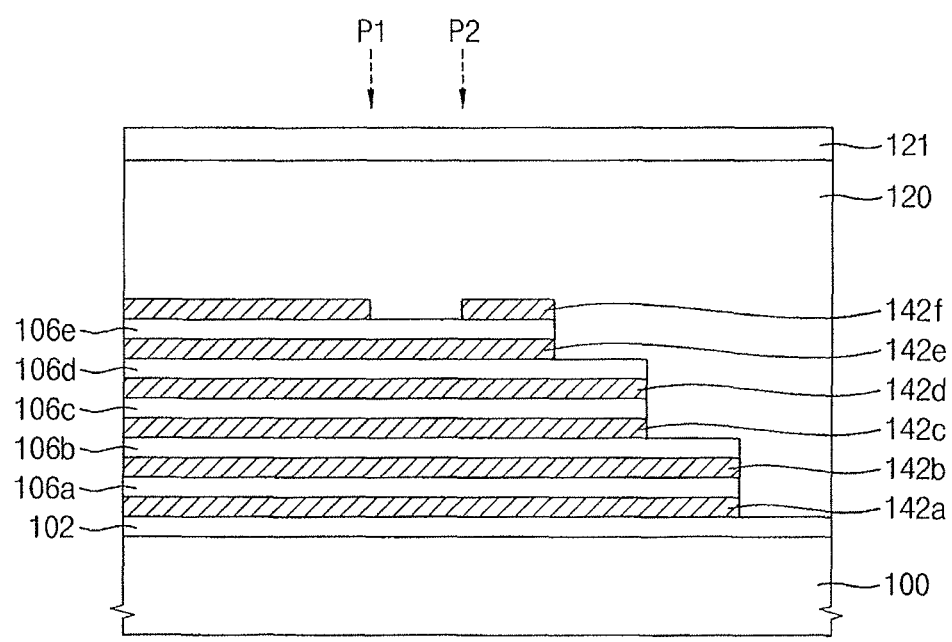

FIGS. 20 and 21 are a plan view and a cross-sectional view illustrating a vertical memory device in accordance with example embodiments. The vertical memory device of FIGS. 20 and 21 may have elements and/or structures substantially the same as or similar to those illustrated in FIGS. 1, 2, 3A, 3B and 3C, except for the shapes of the dummy gate patterns. Thus, cross-sectional views taken along a lower step portion and an upper step portion in the second direction are substantially the same as FIGS. 3A and 3B, respectively. FIG. 21 is a cross-sectional view taken along a SSL cut hole in the second direction.

Referring to FIGS. 20 and 21, the vertical channel device may include the vertical channel structure 138 (refer to FIGS. 3A and 3B) extending in the first direction from the surface of the substrate 100, and a plurality of gate patterns surrounding the vertical channel structure 138 and being spaced apart from each other in the first direction, as those illustrated with reference to FIGS. 1, 2, 3A, 3B and 3C.

For convenience of description, FIGS. 20 and 21 show that the gate pattern 142a serves as a GSL, the gate pattern 142b serves as a first word line, the gate pattern 142c serves as a second word line, the gate pattern 142d serves as a third word line, the gate pattern 143e serves as a first dummy word line, the gate pattern 143f serves as a second dummy word line, the gate pattern 142g serves as a first SSL, and the gate pattern 142h serves as a second SSL.

In example embodiments, the second SSL 142h may extend in the second direction to the first position P1. In example embodiments, two second SSLs 142h may be spaced apart from each other in the third direction. A space between the two second SSLs 142h may serve as the SSL cut hole 146.

The first SSL 142g may be formed under the second SSL 142h, and may extend in the second direction. The first SSL 142g may be longer than the second SSL 142h in the second direction. For example, the first SSL 142g may extend in the second direction to the second position P2. In example embodiments, two first SSLs 142g may be spaced apart from each other in the third direction. A space between the two first SSLs 142g may also serve as the SSL cut hole 146. In example embodiments, the SSL cut hole 146 may extend to the second position P2.

The second dummy word line 143f may be formed under the first SSL 142g, and may be longer than the first SSL 142g in the second direction. For example, the second dummy word line 143f may extend in the second direction to the third position P3.

An edge portion of the second dummy word line 143f in the second direction may include the dent 149. An edge portion of the first dummy word line 143e in the second direction may be exposed by the dent 149 of the second dummy word line 143f overlying the first dummy word line 142e. A portion of the second dummy word line 143f having no dent may have a length in the second direction greater than a length in the second direction of a portion of the second dummy word line 143f having the dent 149.

Also, the second dummy word line 143f may include a second recess 148 at a central portion of the second dummy word line 143f, and the second recess 148 may extend in the second direction toward the edge portion of the second dummy word line 143f.

In example embodiments, a first end of the second recess 148 in the second direction may be aligned with the first position P1, and a second end of the second recess 148 in the second direction may be aligned with the second position P2.

The second dummy word line 143f may have a shape different from a shape of each of the first and second SSLs 142h and 142g. Also, the second dummy word line 143f may have a shape different from shapes of the word lines 142b, 142c and 142d under the second dummy word line 143f. That is, the second dummy word line 143f may not be completely cut along in the second direction, and thus may not be divided into two separate pieces as each of the first and second SSLs 142h and 142g. An end portion of the second dummy word line 143f at which neither the second recess 148 nor the dent 149 is formed may have the first width W1 in the third direction.

The first dummy word line 143e may be formed under the second dummy word line 143f, and may extend in the second direction. For example, the first dummy word line 143e may extend to the third position P3.

The first dummy word line 143e may have no opening. That is, the first dummy word line 143e may have a shape different from a shape of the second dummy word line 143f.

The first dummy word line 143e may have no dent, and an edge portion of the first dummy word line 143e may be exposed by the dent 149 of the second dummy word line 143f overlying the first dummy word line 143e.

In example embodiments, as shown in FIG. 3A, the second contact plug 154b, the fourth contact plug 154d, the sixth contact plug 154f and the eighth contact plug 154h may be formed on the edge portions of the first word line 142b, the third word line 142d, the second dummy word line 143f and the second SSL 142h, respectively. Also, as shown in FIG. 3B, the first contact plug 154a, the third contact plug 154c and the fifth contact plug 154e may be formed on the edge portions of the GSL 142a, the second word line 142c, and the first dummy word line 143e, respectively. Additionally, the seventh contact plug 154g may be formed on an edge portion of the SSL 142g.

As described above, in example embodiments, the second dummy word line 143f may not be divided into two separate pieces. Thus, electrical signals, which are applied to the second dummy word line 143f via the sixth contact plug 154f, may be normally transferred.

The method of manufacturing the vertical memory device may include processes substantially the same as or similar to those illustrated with reference to FIGS. 4 to 19C. However, when the first etching mask for forming the cut hole is formed, a hole included in the first etching mask may extend in the second position P2 corresponding to an end of the first SSL. Thus, an opening may not be formed at the first dummy word line 143e. By controlling the position of the end of the cut hole, the first and second dummy word lines 143e and 143f shown in FIGS. 20 and 21 may be formed.

Figure 22:
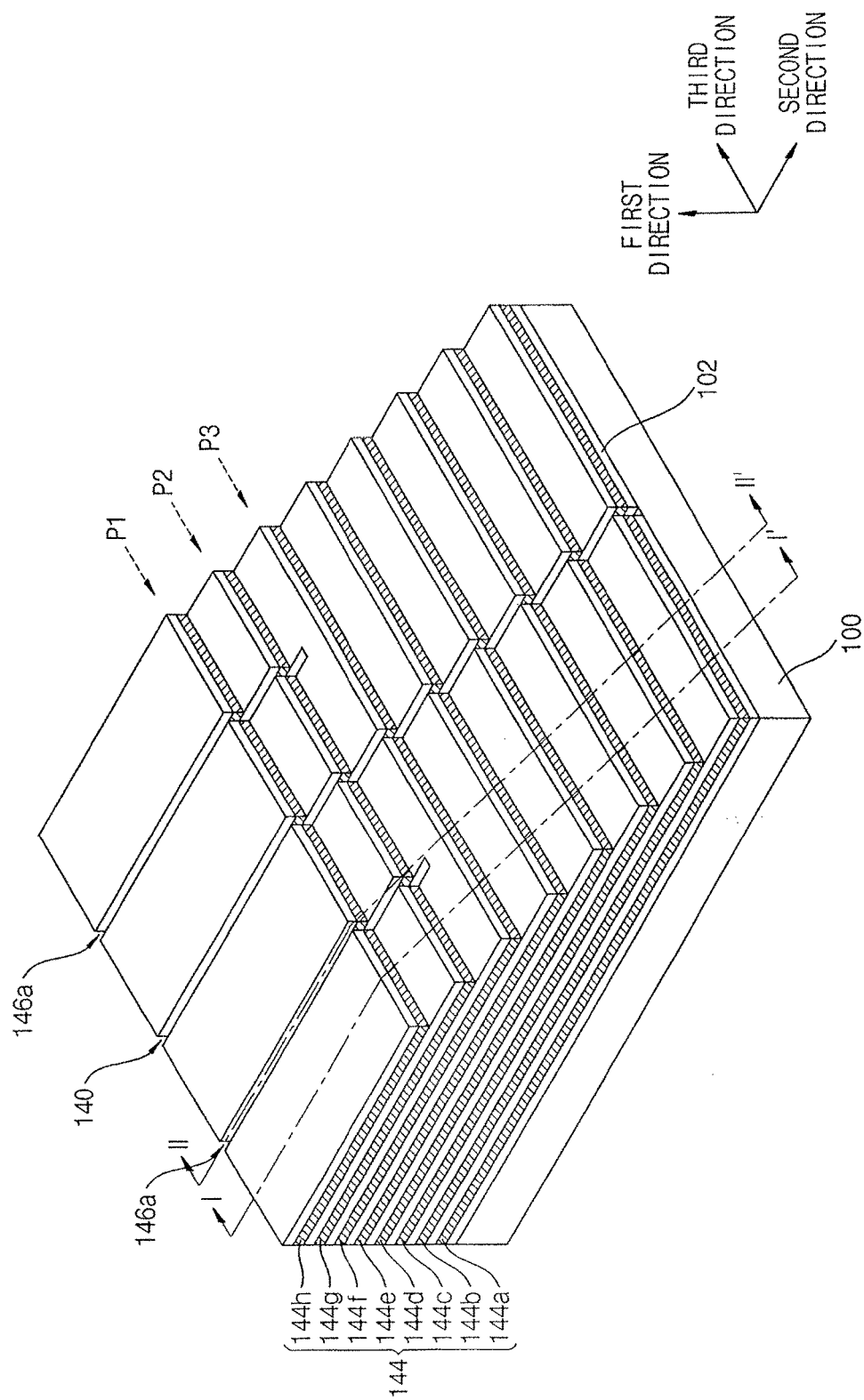
FIGS. 22 and 23 illustrate a perspective view and a cross-sectional view, respectively, of a vertical memory device in accordance with example embodiments.
Figure 23:
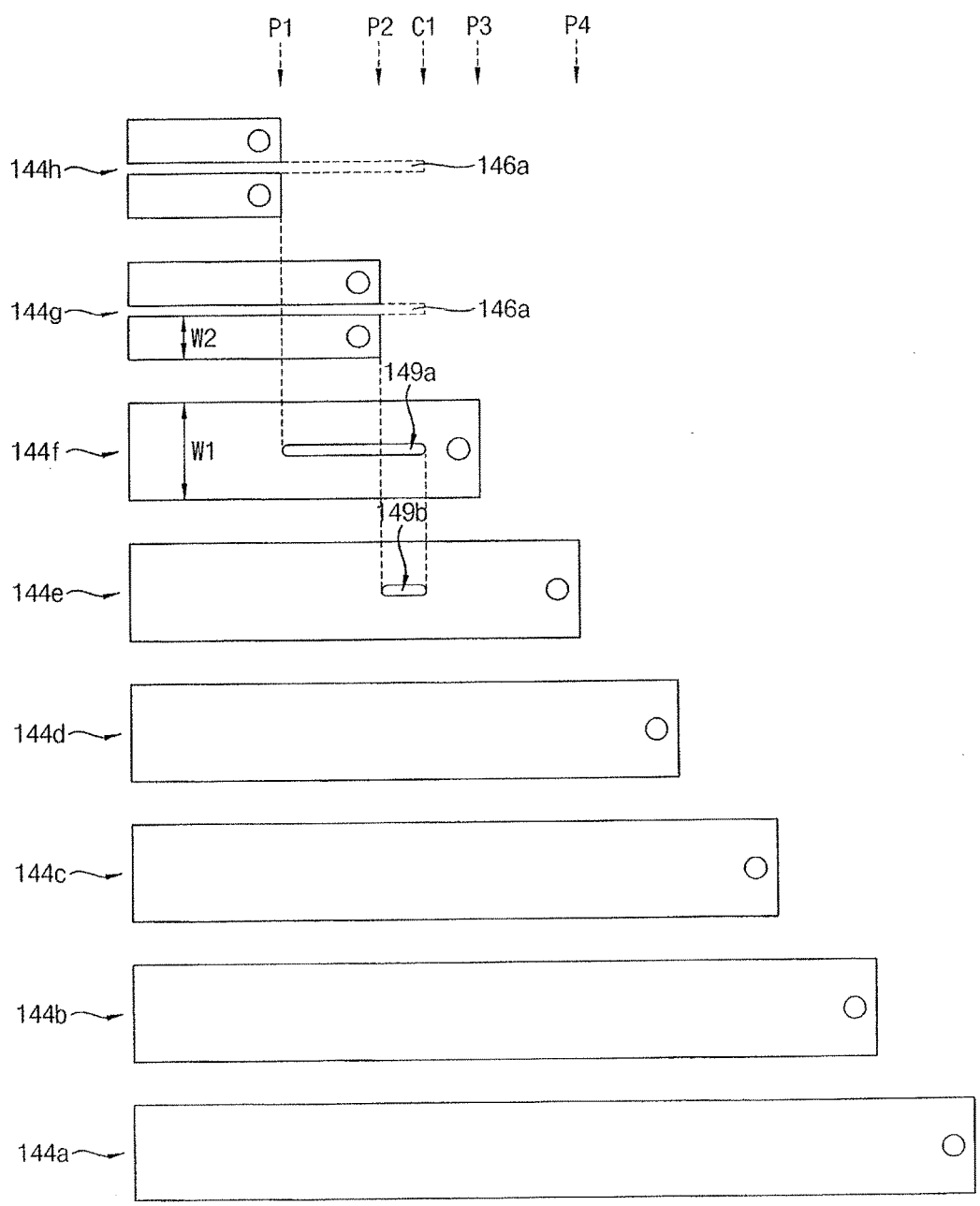
Figure 24A:
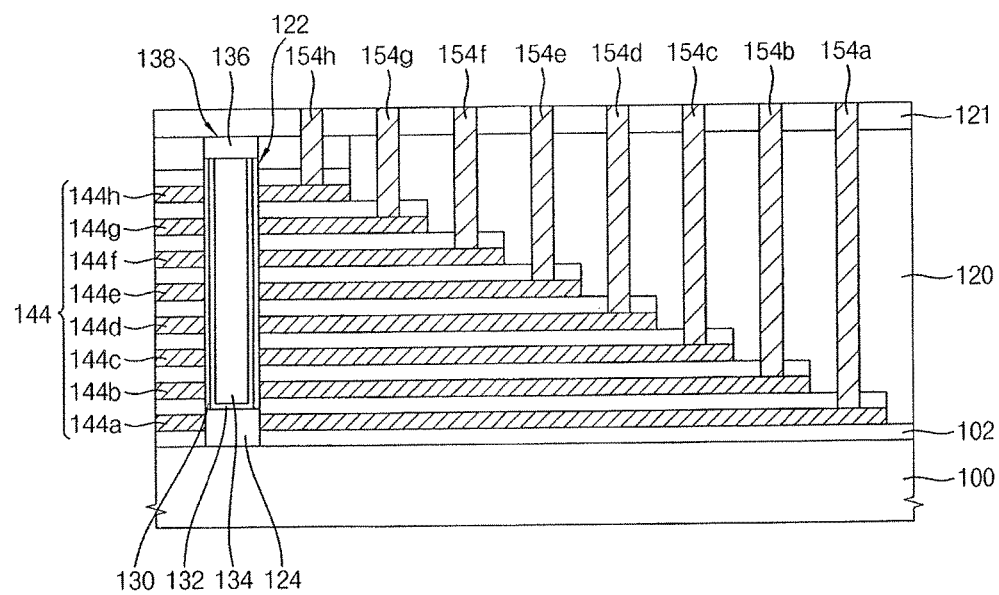
FIGS. 24A and 24B illustrate cross-sectional views of a vertical memory device in accordance with example embodiments.
Figure 24B:
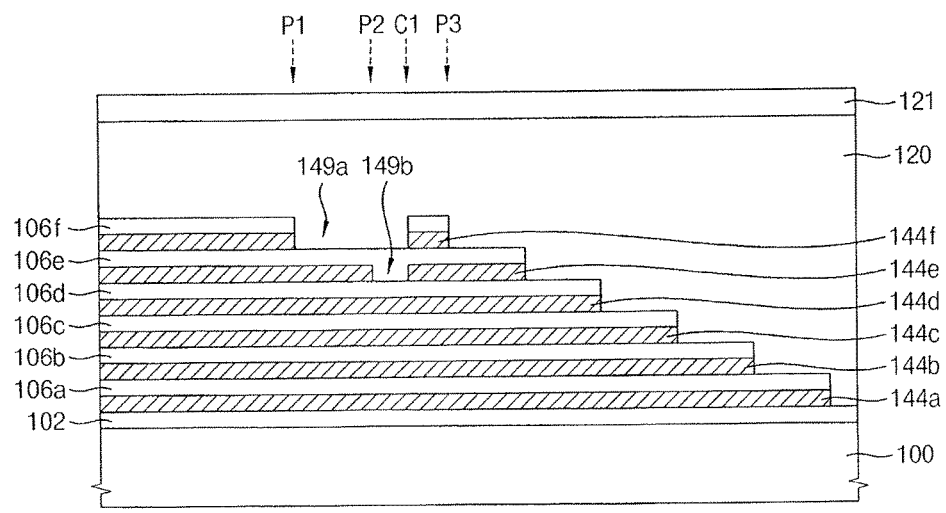

FIGS. 22 and 23 are a perspective view and a plan view illustrating a vertical memory device in accordance with example embodiments. FIGS. 24A and 24B are cross-sectional views illustrating the vertical memory device in accordance with example embodiments.

Particularly, FIG. 22 is a perspective view illustrating portions of the vertical memory device. FIG. 23 is a plan view illustrating a plurality of gate patterns in the vertical memory device. FIGS. 24A and 24B are cross-sectional views taken along lines I-I' and II-II', respectively, indicated in FIG. 22.

The vertical memory device of FIGS. 22, 23, 24A and 24B may have elements and/or structures substantially the same as or similar to those illustrated in FIGS. 1, 2, 3A, 3B and 3C, except for the shape of the gate patterns. Thus, like reference numerals are used to designate like elements, and detailed descriptions thereon are omitted herein.

Referring to FIGS. 22, 23, 24A, and 24B, the vertical channel device may include the vertical channel structure 138 extending in the first direction from a surface of the substrate 100, and a plurality of gate patterns surrounding the vertical channel structure and being spaced apart from each other in the first direction, as those illustrated with reference to FIGS. 1, 2, 3A, 3B, and 3C.

For convenience of description, FIGS. 22, 23, 24A, and 24B show that the gate pattern 144a serves as a GSL, the gate pattern 144b serves as a first word line, the gate pattern 144c serves as a second word line, the gate pattern 144d serves as a third word line, the gate pattern 144e serves as a first dummy word line, the gate pattern 144f serves as a second dummy word line, the gate pattern 144g serves as a first SSL, and the gate pattern 144h serves as a second SSL.

In example embodiments, the second SSL 144h may extend in the second direction to the first position P1. In example embodiments, two second SSLs 144h may be spaced apart from each other in the third direction. A space between the two second SSLs 144h may serve as an SSL cut hole 146a.

The first SSL 144g may be formed under the second SSL 144h, and may be longer than the second SSL 144h in the second direction. For example, the first SSL 144g may extend in the second direction to the second position P2. In example embodiments, two first SSLs 144g may be spaced apart from each other in the third direction. A space between the two first SSLs 144g may also serve as the SSL cut hole 146a. In example embodiments, the SSL cut hole 146a may extend to the cutting position C1 between the second position P2 and a third position P3.

The second dummy word line 144f may be formed under the first SSL 144g, and may be longer than the first SSL 144g in the second direction. For example, the second dummy word line 144f may extend in the second direction to the third position P3.

An edge portion of the second dummy word line 144f in the second direction may include a third opening 149a at a central portion thereof, and the third opening 149a may extend in the second direction. In example embodiments, a first end of the third opening 149a in the second direction may be aligned with the first position P1, and a second end of the third opening 149a in the second direction may be aligned with the cutting position C1. The second end of the third opening 149a may be aligned with an end portion of the SSL cut hole 146a.

The second dummy word line 144f may have a shape different from a shape of each of the first and second SSLs 144h and 144g. That is, the second dummy word line 144f may not be completely cut along in the second direction, and thus may not be divided into two separate pieces as each of the first and second SSLs 144h and 144g. The second dummy word line 144f at which the third opening 149a is not formed may have the first width W1 in the third direction. Also, the second dummy word line 144f may have a shape different from shapes of the word lines 144b, 144c and 144d under the second dummy word line 144f. That is, the word lines under the second dummy word line 144f may not include a third opening 149a.

The first dummy word line 144e may be formed under the second dummy word line 144f, and may be longer than the second dummy word line in the second direction. For example, the first dummy word line 144e may extend to the fourth position P4. Thus, end portions in the second direction of the first and second dummy word lines 144e and 144f may have a staircase shape.

The first dummy word line 144e may include a fourth opening 149b at a central portion thereof, and the fourth opening 149b may extend in the second direction. In example embodiments, a first end of the fourth opening 149b in the second direction may be aligned with the second position P2, and a second end of the fourth opening 149b in the second direction may be aligned with the cutting position C1. The second end of the fourth opening 149b may be aligned with an end portion of the SSL cut hole 146a.

That is, each of the first and second dummy word lines 144e and 144f may have no dent. The lengths in the second direction of the first and second dummy word lines 144e and 144f may be different from each other, so that an edge portion of the first dummy word line 144e may be exposed by the overlying second dummy word line 144f.

The third word line 144d, the second word line 144c, the first word line 144b, and the GSL 144a may be formed under the first dummy word line 144e. Edge portions of the GSL 144a, the first word line 144b, the second word line 144c and the third word line 144d may have a staircase shape.

Each of the GSL 144a, the first word line 144b, the second word line 144c, and the third word line 144d may have no dent. The lengths in the second direction of the GSL 144a, the first word line 144b, the second word line 144c, and the third word line 144d may be different from each other, so that edge portions of the GSL 144a, the first word line 144b, and the second word line 144c may be exposed by corresponding overlying one. The third word line 144d may be exposed by the overlying first dummy word line 144e.

In example embodiments, the first contact plug 154a, the second contact plug 154b, the third contact plug 154c, the fourth contact plug 154d, the fifth contact plug 154e, the sixth contact plug 154f, the seventh contact plug 154g and the eighth contact plug 154h may be formed on the edge portions of the GSL 144a, the first word line 144b, the second word line 144c, the third word line 144d, the first dummy word line 144e, the second dummy word line 144f, the first SSL 144g, and the second SSL 144h, respectively.

As described above, in example embodiments, the second dummy word line 144f may not be divided into two separate pieces. Thus, electrical signals, which are applied to the second dummy word line 144f via the sixth contact plug 154f, may be normally transferred.

FIGS. 25A to 30B are cross-sectional views and a plan view illustrating stages of a method of manufacturing a vertical memory device in accordance with example embodiments. Particularly, FIGS. 25A, 26A, 27A, 28A, 29A and 30A are cross-sectional views taken along a line I-I' of FIG. 22, and FIGS. 25B, 26B, 27B, 28B, 29B and 30B are cross-sectional views taken along a line II-II' of FIG. 22. FIG. 28C is a plan view illustrating a plurality of gate patterns in the vertical memory device.

First, processes substantially the same as or similar to those illustrated with reference to FIG. 4 may be performed to form the mold structure 107. The mold structure 107 may include the sacrificial layers 104 and the insulation layers 106 alternately stacked on the pad insulation layer 102.

Figure 25A:
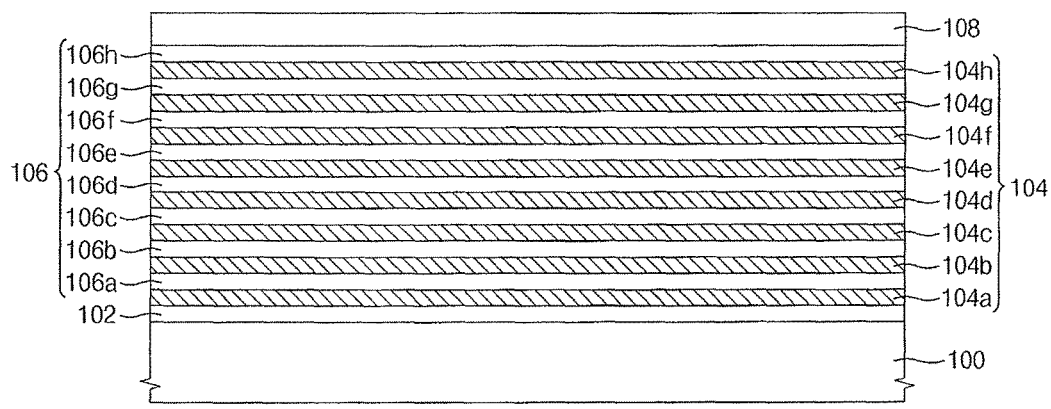
FIGS. 25A to 27B, 28A to 28C, and 29A to 30B illustrate cross-sectional views and a plan view of stages of a method of manufacturing a vertical memory device in accordance with example embodiments.
Figure 25B:
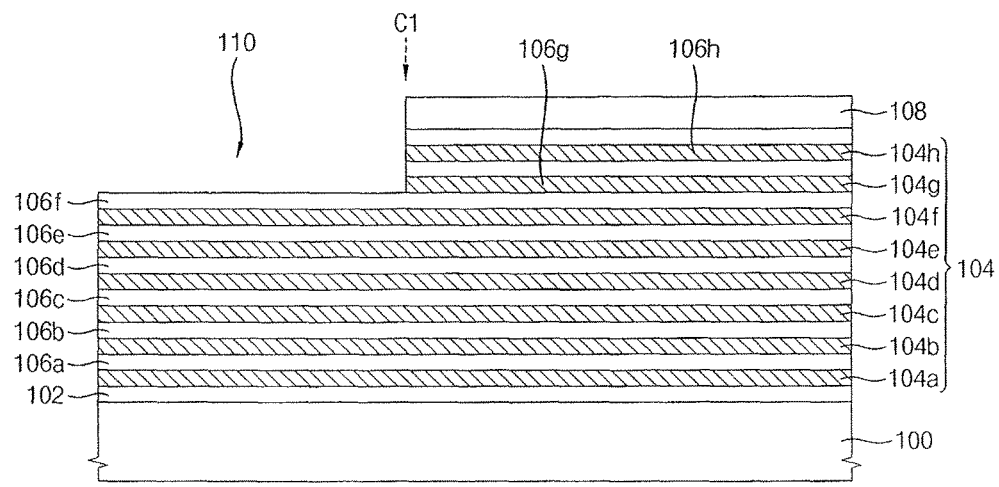

Referring to FIGS. 25A and 25B, the first etching mask 108 for forming the cut hole 110 may be formed on the mold structure 107. The first etching mask 108 may include a photoresist pattern.

The first etching mask 108 may have a hole extending in the second direction. The hole may extend to the cutting position C1 that may be disposed between the second position P2 corresponding to an end of a first SSL and the third position P3 corresponding to an end of a second dummy word line.

The eighth insulation layer 106h, the eighth sacrificial layer 104h, the seventh insulation layer 106g and the seventh sacrificial layer 104g may be sequentially etched using the first etching mask 108 to form the cut hole 110. When the semiconductor device includes the first and second SSLs, upper two 104h and 104g of the sacrificial layers 104 and upper two 106h and 106g of the insulation layers 106 may be etched to form the cut hole 110.

In example embodiments, the sacrificial layer 104 and the insulation layer 106 may have a high etching selectivity with respect to each other, so that the etching process may be performed until the seventh sacrificial layer 104g may be exactly etched to form the cut hole 110. Thus, a bottom of the cut hole 110 may expose a top surface of the sixth insulation layer 106f.

The cut hole 110 may correspond to a space between two first SSLs or a space between two second SSLs over a second dummy word line. By forming the cut hole 110, the space between the two first SSLs and the space between the two second SSLs may be exactly defined. Then, the first etching mask 108 may be removed.

Figure 26A:
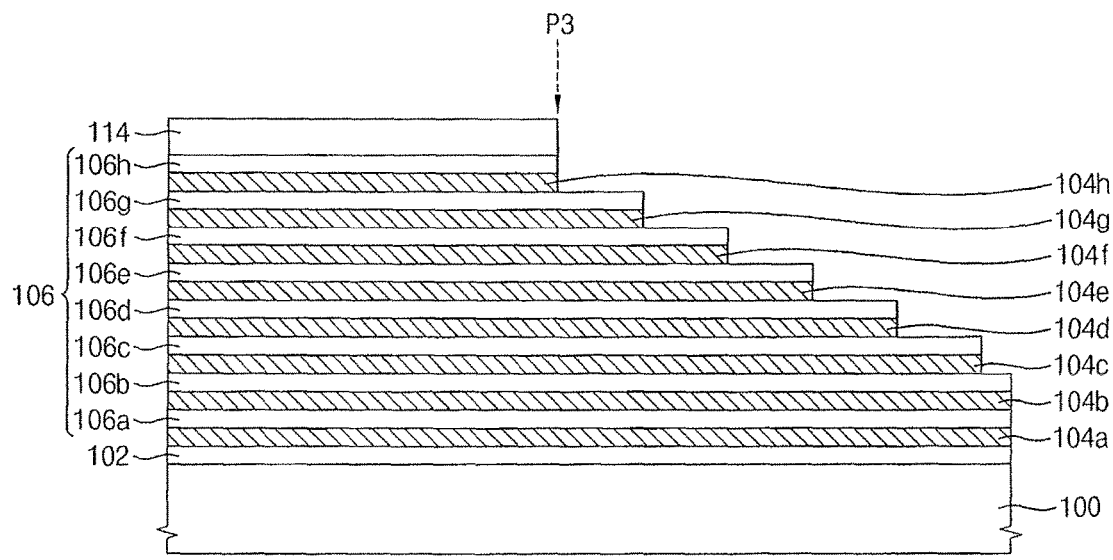
Figure 26B:
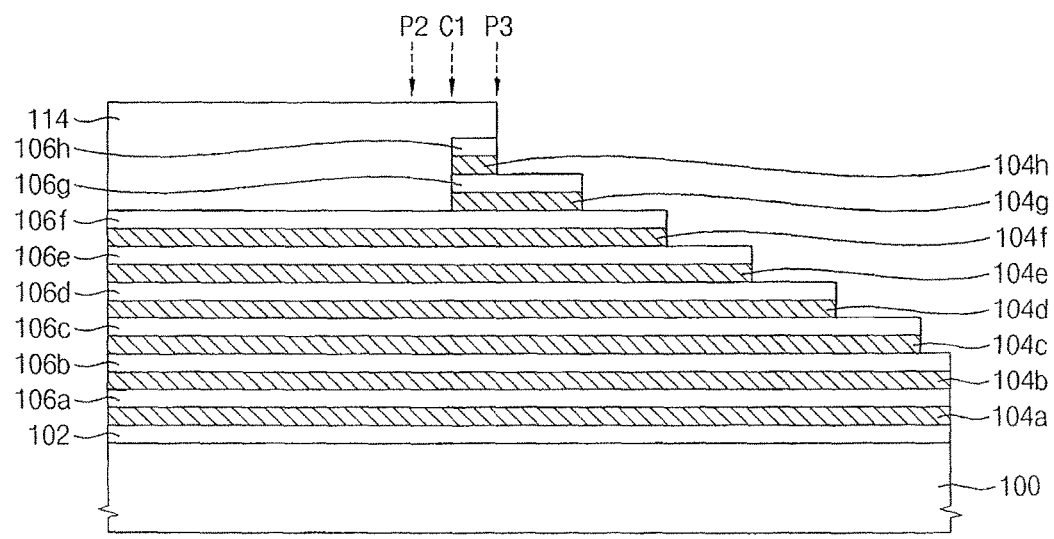

Referring to FIGS. 26A and 26B, the second etching mask for forming steps of the mold structure 107 may be formed on the mold structure 107. The second etching mask may include a photoresist pattern. An exposed uppermost one of the insulation layers 106 and an exposed uppermost one of the sacrificial layers 104 may be etched using the second etching mask.

The second etching mask may be partially removed by a trimming process to form the third etching mask. The third etching mask may have a width in the second direction less than a width in the second direction of the second etching mask. An exposed uppermost one of the insulation layers 106 and an exposed uppermost one of the sacrificial layers 104 may be etched using the third etching mask.

When the trimming process for the etching mask and the etching process for the exposed uppermost one of the insulation layers 106 and the exposed uppermost one of the sacrificial layers 104 are performed, a staircase including one step may be formed. The trimming process for the etching mask and the etching process for the exposed uppermost one of the insulation layers 106 and the exposed uppermost one of the sacrificial layers 104 are alternately and repeatedly performed, so that an end portion in the second direction of the mold structure 107 may have a staircase shape.

As shown in FIGS. 26A and 26B, each of the trimming process and the etching process may be performed six times, so that 6 steps may be formed. Also, an eighth etching mask 114 may be formed by the above processes.

Figure 27A:
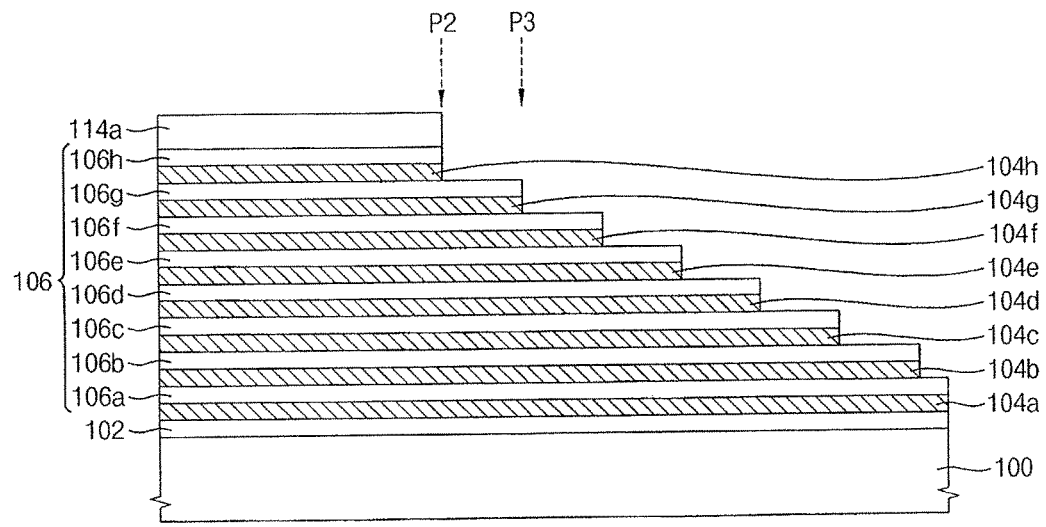
Figure 27B:
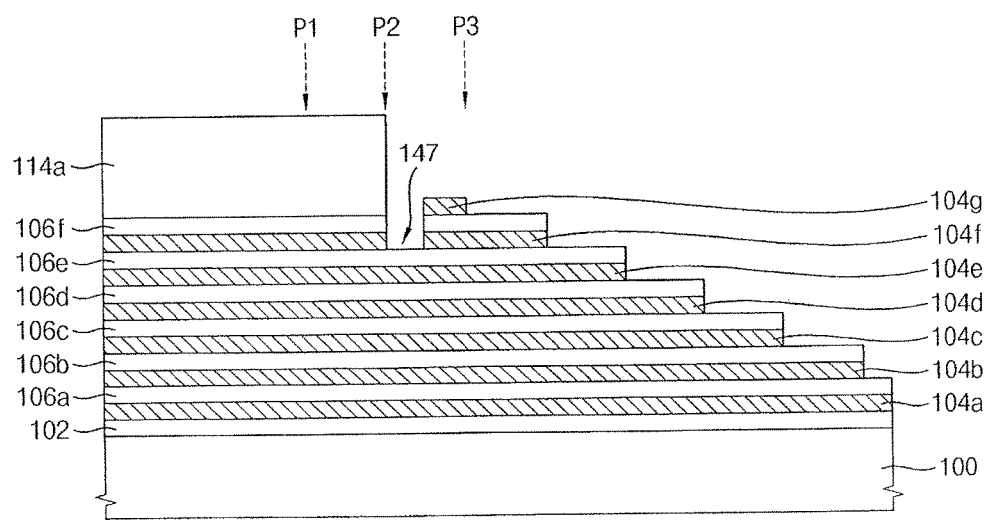

Referring to FIGS. 27A and 27B, a ninth etching mask 114a may be formed on the mold structure 107. An exposed uppermost one of the insulation layers 106 and an exposed uppermost one of the sacrificial layers 104 may be etched using the ninth etching mask 114a.

In example embodiments, the ninth etching mask 114a may be formed by a trimming process on the eighth etching mask 114. Alternatively, after removing the eighth etching mask 114, the ninth etching mask 114a may be formed on the mold structure 107 by a photo process.

In example embodiments, an end of the ninth etching mask 114a may be located at the second position P2. In this case, a top surface of the sixth insulation layer 106f in the cut hole 110 (refer to FIG. 25B) may be exposed by the ninth etching mask 114a. Thus, a preliminary hole 147 may be formed in the sixth sacrificial layer 104f in the cut hole 110 by the etching process.

Figure 28A:
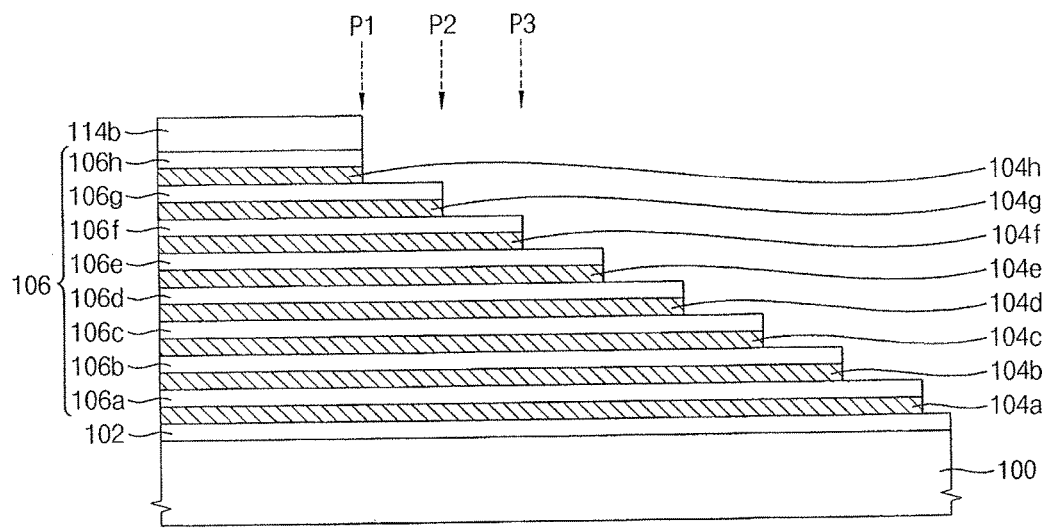
Figure 28B:
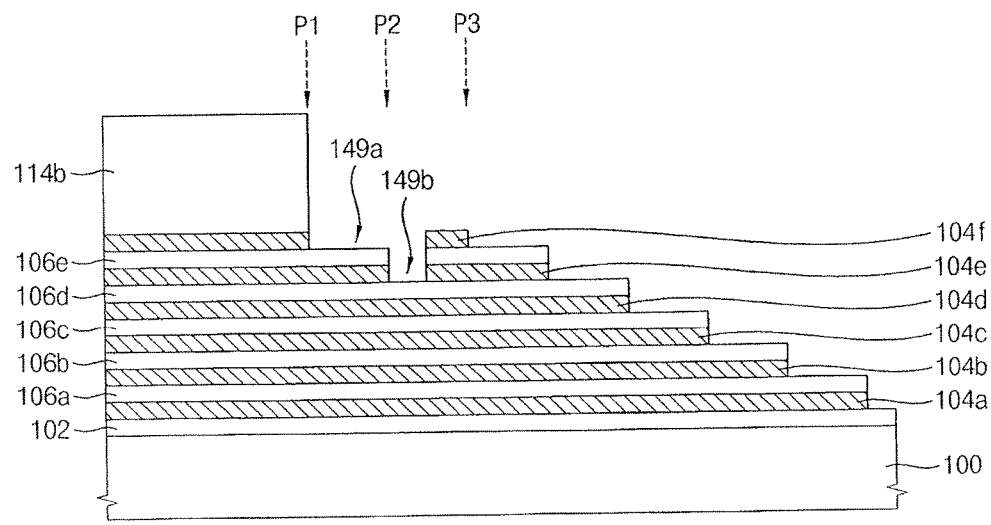
Figure 28C:
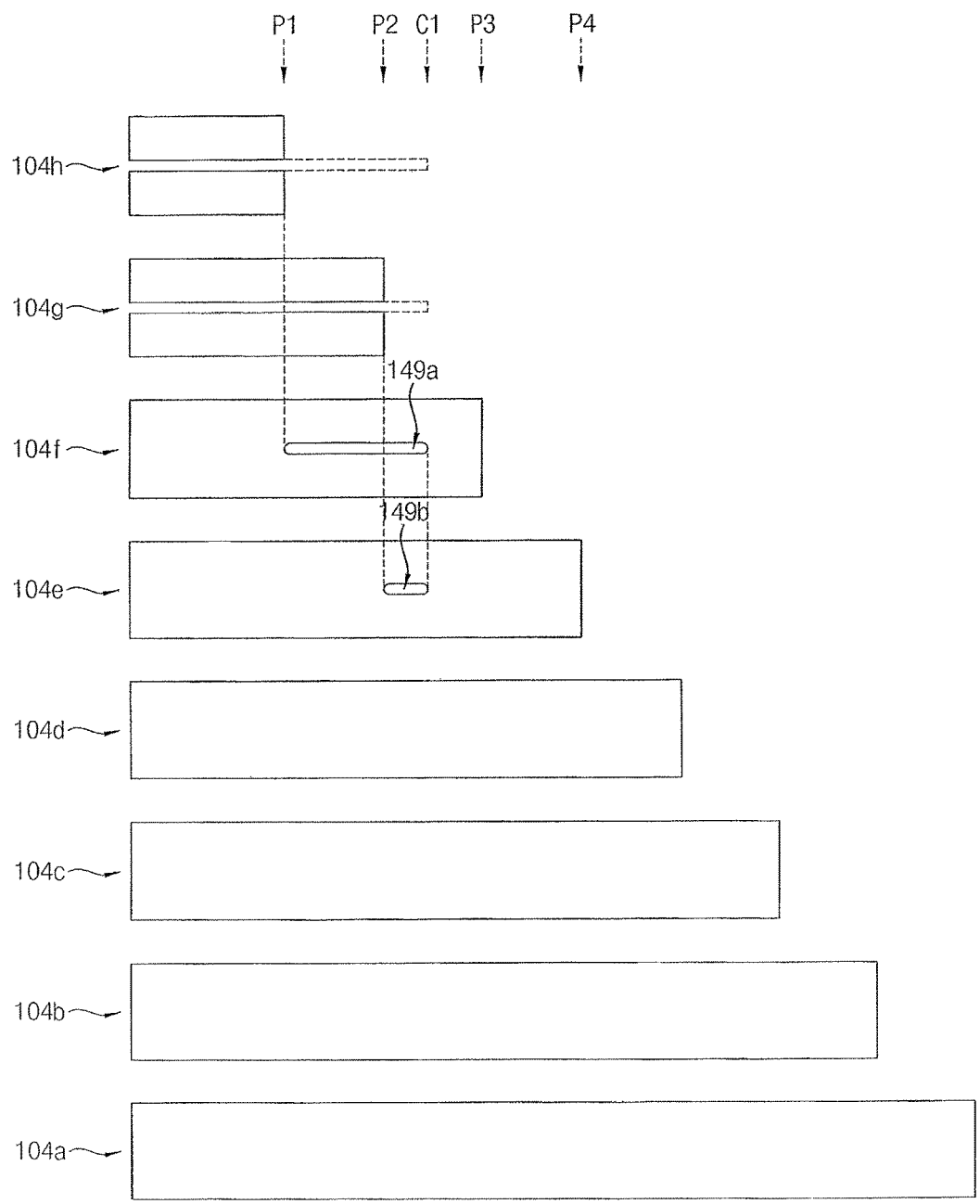

Referring to FIGS. 28A, 28B, and 28C, the ninth etching mask 114a may be partially removed by a trimming process to form a tenth etching mask 114b. An exposed uppermost one of the insulation layers 106 and an exposed uppermost one of the sacrificial layers 104 may be etched using the tenth etching mask 114b.

In example embodiments, an end of the tenth etching mask 114b may be located at the first position P1. In this case, a top surface of the sixth insulation layer 106f in the cut hole 110 (refer to FIG. 25B) and a top surface of the fifth insulation layer 106e in the preliminary hole 147 (refer to FIG. 27B) may be exposed by the tenth etching mask 114b. Thus, the third opening 149a may be formed in the sixth sacrificial layer 104f in the SSL cut hole by the etching process, and the fourth opening 149b may be formed in the fifth sacrificial layer 104e in the SSL cut hole by the etching process. Each of the third and fourth openings 149a and 149b may be formed at a central portion thereof, e.g., along the third direction.

A preliminary step mold structure may be formed by the above processes. Then, the tenth etching mask 114b may be removed.

Figure 29A:
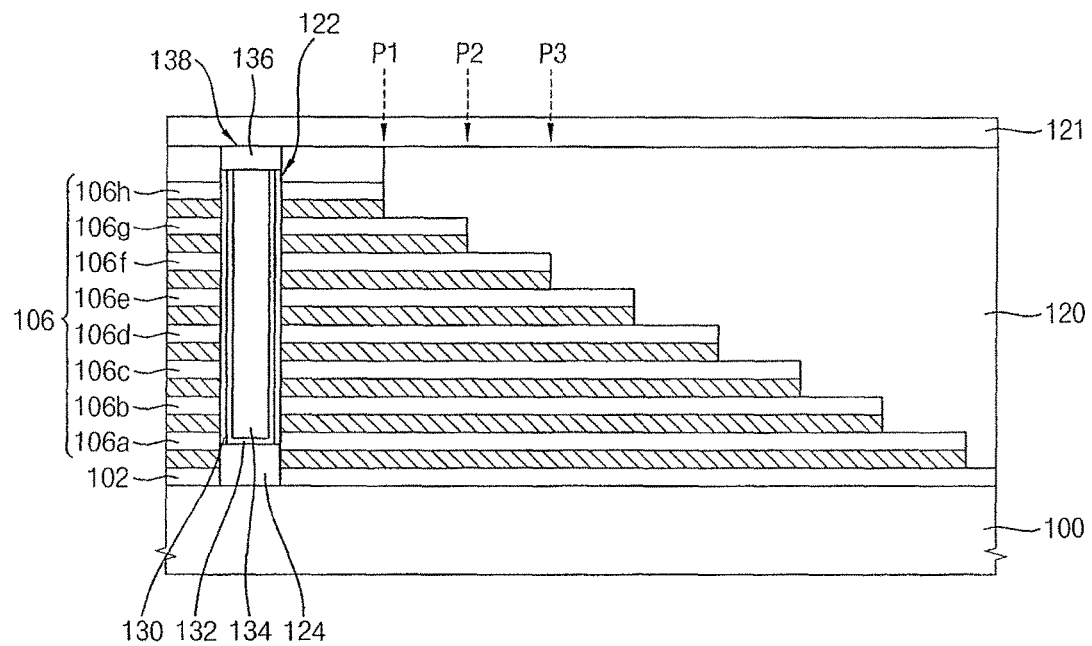
Figure 29B:
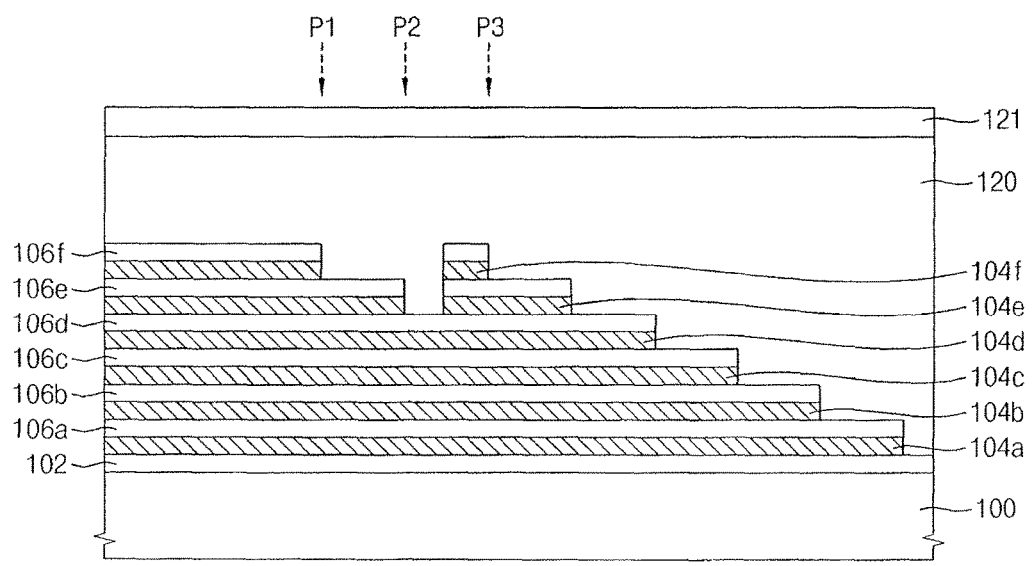

Referring to FIGS. 29A and 29B, the first insulating interlayer 120 may be formed on the preliminary step mold structure. The channel hole 122 may be formed through the first insulating interlayer 120 and the preliminary step mold structure in a cell region. The vertical channel structure 138 may be formed in the channel hole 122. The second insulating interlayer 121 may be formed on the vertical channel structure 138 and the first insulating interlayer 120.

The processes may be substantially the same as or similar to those illustrated with reference to FIGS. 15A to 16C.

Figure 30A:
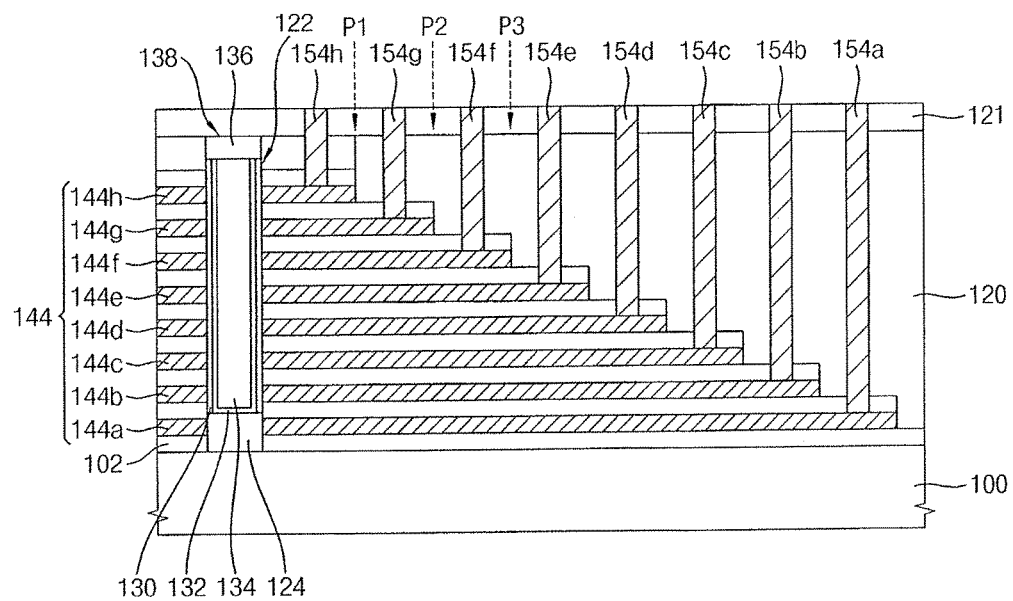
Figure 30B:
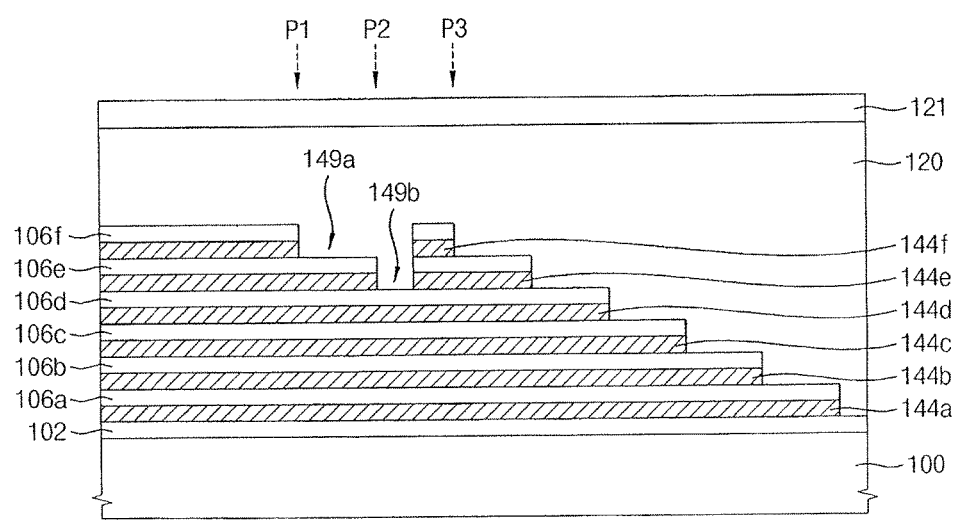

Referring to FIGS. 30A and 30B, the first and second insulating interlayers 120 and 121, the preliminary step mold structure and the pad insulation layer 102 may be etched to form an opening exposing an upper surface of the substrate 100 and extending in the second direction. The preliminary step mold structure may be divided into a plurality of step mold structures by the opening.

The sacrificial layers 104 exposed by the opening may be removed to form gaps. A conductive material may fill the gaps, so that a plurality of gate patterns 144 (e.g., 144a, 144b, 144c, 144d, 144e, 144f, 144g and 144h) may be formed.

A plurality of contact plugs 154a, 154b, 154c, 154d, 154e, 154f, 154g and 154h contacting the gate patterns 144 may be formed through the first and second insulating interlayers 120 and 121. The contact plugs 154a, 154b, 154c, 154d, 154e, 154f, 154g and 154h may contact edge upper surfaces of the gate patterns 144 at respective levels.

The processes may be substantially the same as or similar to those illustrated with reference to FIGS. 17A to 19C. As described above, the vertical memory device of FIGS. 22, 23, 24A and 24B may be manufactured.

Figure 31:
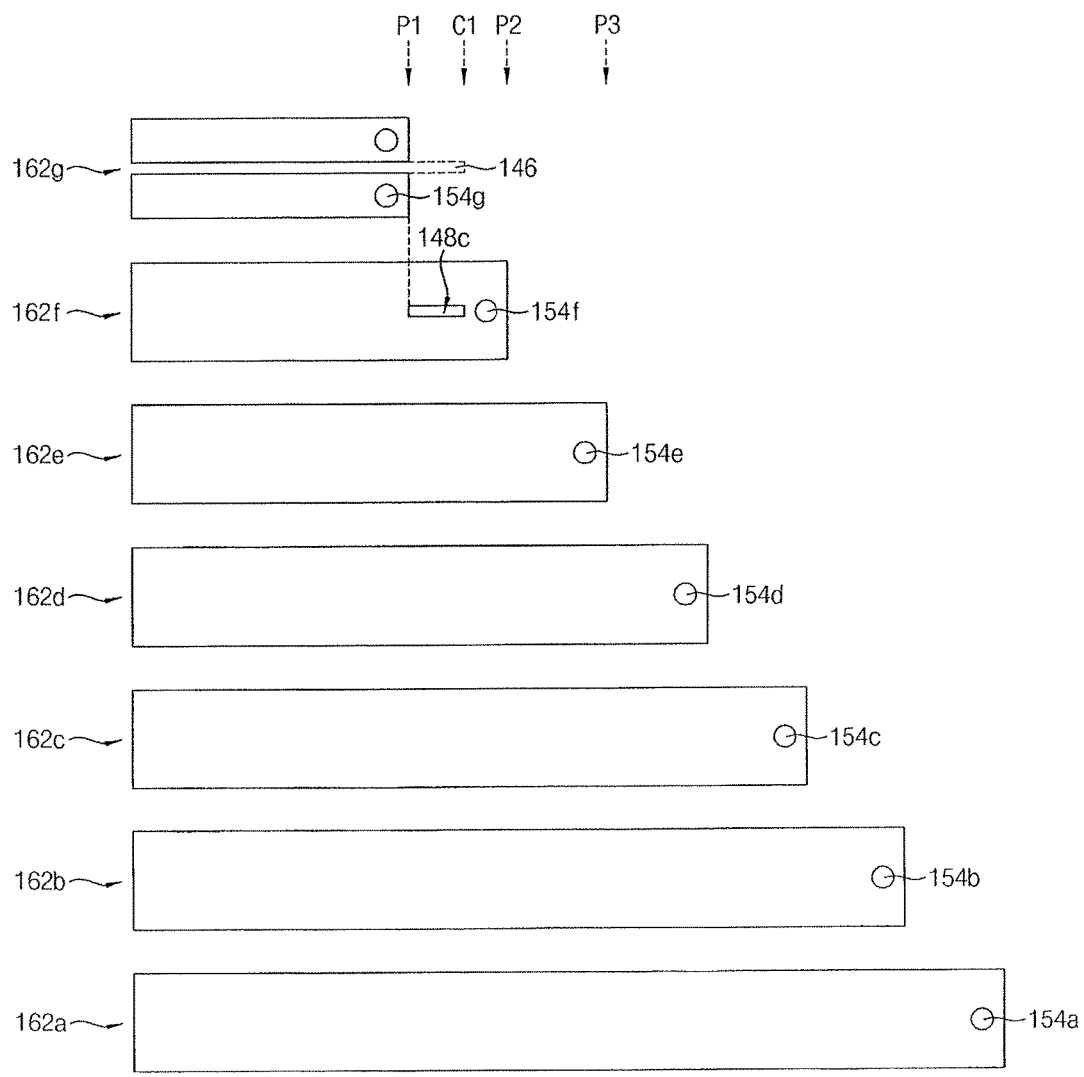
FIG. 31 illustrates a plan view of a vertical memory device in accordance with example embodiments.

FIG. 31 is a plan view illustrating a vertical memory device in accordance with example embodiments. Particularly, FIG. 31 is a plan view illustrating a plurality of gate patterns in the vertical memory device. The vertical memory device of FIG. 31 may have elements and/or structures substantially the same as or similar to those illustrated in FIGS. 22, 23, 24A, and 24B, except for the SSL and the dummy word line in the wiring region. Thus, like reference numerals are used to designate like elements, and detailed descriptions thereon are omitted herein.

Referring to FIG. 31, the vertical channel device may include the vertical channel structure 138 (refer to FIGS. 24A and 24B) extending in the first direction from a surface of the substrate 100 (refer to FIGS. 24A and 24B) and a plurality of gate patterns 162a, 162b, 162c, 162d, 162e, 162f, and 162g surrounding the vertical channel structure 138 and being spaced apart from each other in the first direction, as those illustrated with reference to FIGS. 1, 2, 3A, 3B, and 3C.

For convenience of description, FIG. 31 show that the gate pattern 162a serves as a GSL, the gate pattern 162b serves as a first word line, the gate pattern 162c serves as a second word line, the gate pattern 162d serves as a third word line, the gate pattern 162e serves as a first dummy word line, the gate pattern 162f serves as a second dummy word line, and the gate pattern 162g serves as a first SSL. The gate patterns may include the first SSL 162g, and may not include a second SSL.

In example embodiments, the first SSL 162g may extend in the second direction to the first position P1. In example embodiments, two first SSLs 162g may be spaced apart from each other in the third direction. A space between the first SSLs 162g may serve as the SSL cut hole 146.

The second dummy word line 162f may be formed under the first SSL 162g, and may extend in the second direction. The second dummy word line 162f may be longer than the first SSL 162g in the second direction. For example, the second dummy word line 162f may extend in the second direction to the second position P2.

The second dummy word line 162f may include a fifth opening 148c at a central portion of the second dummy word line 162f, e.g., along the third direction, and the fifth opening 148c may extend in the second direction toward the edge portion of the second dummy word line 162f.

In example embodiments, a first end of the fifth opening 148c in the second direction may be aligned with the first position P1, and a second end of the fifth opening 148c in the second direction may be aligned with the cutting position C1 between the first position P1 and the second position P2. The second end of the fifth opening 148c may be aligned with an end portion of the SSL cut hole 146.

Thus, the second dummy word line 162f may have a shape different from a shape of the first SSL 162g. Also, the second dummy word line 162f may have a shape different from shapes of the word lines 162b, 162c and 162d under the second dummy word line 162f. That is, the second dummy word line 162f may not be completely cut along in the second direction, and thus may not be divided into two separate pieces as the first SSL 162g. The second dummy word line 162f may have the first width W1 in the third direction.

The first dummy word line 162e may be formed under the second dummy word line 162f, and may be longer than the second dummy word line 162f in the second direction. For example, the first dummy word line 162e may extend to the third position P3. Thus, end portions in the second direction of the first and second dummy word lines 162e and 162f may have a staircase shape.

The first dummy word line 162e may have no opening. Thus, the first dummy word line 162e may have a shape substantially the same as a shape of each of the word lines 162b, 162c and 162d under the first dummy word line 162e. In some example embodiments, the first dummy word line 162e may be serve as an actual word line.

Each of the first and second dummy word lines 162e and 162f may have no dent. The lengths in the second direction of the first and second dummy word lines 162e and 162f may be different from each other, so that an edge portion of the first dummy word line 162e may be exposed by the overlying second dummy word line 162f.

The third word line 162d, the second word line 162c, the first word line 162b and the GSL 162a may be formed under the first dummy word line 162e. Edge portions of the GSL 162a, the first word line 162b, the second word line 162c and the third word line 162d may have a staircase shape.

The GSL 162a, the first word line 162b, the second word line 162c and the third word line 162d may be substantially the same as those illustrated with reference to FIGS. 22, 23, 24A, and 24B, respectively.

In example embodiments, the first contact plug 154a, the second contact plug 154b, the third contact plug 154c, the fourth contact plug 154d, the fifth contact plug 154e, the sixth contact plug 154f, and the seventh contact plug 154g may be formed on the edge portions the GSL 162a, the first word line 162b, the second word line 162c, the third word line 162d, the first dummy word line 162e, the second dummy word line 162f and the first SSL 162g, respectively.

Thus, electrical signals, which are applied to the second dummy word line 162f via the sixth contact plug 154f, may be normally transferred.

The method of manufacturing the vertical memory device may include processes the same as or similar to those illustrated with reference to FIGS. 25A to 29B. However, forming the sacrificial layer serving as the second SSL and patterning the sacrificial layer may not be performed. Thus, the fifth opening 148c may be only formed in the second dummy word line 162f, and the first word line 162e may have no opening.

Figure 32:
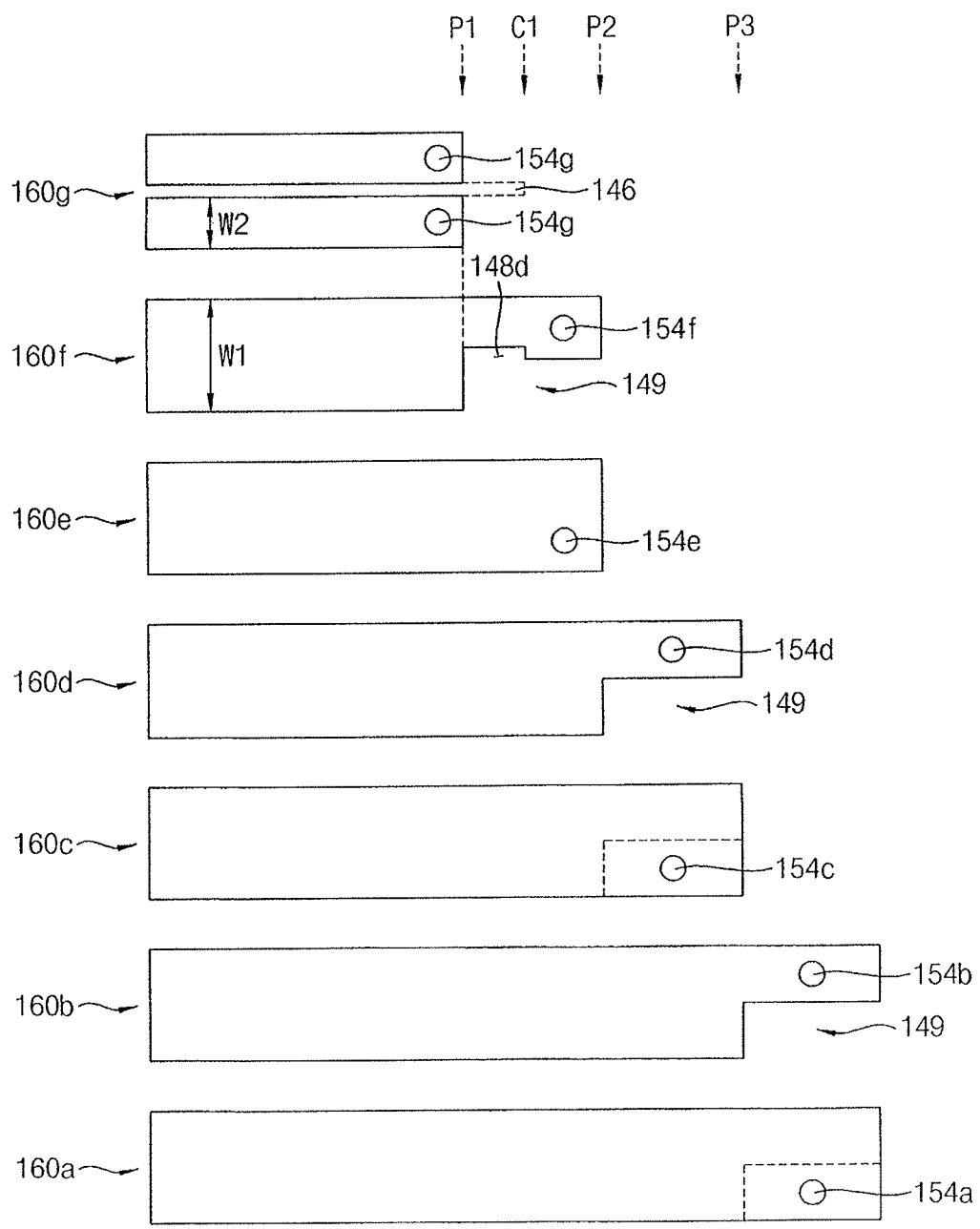
FIG. 32 illustrates a plan view of a vertical memory device in accordance with example embodiments.

FIG. 32 is a plan view illustrating a vertical memory device in accordance with example embodiments. Particularly, FIG. 32 is a plan view illustrating a plurality of gate patterns in the vertical memory device. The vertical memory device of FIG. 32 may have elements and/or structures substantially the same as or similar to those illustrated in FIGS. 1, 2, 3A, 3B, and 3C, except for the SSLs and the dummy word lines. Thus, like reference numerals are used to designate like elements, and detailed descriptions thereon are omitted herein.

Referring to FIG. 32, the vertical channel device may include the vertical channel structure 138 extending in the first direction from a surface of the substrate 100, and a plurality of gate patterns surrounding the vertical channel structure 138 and being spaced apart from each other in the first direction, as those illustrated with reference to FIGS. 1, 2, 3A, 3B, and 3C.

For convenience of description, FIG. 32 show that a gate pattern 160a serves as a GSL, a gate pattern 160b serves as a first word line, a gate pattern 160c serves as a second word line, a gate pattern 160d serves as a third word line, a gate pattern 160e serves as a first dummy word line, a gate pattern 160f serves as a second dummy word line, and a gate pattern 160g serves as a first SSL. The gate patterns may include the first SSL 160g, and may not include a second SSL.

In example embodiments, the first SSL 160g may extend in the second direction to the first position P1. In example embodiments, two first SSLs 160g may be spaced apart from each other in the third direction. A space between the first SSLs 160g may serve as the SSL cut hole 146.

The second dummy word line 160f may be formed under the first SSL 160g, and may extend in the second direction. The second dummy word line 160f may be longer than the first SSL 160g in the second direction. For example, the second dummy word line 160f may extend in the second direction to the second position P2.

An edge portion of the second dummy word line 160f in the second direction may include the dent 149. A portion of the second dummy word line 160f having no dent may have a length in the second direction greater than a length in the second direction of a portion of the second dummy word line 160f having the dent 149.

Also, the second dummy word line 160f may include a third recess 148d at a central portion of the second dummy word line 160f, e.g., along the third direction. A first end of the third recess 148d may be aligned with the first position P1, and a second end of the third recess 148d in the second direction may be aligned with the cutting position C1. The third recess 148d may be in communication with the dent 149.

The second dummy word line 160f may have a shape different from a shape of the first SSL 160g. That is, the second dummy word line 160f may not be completely cut along in the second direction, and thus may not be divided into two separate pieces as the first SSL 160g, i.e., a maximum width of the second dummy word line 160f may be the first width W1.

The first dummy word line 160e may be formed under the second dummy word line 160f, and may extend in the second direction to the second position P2. The first dummy word line 160e may have no dent and no opening. Thus, an edge portion of the first dummy word line 160e may be exposed by the dent 149 of the second dummy word line 160f overlying the first dummy word line 160e. The first dummy word line 160e may have a shape substantially the same as shapes of some of the word lines under the first dummy word line 160e. In some example embodiments, the first dummy word line 160e may serve as an actual word line.

The third word line 160d, the second word line 160c, the first word line 160b and the GSL 160a may be formed under the first dummy word line 160e. The GSL 160a, the first word line 160b, the second word line 160c and the third word line 160d may be substantially the same as those illustrated with reference to FIGS. 1, 2, 3A, 3B, and 3C, respectively.

In example embodiments, the first contact plug 154a, the second contact plug 154b, the third contact plug 154c, the fourth contact plug 154d, the fifth contact plug 154e, the sixth contact plug 154f, and the seventh contact plug 154g may be formed on the edge portions of the GSL 160a, the first word line 160b, the second word line 160c, the third word line 160d, the first dummy word line 160e, the second dummy word line 160f and the first SSL 160g, respectively. The first, second, third, fourth, fifth, sixth, and seventh contact plugs 154a, 154b, 154c, 154d, 154e, 154f and 154g may be substantially the same as those illustrated with reference to FIGS. 1, 2, 3A, 3B, and 3C, respectively.

As described above, in example embodiments, the second dummy word line 160f may not be divided into two separate pieces. Thus, electrical signals may be normally transferred by the second dummy word line 160f and the sixth contact plug 154f.

In the vertical memory device, the vertical channel structure on the cell region may not be limited to the above-illustrated one. That is, the vertical channel structure may have various types. The gate pattern structure surrounding the vertical channel structure may have one of the structures in accordance with example embodiments.

Figure 33A:
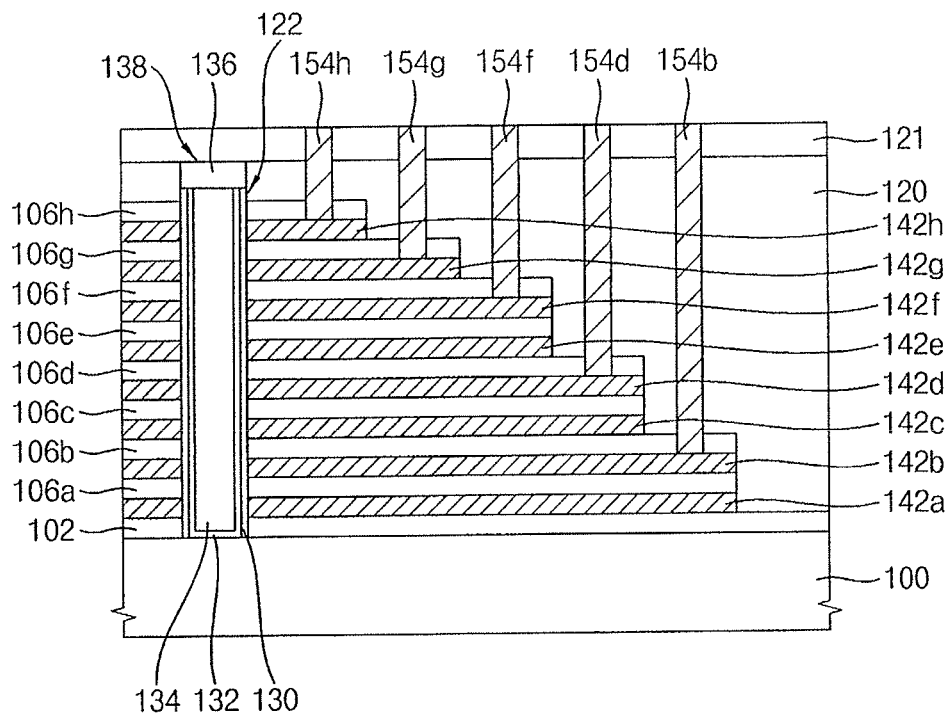
FIGS. 33A and 33B illustrate cross-sectional views of a vertical memory device in accordance with example embodiments.
Figure 33B:
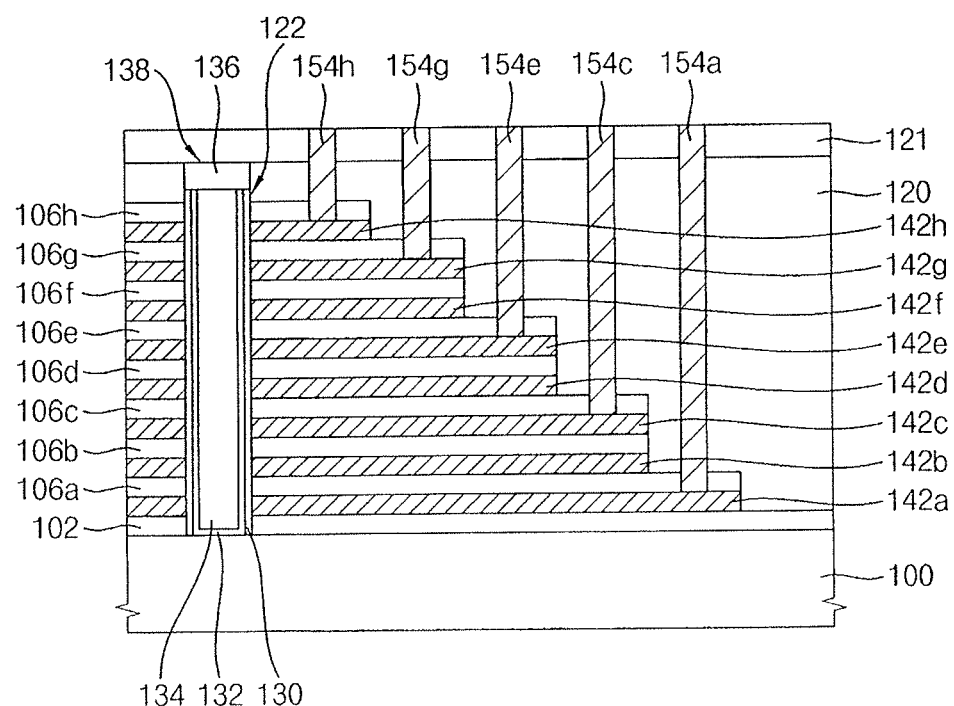

FIGS. 33A and 33B are cross-sectional views illustrating the vertical memory device in accordance with example embodiments. The vertical memory device of FIGS. 33A and 33B may have elements and/or structures substantially the same as or similar to those illustrated in FIGS. 1, 2, 3A, 3B and 3C, except for the vertical channel structure.

Referring to FIGS. 33A and 33B, the vertical channel structure 138 may include the channel 132, the charge storage structure 130 including the tunnel insulation layer, the charge storage layer and the blocking layer, and the filling insulation pattern 134. The vertical channel structure 138 may extend in the first direction through the gate pattern structure.

In example embodiments, a semiconductor pattern may not be formed between the substrate 100 and the vertical channel structure 138. That is, the vertical channel structure 138 may directly contact the upper surface of the substrate 100. At least one of lower ones of gate patterns, e.g., 142a may serve as the GSL, and may surround the vertical channel structure 138.

The method of manufacturing the vertical memory device may include processes the same as or similar to those illustrated with reference to FIGS. 4 to 19C. However, when the processes illustrated with reference to FIGS. 16A, 16B, 16C and 16D are performed, a semiconductor pattern may not be formed on the substrate 100 exposed by the channel hole.

In some example embodiments, the vertical channel structure may be used in each of the vertical memory devices in accordance with example embodiments. For example, each of vertical memory devices of FIG. 20, FIGS. 22 to 24C, FIG. 31 and FIG. 32 may include the vertical channel structure.

Figure 34:
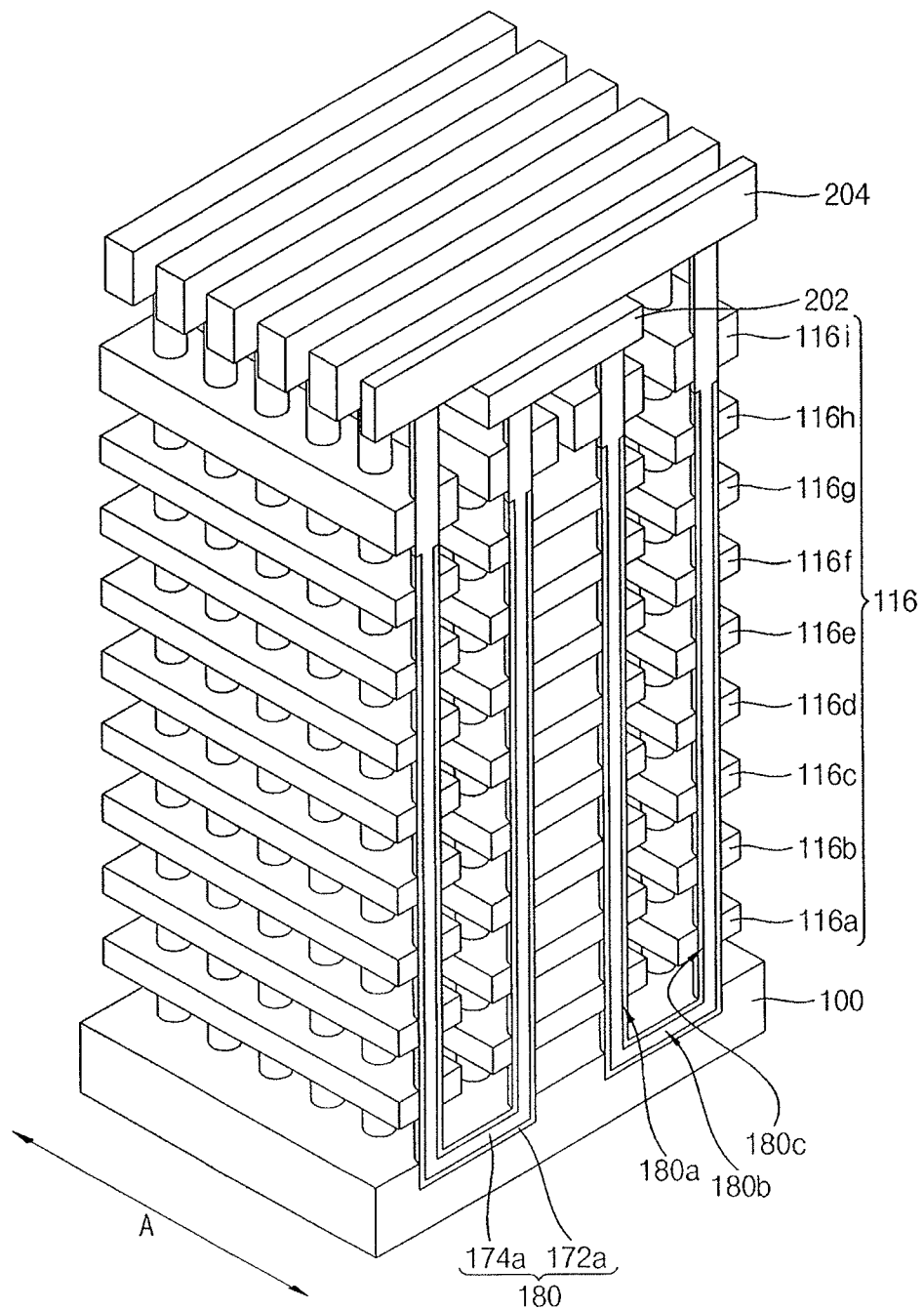
FIG. 34 illustrates a perspective view of a vertical memory device in accordance with example embodiments.

FIG. 34 is a perspective view illustrating a vertical memory device in accordance with example embodiments. FIG. 34 illustrates only a structure on cell region, and does not show the insulating interlayer. Referring to FIG. 34, a vertical channel structure 180 may be formed on the substrate 100. A gate pattern structure may surround the vertical channel structure 180. The gate pattern structure may include gate patterns spaced apart from each other in the first direction.

The vertical channel structure 180 may include a first structure 180a, a second structure 180c, and a connection portion 180b. The first and second structures 180a and 180c may be adjacent to each other. Each of the first and second structures 180a and 180c may have a pillar shape extending in the first direction from the substrate 100. The connection portion 180b may be formed on the substrate 100, and may connect bottoms of the first and second structures 180a and 180c to each other. Thus, the vertical channel structure 180 may have a U-like shape. The first and second structures 180a and 180c in the vertical channel structure 180 may be surrounded by gate patterns included in different gate pattern structures from each other.

The vertical channel structure 180 may include a channel 174a and a charge storage structure 172a including a tunnel insulation layer, a charge storage layer and a blocking dielectric layer. The channel 174a may have a U-like shape penetrating through different gate pattern structures. The charge storage structure 172a may be formed on a surface of the channel 174a. The blocking layer may contact the gate patterns.

In example embodiments, an upper portion of the vertical channel structure 180 may include only the channel 174a. That is, the upper portion of the vertical channel structure 180 may not include the tunnel insulation layer, the charge storage layer and the blocking dielectric layer.

The gate pattern structure may include gate patterns 116 and insulation layers alternately and repeatedly stacked. The gate patterns 116 may include a GSL, a dummy word line, a plurality of word lines and a SSL. For example, an uppermost one of the gate pattern 116 may serve as the GSL and the SSL. At least one of the gate patterns 116 under the GSL and the SSL may serve as the dummy word line. The gate patterns 116 under the dummy word line may serve as the word lines.

In example embodiments, an uppermost one 116i of the gate patterns 116 surrounding the first structure 180a may serve as the GSL, an uppermost one of the gate patterns 116 surrounding the second structure 180c may serve as the SSL. One gate pattern 116h under the GSL and the SSL 116i may server as the dummy word line.

The GSL and SSL 116i may be formed at the upper portion of the vertical channel structure 180, so that a wiring between the channels contacting the GSL 116i and between the channels contacting the SSL 116i may be easily formed.

A common source line (CSL) 202 may be formed on the first structure 180a over the GSL 116i. The CSL 202 may extend in a second direction, which may be an extension direction of the gate pattern 116.

A bit line 204 may be formed on the second structure 180c over the SSL 116i. The bit line 204 may extend in a second direction.

In example embodiments, one GSL 116i and one SSL 116i may be formed over the dummy word line 116h. In this case, an edge portion of the gate pattern structure in the second direction may be substantially the same as that illustrated in FIG. 31. That is, the dummy word line 116h may include an opening.

In some example embodiments, an edge portion of the gate pattern structure in the second direction may be substantially the same as that illustrated in FIG. 32. That is, the dummy word line 116h may include a dent and a recess.

Figure 35:
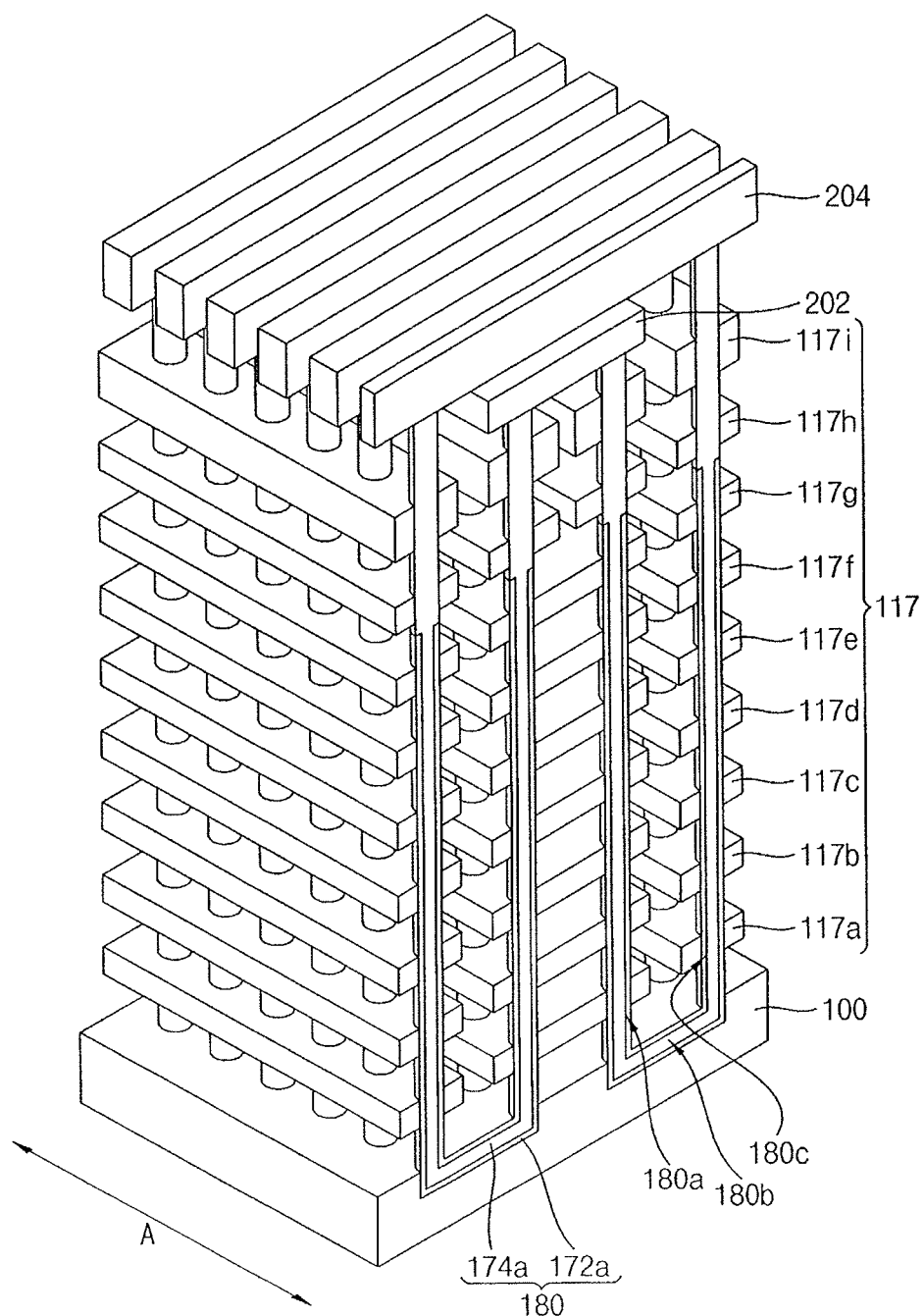
FIG. 35 illustrates a perspective view of a vertical memory device in accordance with example embodiments.

FIG. 35 is a perspective view illustrating a vertical memory device in accordance with example embodiments. The vertical memory device of FIG. 35 may have elements and/or structures substantially the same as or similar to those illustrated in FIG. 34, except for the GSL and the SSL.

Referring to FIG. 35, uppermost two gate patterns surrounding the first structure 180a may serve as a first GSL and a second GSL, respectively. Uppermost two gate patterns surrounding the second structure 180c may server as a first SSL and a second SSL, respectively. Two dummy word lines, e.g., first and second dummy word lines 117f and 117g, may be formed under each of the first GSL 117h and the first SSL 117h. In this case, an edge portion of the gate pattern structure in the second direction may be substantially the same as that illustrated in FIGS. 1, 2, 3A, 3B, and 3C. That is, the second dummy word line 117g under each of the first GSL 117h and the first SSL 117h may include a recess, and the first dummy word line 117f under the second dummy word line 117g may have an opening.

In some example embodiments, an edge portion of the gate pattern structure in the second direction may be substantially the same as that illustrated in FIG. 20. That is, the second dummy word line 117g may include a recess.

In some example embodiments, an edge portion of the gate pattern structure in the second direction may be substantially the same as that illustrated in FIGS. 22, 23, 24A, 24B and 24C. That is, each of the first and second dummy word lines 117f and 117g may include an opening.

In example embodiments, the vertical memory device may be embodied to include a three dimensional (3D) memory array including a high step structure, e.g., 16 levels, 32 levels, 64 levels, etc.

By way of summation and review, a dummy word line under the SSL may include an opening, but may not be divided into two pieces. Thus, an electrical signal may be normally transferred via the dummy word line, and thus electrical failures of the vertical memory device may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a vertical semiconductor device, the method comprising:
    alternately and repeatedly forming an insulation layer and a sacrificial layer in a first direction on a substrate to form a mold structure;
    partially etching upper ones of the insulation layers and upper ones of the sacrificial layers to form a cut hole extending in a second direction, orthogonal to the first direction;
    sequentially etching edge portions of the mold structure to form a preliminary step mold structure having a staircase shape; and
    replacing the sacrificial layers with a gate pattern structure including a plurality of word lines, a dummy word line, and string selection lines (SSLs), the dummy word line including a recess,
    wherein the recess partially overlaps the cut hole.

2. The method as claimed in claim 1, further comprising, after forming the cut hole:
    partially etching an uppermost one of the insulation layers and an uppermost one of the sacrificial layers to form a lower step portion and an upper step portion at an upper portion of the mold structure.

3. The method as claimed in claim 1, wherein sequentially etching the edge portions of the mold structure to form the preliminary step mold structure includes:
    forming a first photoresist pattern exposing an edge portion of the mold structure;
    etching upper two stacked insulation layers and upper two stacked sacrificial layers using the first photoresist pattern as an etching mask;
    partially removing the first photoresist pattern to form a second photoresist pattern; and
    etching upper two stacked insulation layers and upper two stacked sacrificial layers using the second photoresist pattern as an etching mask.

4. The method as claimed in claim 3, wherein sequentially etching the edge portions of the mold structure to form the preliminary step mold structure includes etching a portion of the sacrificial layer exposed by the cut hole to form a preliminary recess.

5. The method as claimed in claim 1, wherein the cut hole extends to a position between an end of one of the SSLs and an end of the dummy word line.

6. The method as claimed in claim 1, wherein the cut hole is disposed only between the SSLs.

7. The method as claimed in claim 1, wherein only the dummy word line includes the recess.

8. The method as claimed in claim 1, wherein each of the string selection lines extend to a first portion, and the recess is aligned with the first portion.

9. The method as claimed in claim 1, further comprising, after forming the preliminary step mold structure:
   forming a vertical channel structure through the preliminary step mold structure; and etching the preliminary step mold structure to form an opening dividing the preliminary step mold structure into step mold structures.

10. The method as claimed in claim 1, wherein the cut hole is formed by etching the sacrificial layers for replacing as the first and second SSLs and the insulation layers between the sacrificial layers.

11. A method of manufacturing a vertical semiconductor device, the method comprising:
   alternately and repeatedly forming an insulation layer and a sacrificial layer in a first direction on a substrate to form a mold structure;
   partially etching upper ones of the insulation layers and upper ones of the sacrificial layers to form a cut hole extending in a second direction, orthogonal to the first direction;
   sequentially etching edge portions of the mold structure to form a preliminary step mold structure having a staircase shape;
   forming a vertical channel structure through the preliminary step mold structure;
   etching the preliminary step mold structure in the second direction to form step mold structures; and
   replacing the sacrificial layers with a gate pattern structure including a plurality of word lines, a dummy word line, and string selection lines (SSLs), the dummy word line including a recess,
   wherein the cut hole is disposed only between the SSLs.

12. The method as claimed in claim 11, wherein the recess partially overlaps the cut hole.

13. The method as claimed in claim 11, wherein only the dummy word line includes the recess.

14. The method as claimed in claim 11, wherein sequentially etching the edge portions of the mold structure to form the preliminary step mold structure includes:
   forming a first photoresist pattern exposing an edge portion of the mold structure;
   etching upper two stacked insulation layers and upper two stacked sacrificial layers using the first photoresist pattern as an etching mask;
   partially removing the first photoresist pattern to form a second photoresist pattern; and
   etching upper two stacked insulation layers and upper two stacked sacrificial layers using the second photoresist pattern as an etching mask,
   wherein sequentially etching the edge portions of the mold structure to form the preliminary step mold structure includes etching a portion of the sacrificial layer exposed by the cut hole to form a preliminary recess.

15. The method as claimed in claim 11, wherein the cut hole extends to a position between an end of one of the SSLs and an end of the dummy word line.

16. The method as claimed in claim 11, wherein each of the string selection lines extend to a first portion, and the recess is aligned with the first portion.

17. A method of manufacturing a vertical semiconductor device, the method comprising:
   alternately and repeatedly forming an insulation layer and a sacrificial layer in a first direction on a substrate to form a mold structure;
   partially etching upper ones of the insulation layers and upper ones of the sacrificial layers to form a cut hole extending in a second direction, orthogonal to the first direction;
   sequentially etching edge portions of the mold structure to form a preliminary step mold structure having a staircase shape;
   forming a vertical channel structure through the preliminary step mold structure;
   etching the preliminary step mold structure to form an opening dividing the preliminary step mold structure into step mold structures; and
   replacing the sacrificial layers with a gate pattern structure including a plurality of word lines, a dummy word line, and first and second string selection lines (SSLs),
   wherein only the dummy word line includes a recess.

18. The method as claimed in claim 17, wherein the recess partially overlaps the cut hole.

19. The method as claimed in claim 17, wherein the cut hole extends to a position between an end of one of the first and second SSLs and an end of the dummy word line.

20. The method as claimed in claim 17, wherein each of the first and second string selection lines extend to a first portion, and the recess is aligned with the first portion.

* * * * *